United States Patent
Partridge et al.

(10) Patent No.: US 7,453,324 B2
(45) Date of Patent: Nov. 18, 2008

(54) FREQUENCY AND/OR PHASE COMPENSATED MICROELECTROMECHANICAL OSCILLATOR

(75) Inventors: Aaron Partridge, Palo Alto, CA (US); Markus Lutz, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 88 days.

(21) Appl. No.: 11/796,990

(22) Filed: Apr. 30, 2007

(65) Prior Publication Data

US 2008/0150642 A1    Jun. 26, 2008

Related U.S. Application Data

(63) Continuation of application No. 11/240,010, filed on Sep. 30, 2005, now Pat. No. 7,221,230, which is a continuation of application No. 10/754,985, filed on Jan. 9, 2004, now Pat. No. 6,995,622.

(51) Int. Cl.
  *H03B 5/04*  (2006.01)
  *H03B 5/30*  (2006.01)
  *H03L 7/06*  (2006.01)

(52) U.S. Cl. ............................. 331/154; 331/18; 331/66

(58) Field of Classification Search .................... 331/18, 331/66, 74, 75, 116 R, 116 FE, 116 M, 154, 331/156, 175, 176

See application file for complete search history.

(56) References Cited

U.S. PATENT DOCUMENTS 4,443,116 A    4/1984   Yoshida et al.
5,604,468 A    2/1997   Gillig
2008/0164953 A1*  7/2008  Partridge et al. .............. 331/66

FOREIGN PATENT DOCUMENTS

WO    WO 01/82479 A    11/2001

OTHER PUBLICATIONS

Supplementary European Search Report for EP 04795658.6-2206, Date Apr. 22, 2008.

* cited by examiner

*Primary Examiner*—David Mis
(74) *Attorney, Agent, or Firm*—Kenyon & Kenyon LLP

(57) ABSTRACT

There are many inventions described and illustrated herein. In one aspect, the present invention is directed to a compensated microelectromechanical oscillator, having a microelectromechanical resonator that generates an output signal and frequency adjustment circuitry, coupled to the microelectromechanical resonator to receive the output signal of the microelectromechanical resonator and, in response to a set of values, to generate an output signal having second frequency. In one embodiment, the values may be determined using the frequency of the output signal of the microelectromechanical resonator, which depends on the operating temperature of the microelectromechanical resonator and/or manufacturing variations of the microelectromechanical resonator. In one embodiment, the frequency adjustment circuitry may include frequency multiplier circuitry, for example, PLLs, DLLs, digital/frequency synthesizers and/or FLLs, as well as any combinations and permutations thereof. The frequency adjustment circuitry, in addition or in lieu thereof, may include frequency divider circuitry, for example, DLLs, digital/frequency synthesizers (for example, DDS) and/or FLLs, as well as any combinations and permutations thereof.

42 Claims, 78 Drawing Sheets

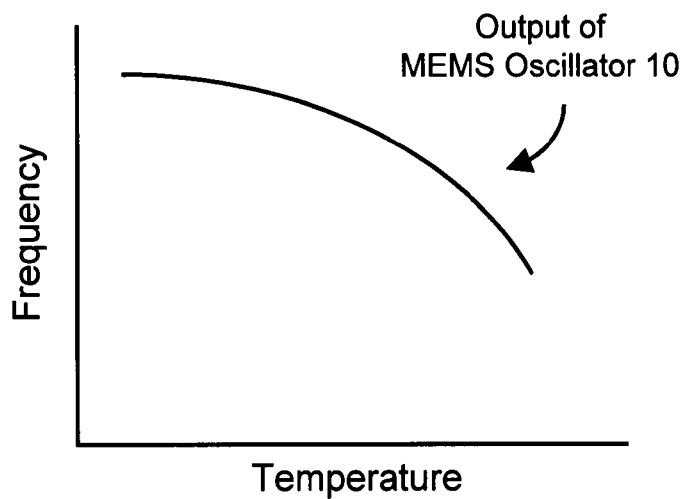
FIGURE 6A
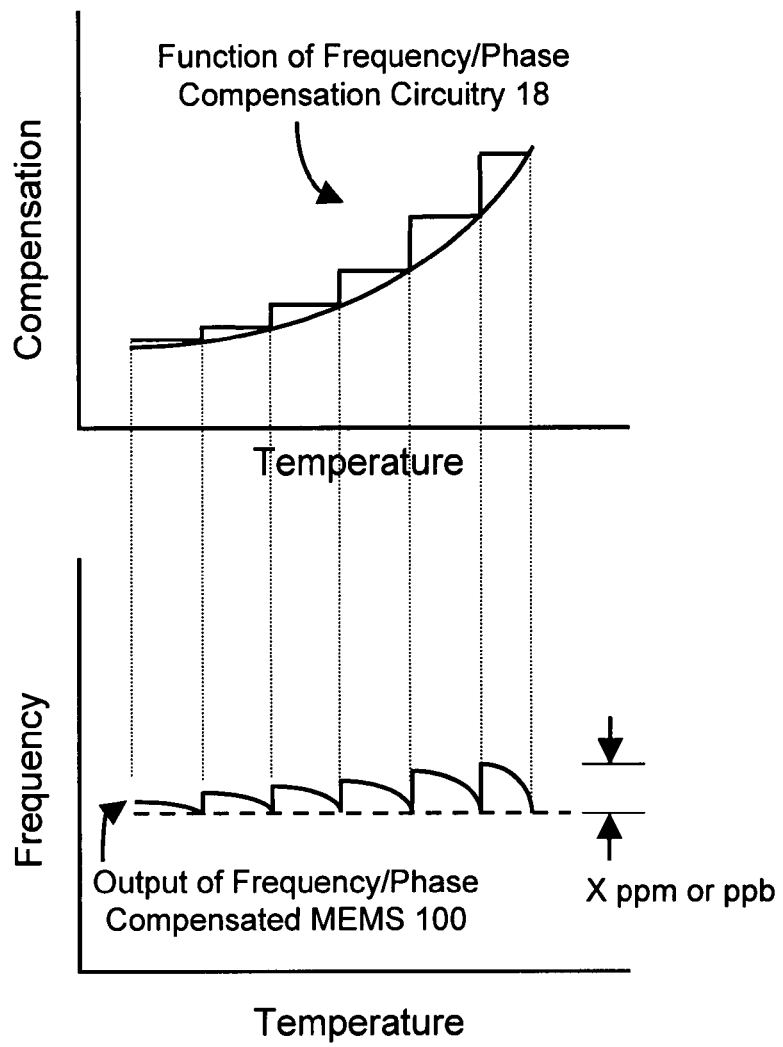
FIGURE 6B
FIGURE 6C

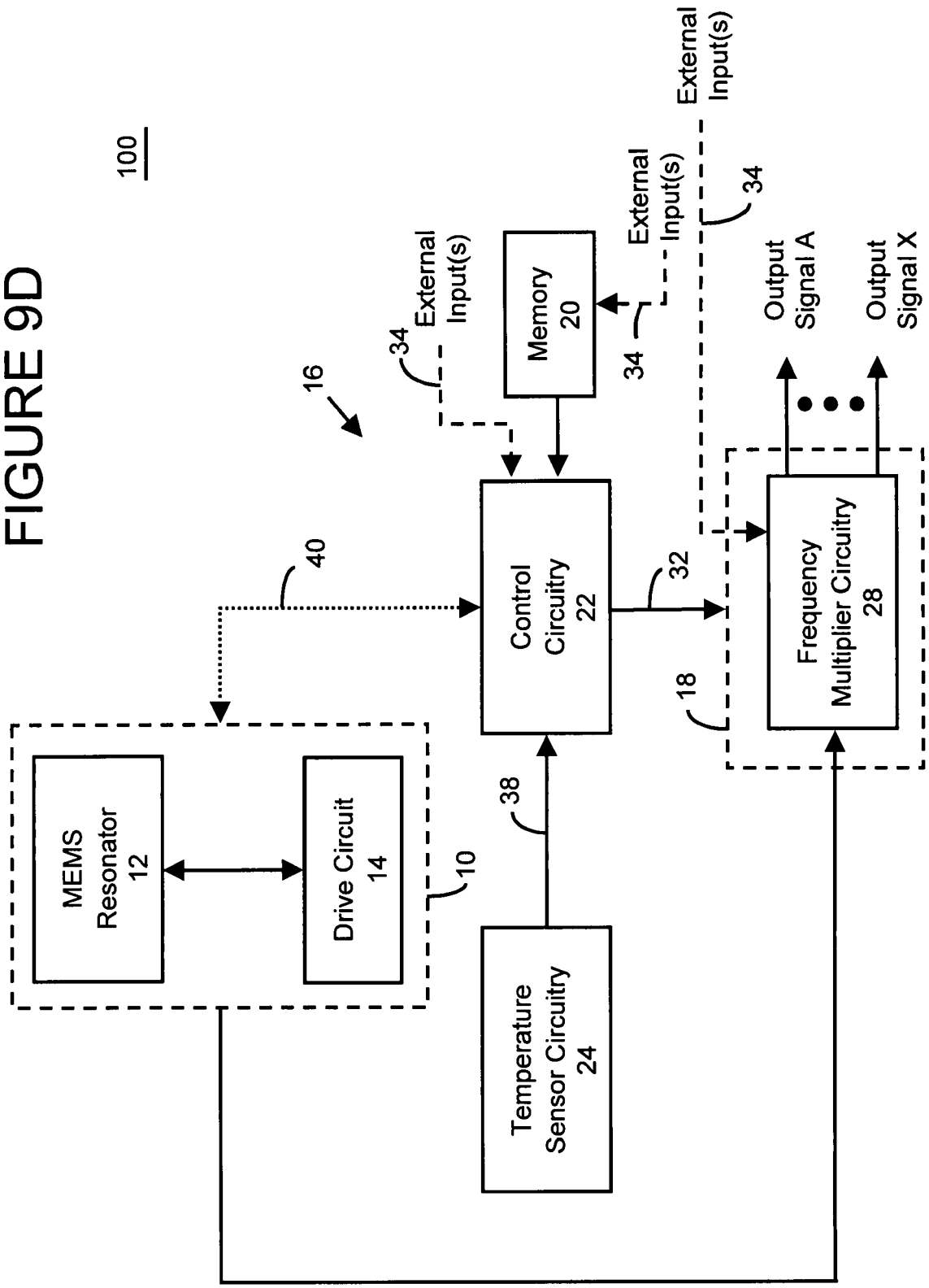

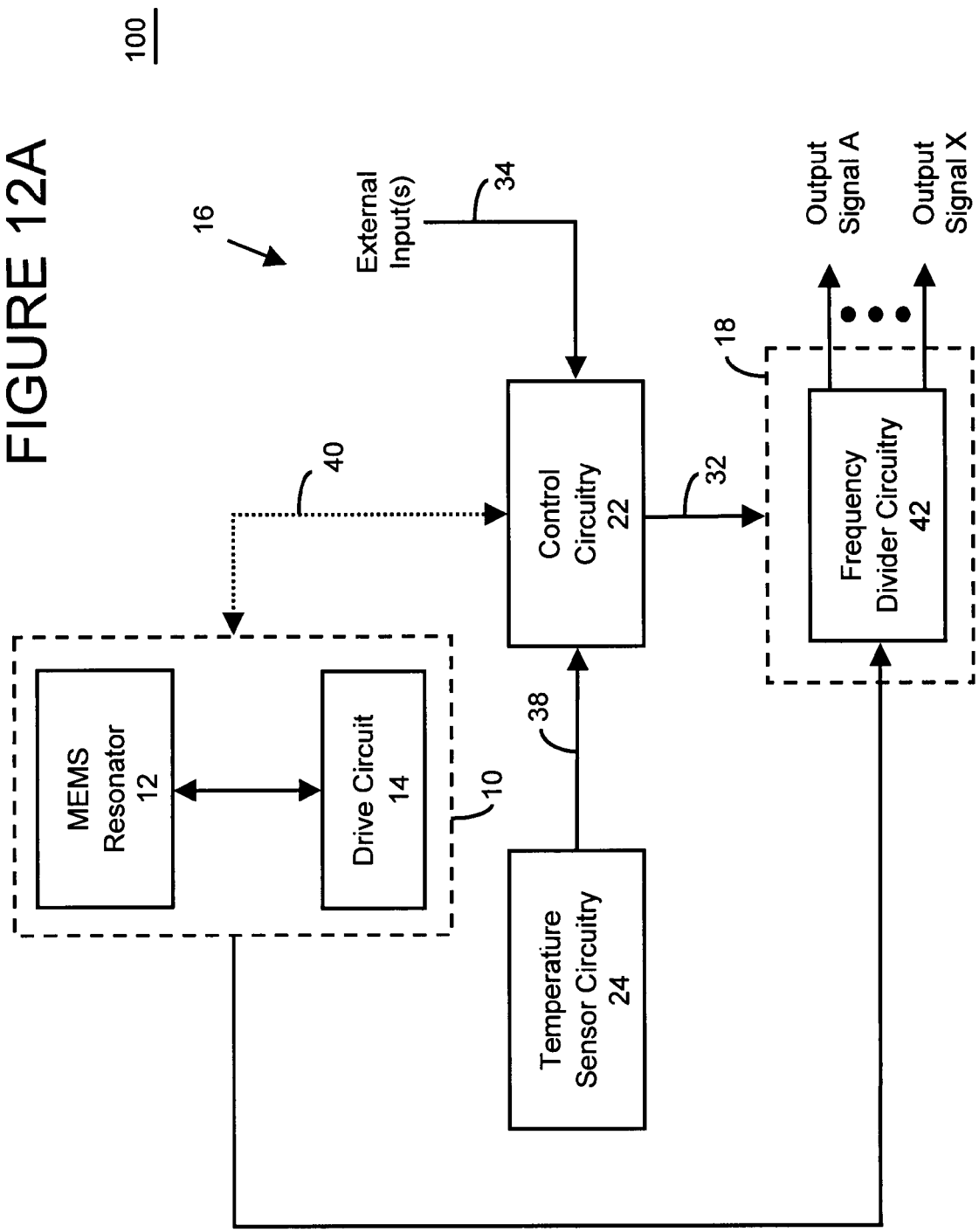

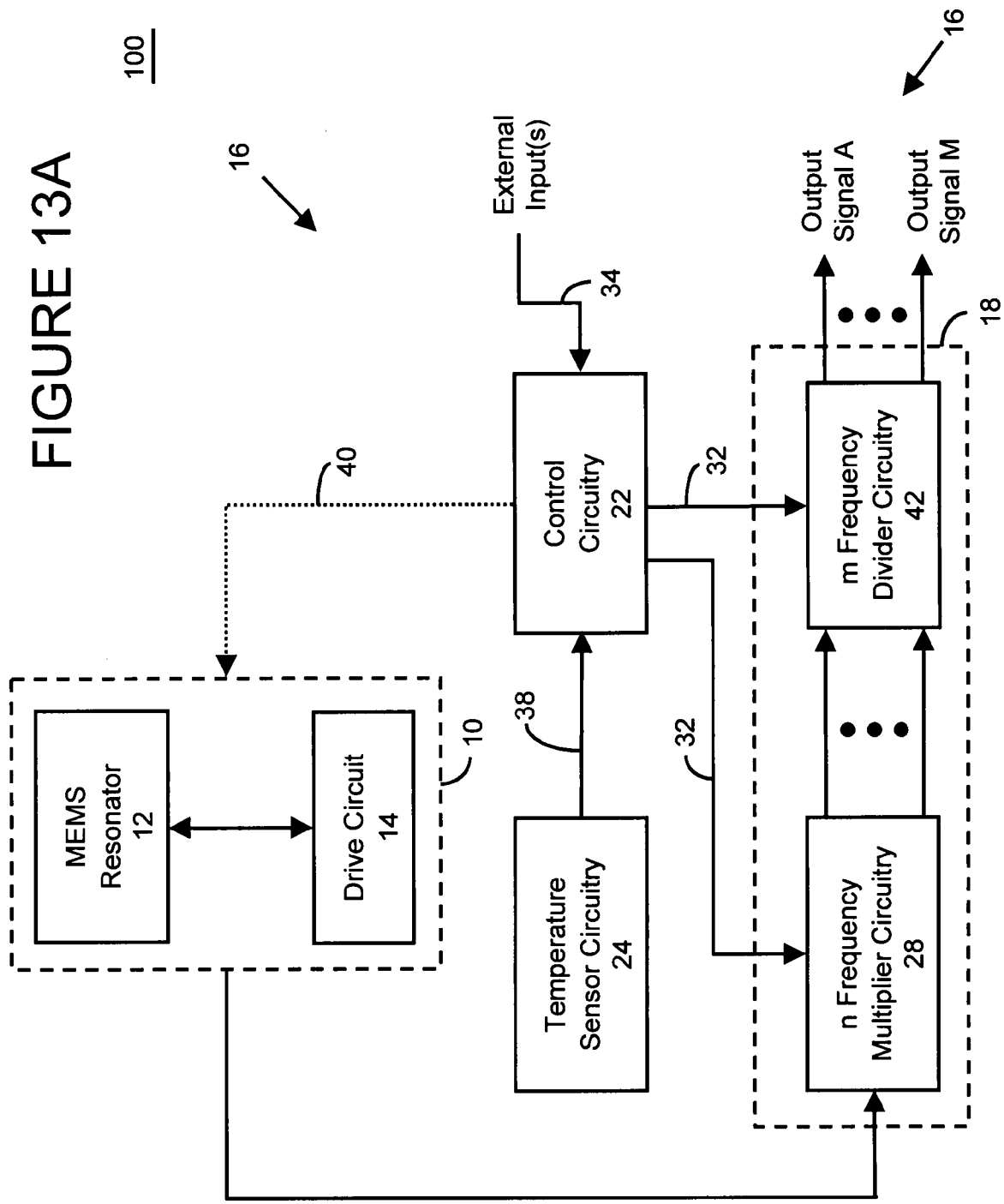

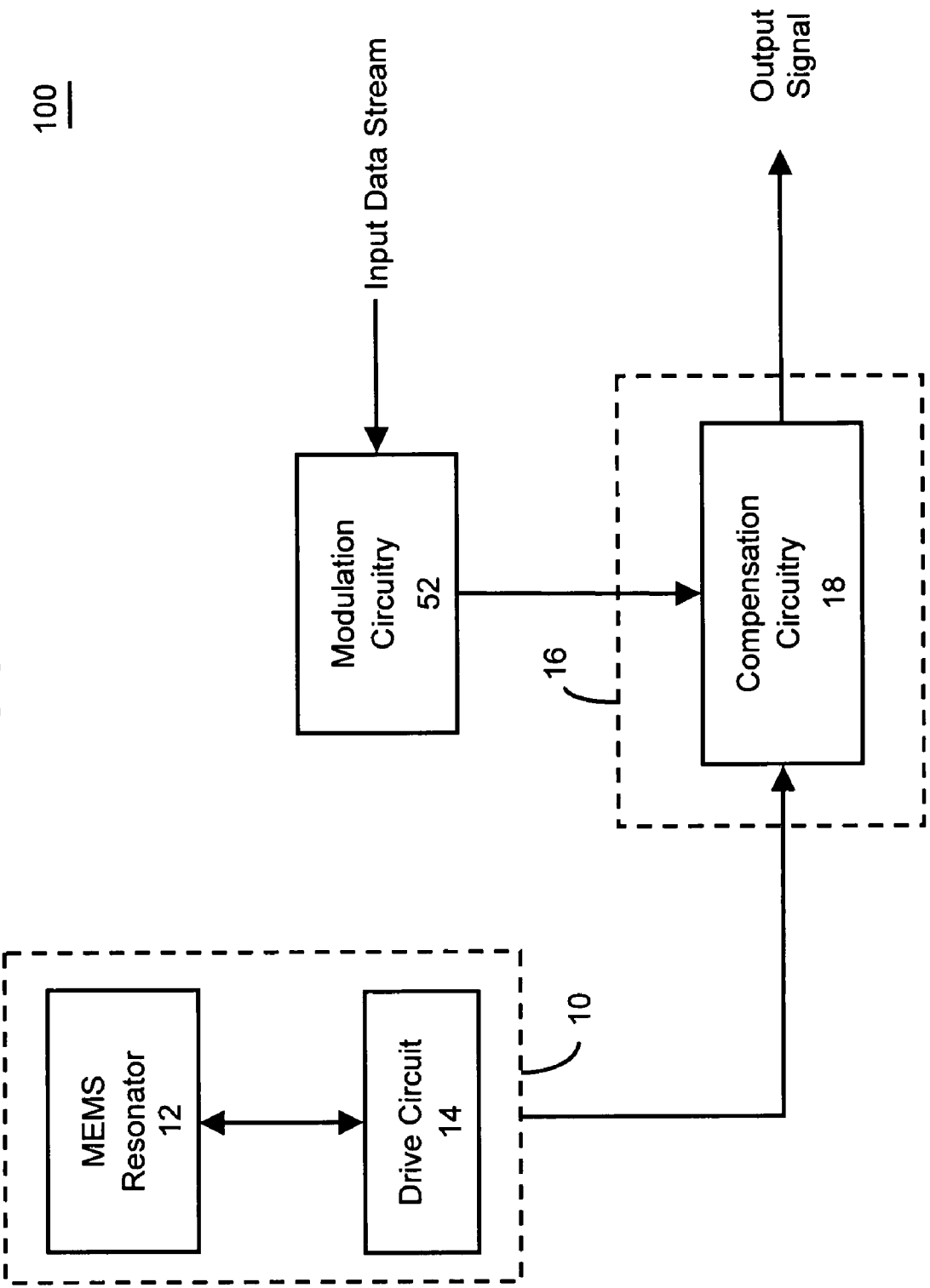

FREQUENCY AND/OR PHASE COMPENSATED MICROELECTROMECHANICAL OSCILLATOR

RELATED APPLICATION

This application is a continuation application of application Ser. No. 11/240,010 (now U.S. Pat. No. 7,221,230), filed Sep. 30, 2005, which is a continuation application of application Ser. No. 10/574,985 (now U.S. Pat. No. 6,995,622), filed Jan. 9, 2004, the contents of which are incorporated herein by reference.

This invention relates to microelectromechanical systems and techniques including microelectromechanical resonators; and more particularly, in one aspect, to a system and technique for providing a stable and controllable microelectromechanical oscillator output frequency that is controllable in fine and coarse increments.

Microelectromechanical systems ("MEMS"), for example, gyroscopes, resonators and accelerometers, utilize micromachining techniques (i.e., lithographic and other precision fabrication techniques) to reduce mechanical components to a scale that is generally comparable to microelectronics.

MEMS typically include a mechanical structure fabricated from or with, for example, a silicon layer using micromachining techniques. The silicon layer is disposed on, for example, an insulation layer that, among other things, serves as a sacrificial layer for the MEMS. As such, significant portions of the insulation layer are etched or removed in order to release the mechanical structure. (See, for example, U.S. Pat. Nos. 6,450,029 and 6,240,782). In this way, the mechanical structure may function, for example, as a resonator to provide an output signal having a given frequency.

A MEMS oscillator typically includes a MEMS resonant structure and associated drive circuit. (See, for example, U.S. Pat. No. 6,577,040, and U.S. Patent Applications 2002/002/021054 and 2002/0068370). The frequency of the output signal of the MEMS oscillator is generally determined during fabrication but may be adjusted thereafter to a precise value using well-known techniques. The MEMS oscillator is designed to provide the desired frequency of the output signal over or across an operating temperature. In that way, the MEMS oscillator may be useful in a number of applications in which the environment changes over time within a given range.

Many applications of MEMS oscillators require a high frequency resonator that is highly controllable and accurate over a wide operating temperature. For example, high frequencies can improve oscillator signal to noise ratio. However, such a resonator tends to make frequency adjustment, stability and control of the oscillator difficult, complicated and expensive. (See, for example, U.S. Pat. Nos. 6,577,040; 6,624,726; and U.S. Patent Applications 2003/0089394, 2003/0160539, 2003/0168929 and 2003/0173864). A conventional approach to control and adjust the output frequency of the MEMS resonant structure is an application of an electrostatic bias between the resonant structure and control electrodes. By increasing the field strength across the gap between the resonant structure and control electrodes, the frequency of the output signal of the resonant structure may be deceased.

Typically, the minimum required frequency control is determined by the initial frequency error and the temperature variation of the resonate structure. As the resonator structure is designed for higher frequencies, the electric field available across the gap between the resonant structure and control electrodes should normally be increased to maintain an appropriate range of frequency control. This may be accomplished by reducing the width of the gap and/or increasing the available voltage to apply across the gap.

In order to achieve high frequencies of the output signal, the necessary gap and voltages tend to complicate the MEMS design, significantly increase the cost and difficulty of manufacture of the resonant structure, and/or require costly control circuitry (for example, high-voltage CMOS circuitry). Notably, an alternative to control and adjust the frequency (which applies as well at high frequencies) is to control temperature of the resonator structure. (See, for example, U.S. Patent Applications 2003/0160539 and 2003/0173864). In this regard, the temperature of the resonator structure may be controlled to provide a more precise high frequency output. While this technique may offer precision and/or control, the design of the MEMS resonant structure is considerably more complicated. In addition, such a MEMS design often requires additional power as well as temperature adjustment circuitry to control the temperature of the resonant structure. As such, this alternative may not be suitable for many applications.

There is a need for, among other things, an oscillator employing a MEMS resonator (hereinafter, a "MEMS oscillator") that overcomes one, some or all of the shortcomings of the conventional systems, designs and techniques. In this regard, there is a need for an improved MEMS oscillator that provides an output signal that is highly controllable, precise and/or capable of operating over a wide operating temperature that overcomes the cost, design, operation and/or manufacturing shortcomings of conventional MEMS oscillator/resonator systems. Moreover, there is a need for an improved MEMS oscillator providing an output signal (or output signals, each) having a frequency and/or phase that is accurate, stable, controllable, programmable, definable and/or selectable before and/or after design, fabrication, packaging and/or implementation.

SUMMARY OF THE INVENTION

There are many inventions described and illustrated herein. In a first principal aspect, the present invention is directed to a compensated microelectromechanical oscillator, having a microelectromechanical resonator that generates an output signal and frequency adjustment circuitry, coupled to the microelectromechanical resonator to receive the output signal of the microelectromechanical resonator and, in response to a set of values, to generate an output signal having second frequency. In one embodiment, the values may be determined using the frequency of the output signal of the microelectromechanical resonator, which depends on the operating temperature of the microelectromechanical resonator and/or manufacturing variations of the microelectromechanical resonator. In one embodiment, the frequency adjustment circuitry may include frequency multiplier circuitry, for example, PLLs, DLLs, digital/frequency synthesizers and/or FLLs, as well as any combinations and permutations thereof. The frequency adjustment circuitry, in addition or in lieu thereof, may include frequency divider circuitry, for example, DLLs, digital/frequency synthesizers (for example, DDS) and/or FLLs, as well as any combinations and permutations thereof.

The microelectromechanical resonator may be compensated (partially or fully) or uncompensated.

In one embodiment, the values employed by the frequency adjustment circuitry may be dynamically determined based on an estimation of the temperature of the microelectromechanical resonator. These values may be determined using empirical data and/or mathematical modeling. Moreover, in one embodiment, the values are determined using data which is representative of the operating temperature of the microelectromechanical resonator.

In one embodiment, the frequency adjustment circuitry may include frequency multiplier circuitry (for example, fractional-N PLL or digital synthesizer).

In another embodiment, the frequency adjustment circuitry includes (1) frequency multiplier circuitry and (2) frequency divider circuitry. The frequency multiplier circuitry (for example, fractional-N PLL) generates an output signal having frequency using a first set of values and the output signal of the microelectromechanical resonator, wherein the frequency of the output signal is greater than the frequency of the microelectromechanical resonator. The frequency divider circuitry (for example, integer-N PLL, a DLL, or a DDS) is coupled to the frequency multiplier circuitry to receive the output signal of the frequency multiplier circuitry and, based on a second set of values, generates the output signal having the second frequency.

In yet another embodiment, the frequency adjustment circuitry includes (1) a first frequency multiplier circuitry (for example, fractional-N PLL or digital/frequency synthesizer) and (2) a second frequency multiplier circuitry (for example, integer-N PLL or digital/frequency synthesizer).

In another principal aspect, the present invention is directed to a compensated microelectromechanical oscillator, having a microelectromechanical resonator (compensated (partially or fully) or uncompensated) that generates an output signal. The compensated microelectromechanical oscillator also includes frequency adjustment circuitry, coupled to the microelectromechanical resonator to receive the output signal of the microelectromechanical resonator and, in response to a set of values, to generate an output signal having an output frequency. In one embodiment, the set of values is determined based on the frequency of the output signal of the microelectromechanical resonator and data which is representative of the operating temperature of the microelectromechanical resonator.

In one embodiment, the values are dynamically provided to the frequency adjustment circuitry. In another embodiment, the values are determined using an estimated frequency of the output signal of the microelectromechanical resonator and wherein the estimated frequency is determined using empirical data. In yet another embodiment, the values are determined using an estimated frequency of the output signal of the microelectromechanical resonator and wherein the estimated frequency is determined using mathematical modeling.

In one embodiment, the frequency adjustment circuitry may include frequency multiplier circuitry (for example, fractional-N PLL or digital synthesizer).

In another embodiment, the frequency adjustment circuitry includes (1) frequency multiplier circuitry and (2) frequency divider circuitry. The frequency multiplier circuitry (for example, fractional-N PLL) generates an output signal having frequency using a first set of values and the output signal of the microelectromechanical resonator, wherein the frequency of the output signal is greater than the frequency of the microelectromechanical resonator. The frequency divider circuitry (for example, integer-N PLL, a DLL, or a DDS) is coupled to the frequency multiplier circuitry to receive the output signal of the frequency multiplier circuitry and, based on a second set of values, generates the output signal having the second frequency.

In yet another embodiment, the frequency adjustment circuitry includes (1) a first frequency multiplier circuitry (for example, fractional-N PLL or digital/frequency synthesizer) and (2) a second frequency multiplier circuitry (for example, integer-N PLL or digital/frequency synthesizer).

In another principal aspect, the present invention is a method of programming a temperature compensated microelectromechanical oscillator having a microelectromechanical resonator. The resonator generates an output signal wherein the output signal includes a first frequency. The microelectromechanical oscillator further includes frequency adjustment circuitry, coupled to the resonator to receive the output signal of the microelectromechanical resonator and to provide an output signal having a frequency that is within a predetermined range of frequencies. The method of this aspect of the invention comprises (1) measuring the first frequency of the output signal of the microelectromechanical resonator when the microelectromechanical resonator is at a first operating temperature, (2) calculating a first set of values, and (3) providing the first set of values to the frequency adjustment circuitry.

In one embodiment, the method further includes calculating a second set of values wherein the frequency adjustment circuitry, in response to the second set of values, provides the output signal having the frequency that is within a predetermined range of frequencies when the microelectromechanical resonator is at a second operating temperature. The second set of values may be calculated using empirical data or using mathematical modeling.

In yet another principal aspect, the present invention is a method of operating a temperature compensated microelectromechanical oscillator having a microelectromechanical resonator and frequency adjustment circuitry. The resonator is employed to generate an output signal wherein the output signal includes a first frequency. The frequency adjustment circuitry is coupled to the resonator to receive the output signal of the microelectromechanical resonator and, in response to a first set of values, provides an output signal having a second frequency wherein the second frequency is within a predetermined range of frequencies. The method of this aspect of the invention includes (1) acquiring data which is representative of the temperature of the microelectromechanical resonator; (2) determining that the microelectromechanical resonator is at a second operating temperature; (3) determining a second set of values wherein the frequency adjustment circuitry, in response to the second set of values, provides the output signal having the frequency that is within a predetermined range of frequencies when the microelectromechanical resonator is at the second operating temperature; and (4) providing the second set of values to the frequency adjustment circuitry. The second set of values may be calculated using empirical data or using mathematical modeling.

In one embodiment, the method further includes measuring the temperature of the microelectromechanical resonator and calculating the operating temperature of the microelectromechanical resonator.

In another embodiment, the second set of values includes the first and second subsets of values and the frequency adjustment circuitry includes: (1) first frequency multiplier circuitry (for example, fractional-N PLL) to generate an output signal having frequency using a first subset of values wherein the frequency of the output signal is greater than the first frequency; and (2) second frequency multiplier circuitry (for example, an integer-N PLL or a digital/frequency synthesizer), coupled to the first frequency multiplier circuitry, to receive the output signal of the first frequency multiplier circuitry and, based on a second subset of values, to generate the output signal having the second frequency wherein the second frequency is greater than the frequency of the output signal of the first frequency multiplier circuitry. The method further comprises determining the first subset of values wherein the frequency adjustment circuitry, in response to the first subset of values, provides the output signal having the frequency that is within a predetermined range of frequencies when the microelectromechanical resonator is at the second operating temperature.

Again, there are many inventions described and illustrated herein. This Summary of the Invention is not exhaustive of the scope of the present invention. Moreover, this Summary is not intended to be limiting of the invention and should not be interpreted in that manner. While certain embodiments, features, attributes and advantages of the inventions have been described in this Summary of the Invention, it should be understood that many others, as well as different and/or similar embodiments, features, attributes and/or advantages of the present inventions, which are apparent from the description, illustrations and claims, which follow.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

FIGS. 4A-4C, 5A-5C, 6A-6C, 7A-7C and 8A-8C generally illustrate typical characteristics of an output signal of MEMS oscillator versus temperature, various exemplary operations or functions of the compensation circuitry versus temperature, and certain characteristics of the output signal of compensated MEMS oscillator over temperature and/or initial error;

FIGS. 9A-9D illustrate more detailed block diagrams of the frequency and/or phase compensated MEMS oscillators in accordance with certain aspects of the present inventions;

FIGS. 12A and 12B illustrate block diagram representations of a frequency and/or phase compensated MEMS oscillator including a plurality of output signals, according to certain aspects of the present invention;

FIGS. 13A and 13B illustrate block diagram representations of a MEMS oscillator having frequency multiplier circuitry and the frequency divider circuitry that includes independent frequency and phase control of a plurality of output signals, in accordance with certain aspects of the present invention;

FIGS. 22A and 22B are block diagram representations of a frequency and/or phase compensated MEMS oscillator, implemented in conjunction with modulation circuitry, in accordance with certain aspects of the present inventions.

DETAILED DESCRIPTION

Figure 1:
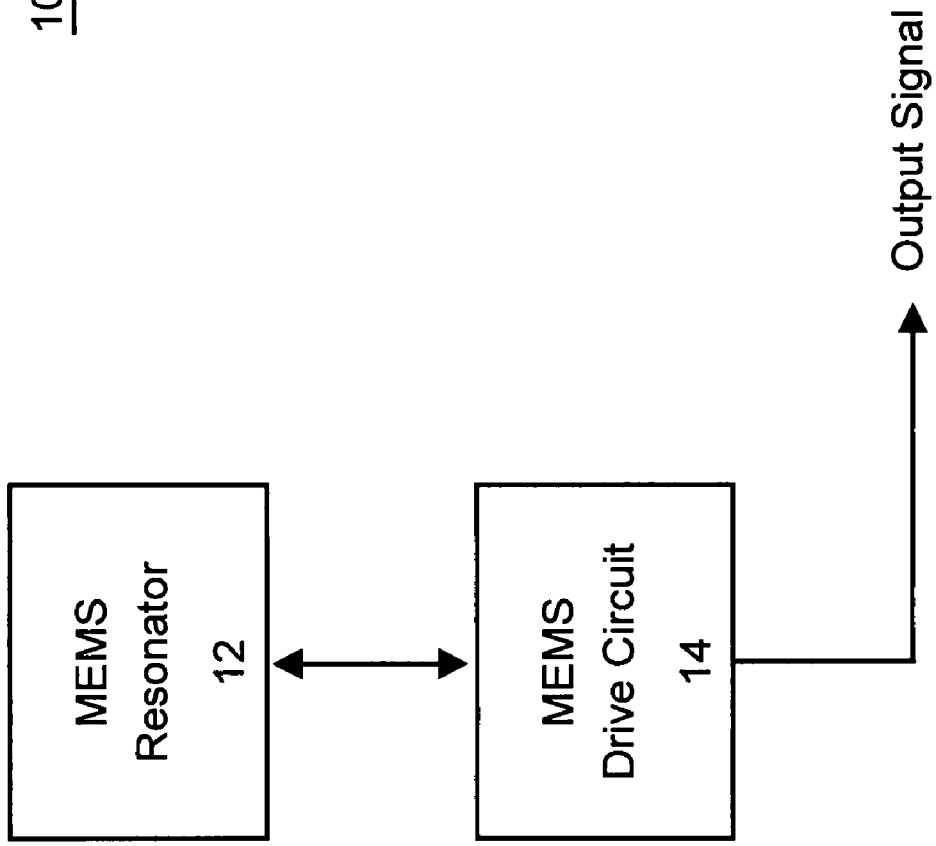
FIG. 1 is a block diagram representation of a conventional MEMS oscillator.

There are many inventions described and illustrated herein. In one aspect, the present invention is directed to a frequency and/or phase compensated MEMS oscillator (hereinafter "frequency/phase compensated MEMS oscillator" or "compensated MEMS oscillator") for providing a highly accurate, stable, controllable, programmable, definable and/or selectable output signal(s). In this regard, the controllable, programmable, definable and/or selectable aspect of the output signal(s) may be the frequency and/or phase of the output signal. For example, the present invention may provide a highly accurate, stable, controllable, programmable, definable and/or selectable output signal(s) having a predetermined, predefined and/or specific frequency (for example, a lower frequency of 1 Hz to 100 kHz, a more moderate frequency of 1-100 MHz or a higher frequency of 1-10 GHz) and/or a desired phase (for example, 0°, 90° and/or 180°). Indeed, the frequency and/or phase of the output signal may be adjusted, compensated, controlled, programmed, defined and/or selected before and/or after design, fabrication, packaging and/or implementation within circuitry.

With reference to FIGS. 2A-2E, frequency/phase compensated MEMS oscillator 100 of the present invention employs MEMS resonator 12 and drive circuit 14 (i.e., MEMS oscillator 10) to provide a temporally repeating output signal having a known frequency (for example, a clock signal). Notably, MEMS resonator 12 and drive circuit 14 may employ any type of MEMS design and/or control, whether now known or later developed, including, for example, those discussed above in the Background of the Invention. Indeed, drive circuit 14 of the present invention may or may not include circuitry that controls and/or adjusts the frequency of the output signal.

The output of MEMS oscillator 10 is provided to compensation and control circuitry 16. In one embodiment, compensation and control circuitry 16 includes frequency and/or phase compensation circuitry 18 (hereinafter "compensation circuitry 18"), which receives the output of MEMS oscillator 10 and adjusts, compensates, corrects and/or controls the frequency and/or phase of the output of MEMS oscillator 10. In this regard, compensation circuitry 18 uses the output of MEMS oscillator 10 to provide an adjusted, corrected, compensated and/or controlled output having, for example, a desired, selected and/or predetermined frequency and/or phase.

The characteristics of the output signal (frequency and/or phase) of compensation circuitry 18 may be pre-set, pre-programmed and/or programmable to provide an output signal having, for example, a desired, selected and/or predetermined frequency and/or phase. The characteristics of the output signal may be pre-programmed or programmable during, for example, fabrication, test, and/or calibration. Indeed, the characteristics of the output signal may also be programmed during normal operation.

Figure 3A:
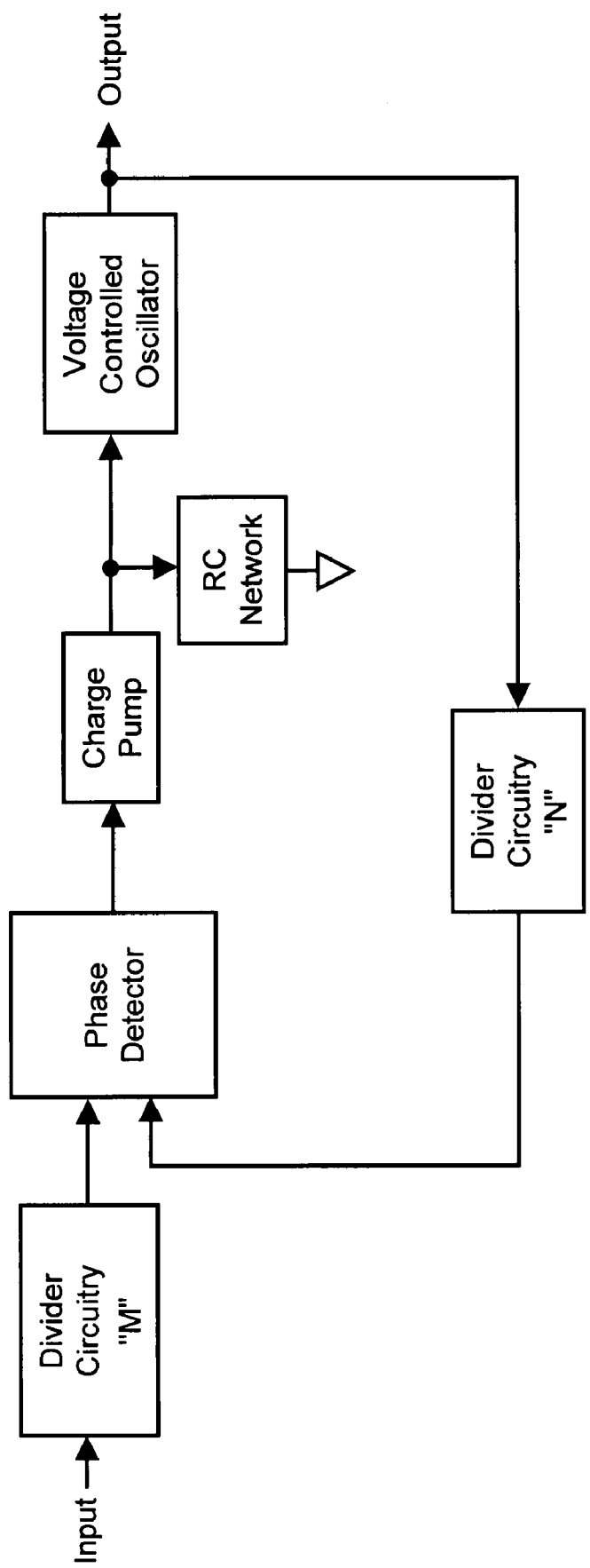
FIGS. 3A-3H are block diagram representations of a conventional phase locked loop, delay locked loop, direct digital synthesizer, and fractional synthesizer.
Figure 3B:
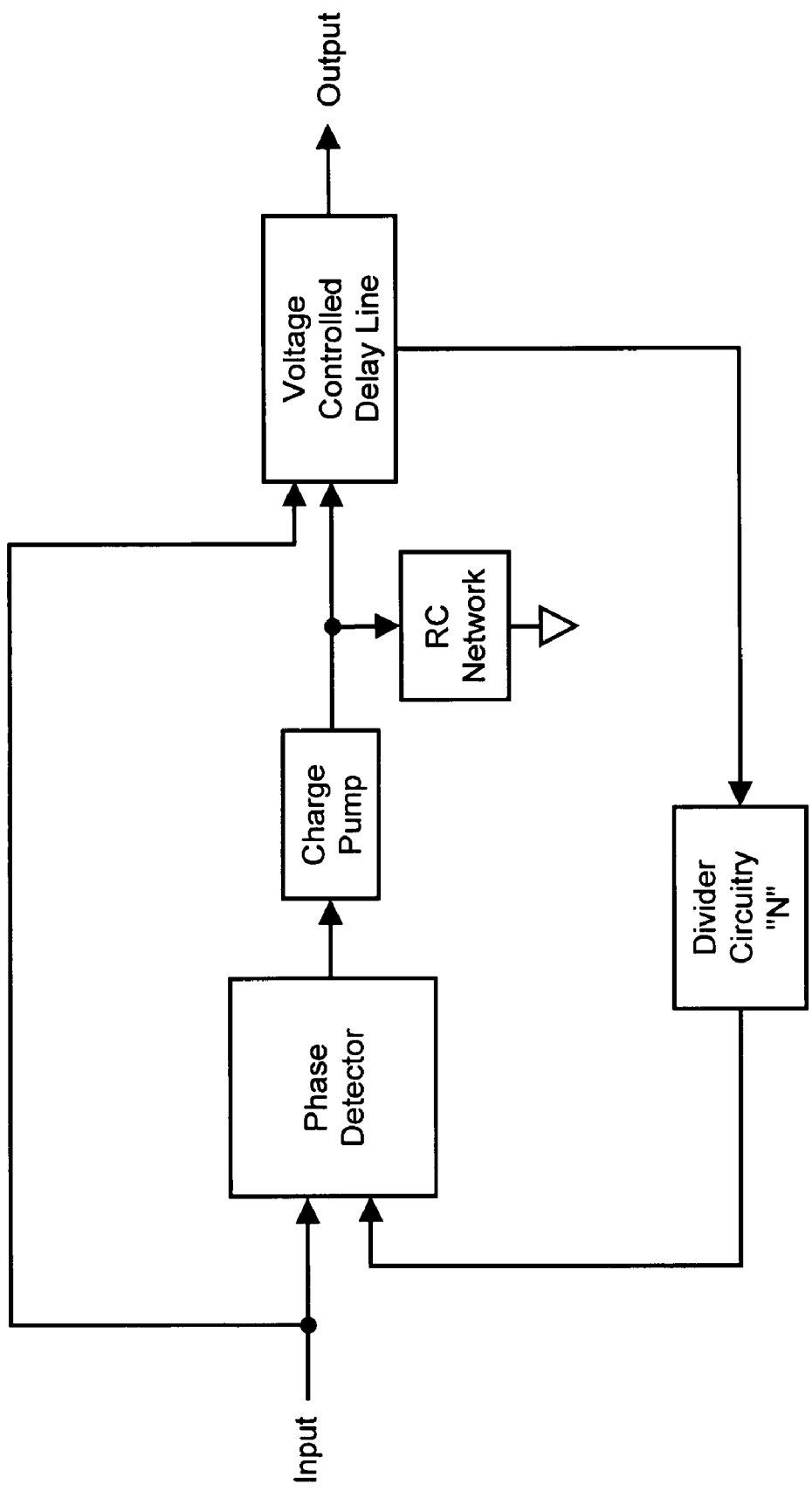
Figure 3C:
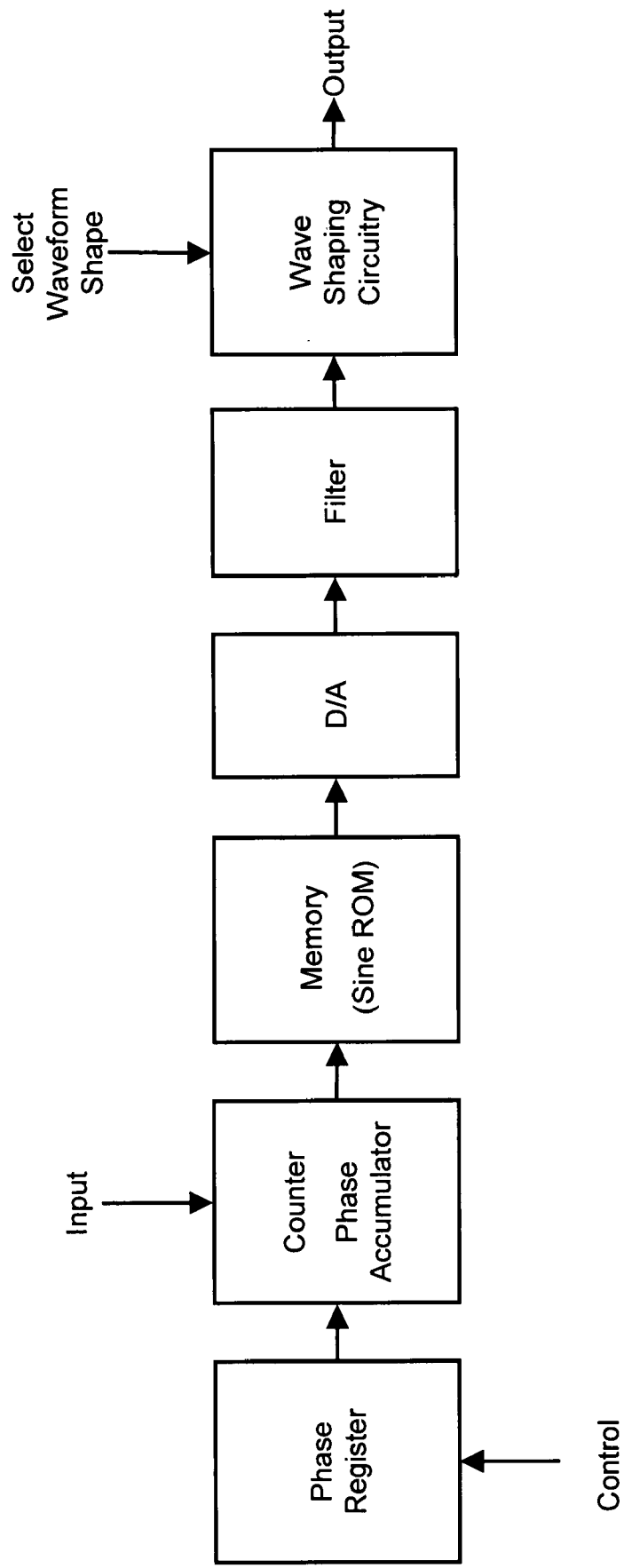
Figure 3D:
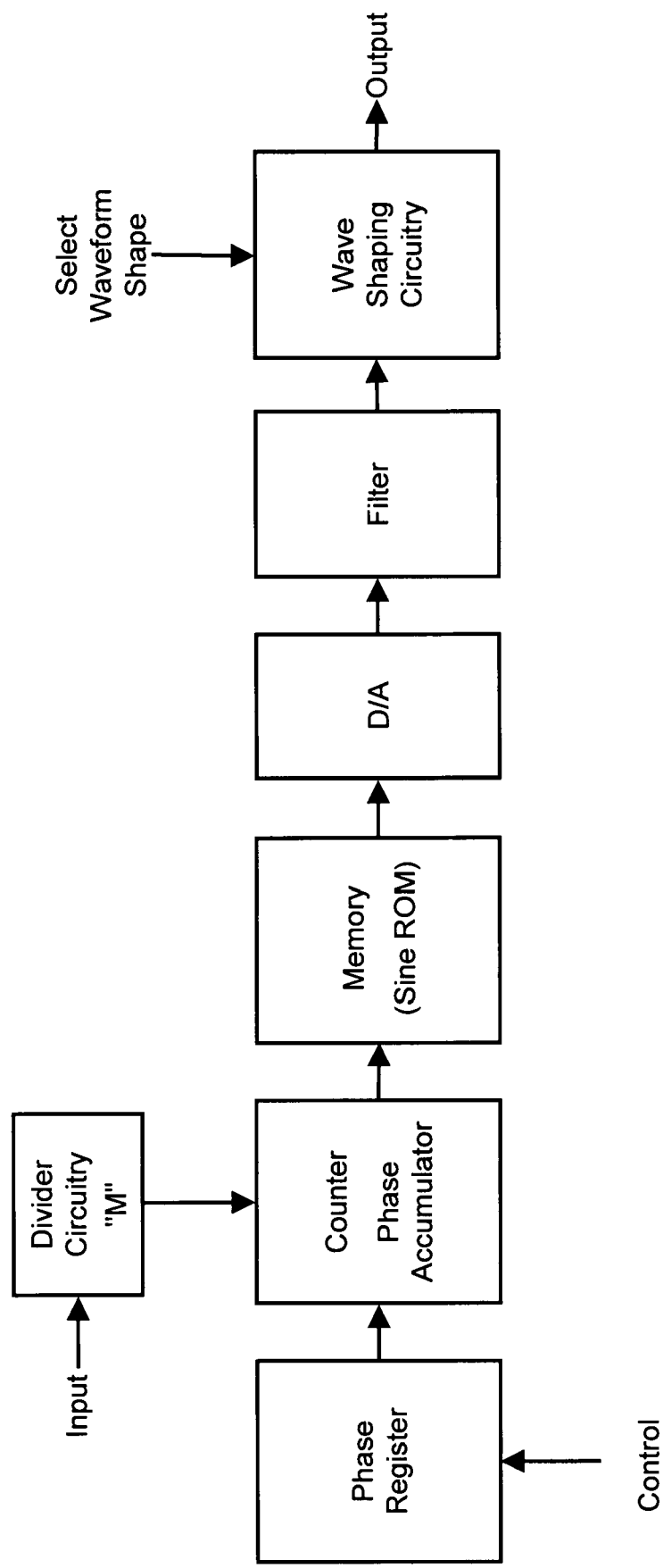

The compensation circuitry 18 may employ one or more phase locked loops (PLLs), delay locked loops (DLLs), digital/frequency synthesizer (for example, a direct digital synthesizer ("DDS"), frequency synthesizer, fractional synthesizer and/or numerically controlled oscillator) and/or frequency locked loops (FLLs). In these embodiments, the output of MEMS oscillator 10 is employed as the reference input signal (i.e., the reference clock). The PLL, DLL, digital/frequency synthesizer and/or FLL may provide frequency multiplication (i.e., increase the frequency of the output signal of the MEMS oscillator). The PLL, DLL, digital/frequency synthesizer and/or FLL may also provide frequency division (i.e., decrease the frequency of the output signal of the MEMS oscillator). Moreover, the PLL, DLL, digital/frequency synthesizer and/or FLL may also compensate using multiplication and/or division to adjust, correct, compensate and/or control the characteristics (for example, the frequency, phase and/or jitter) of the output signal of the MEMS resonator. Notably, block diagrams of an embodiment of a typical or conventional PLL and DLL are provided in FIGS. 3A and 3B, respectively; block diagrams of embodiments of typical or conventional DSS are provided in FIGS. 3C and 3D.

Figure 3E:
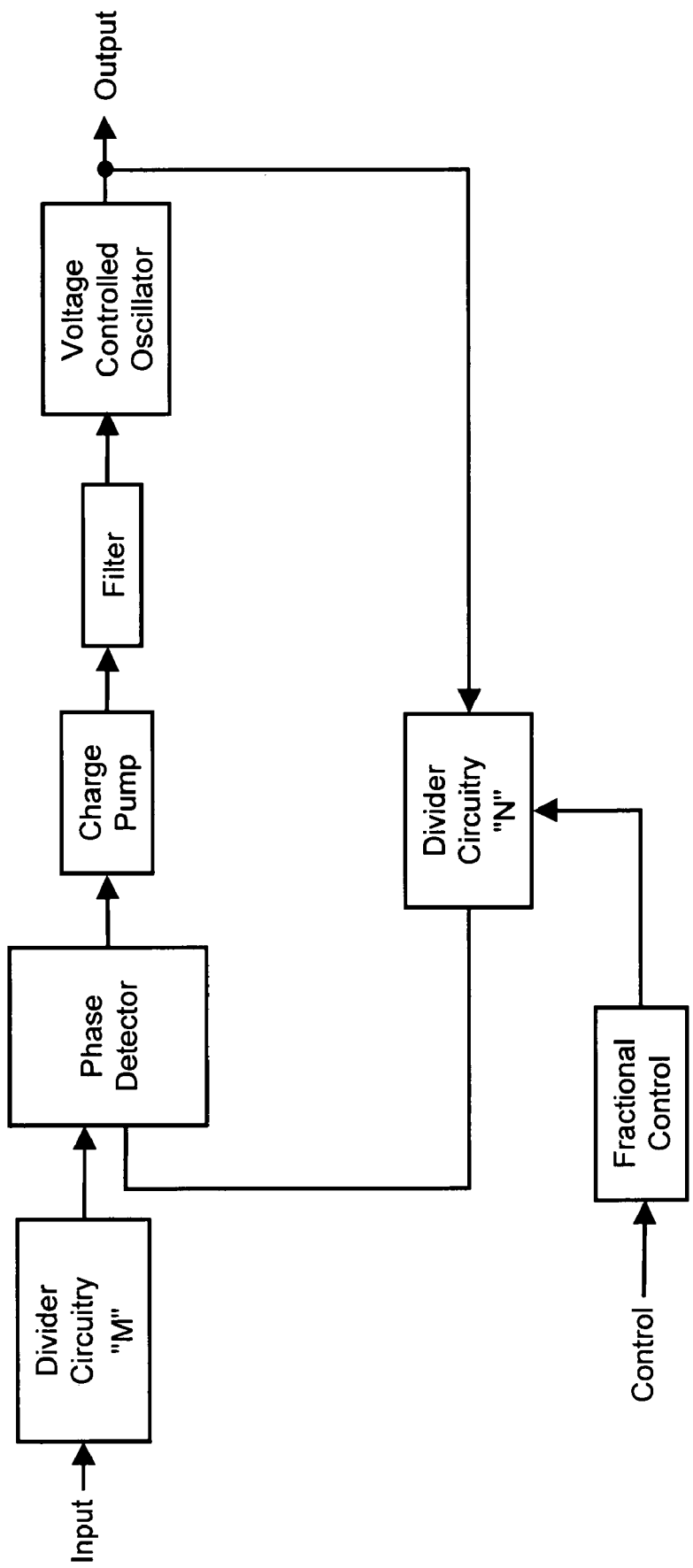
Figure 3F:
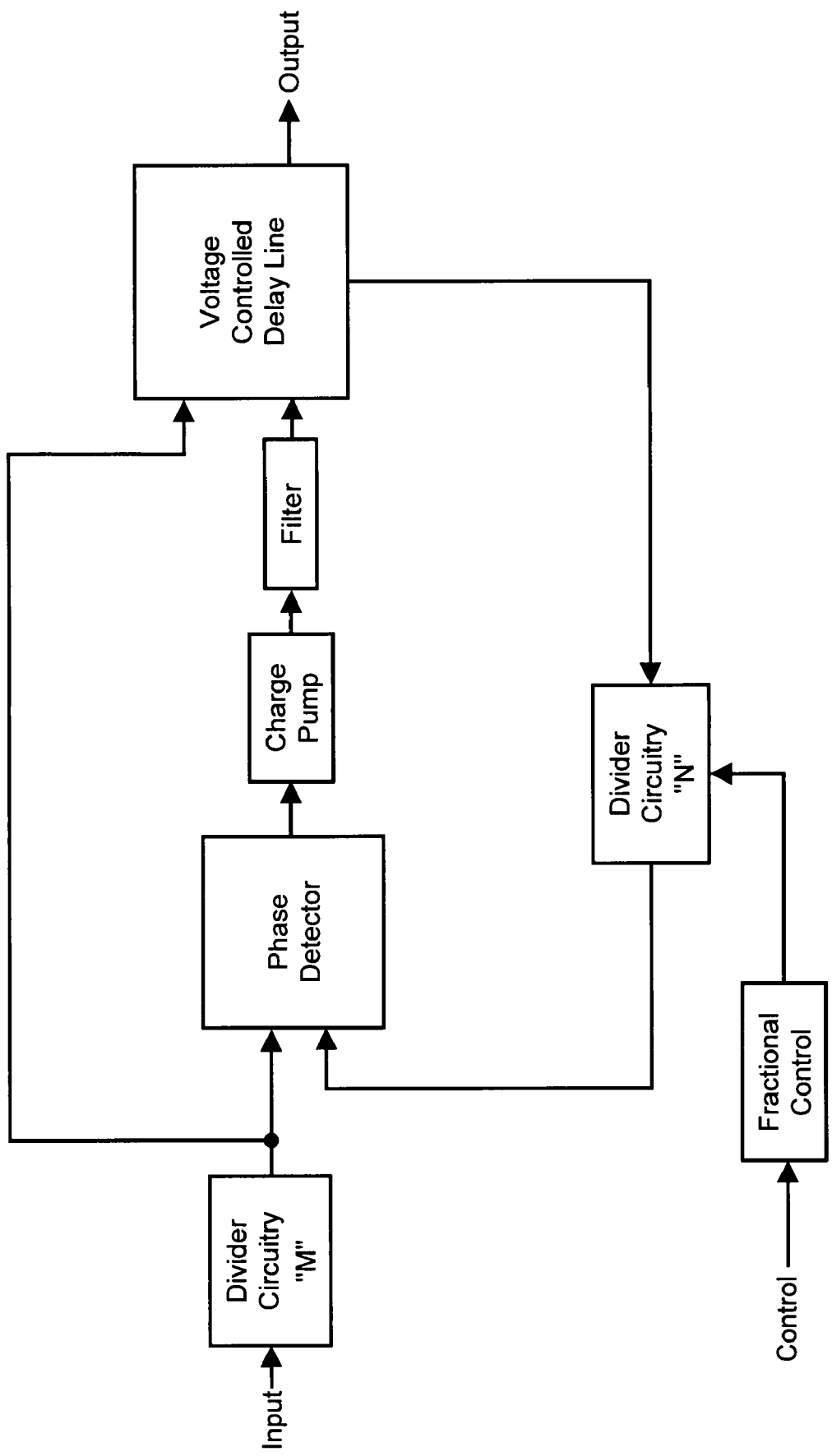
Figure 3G:
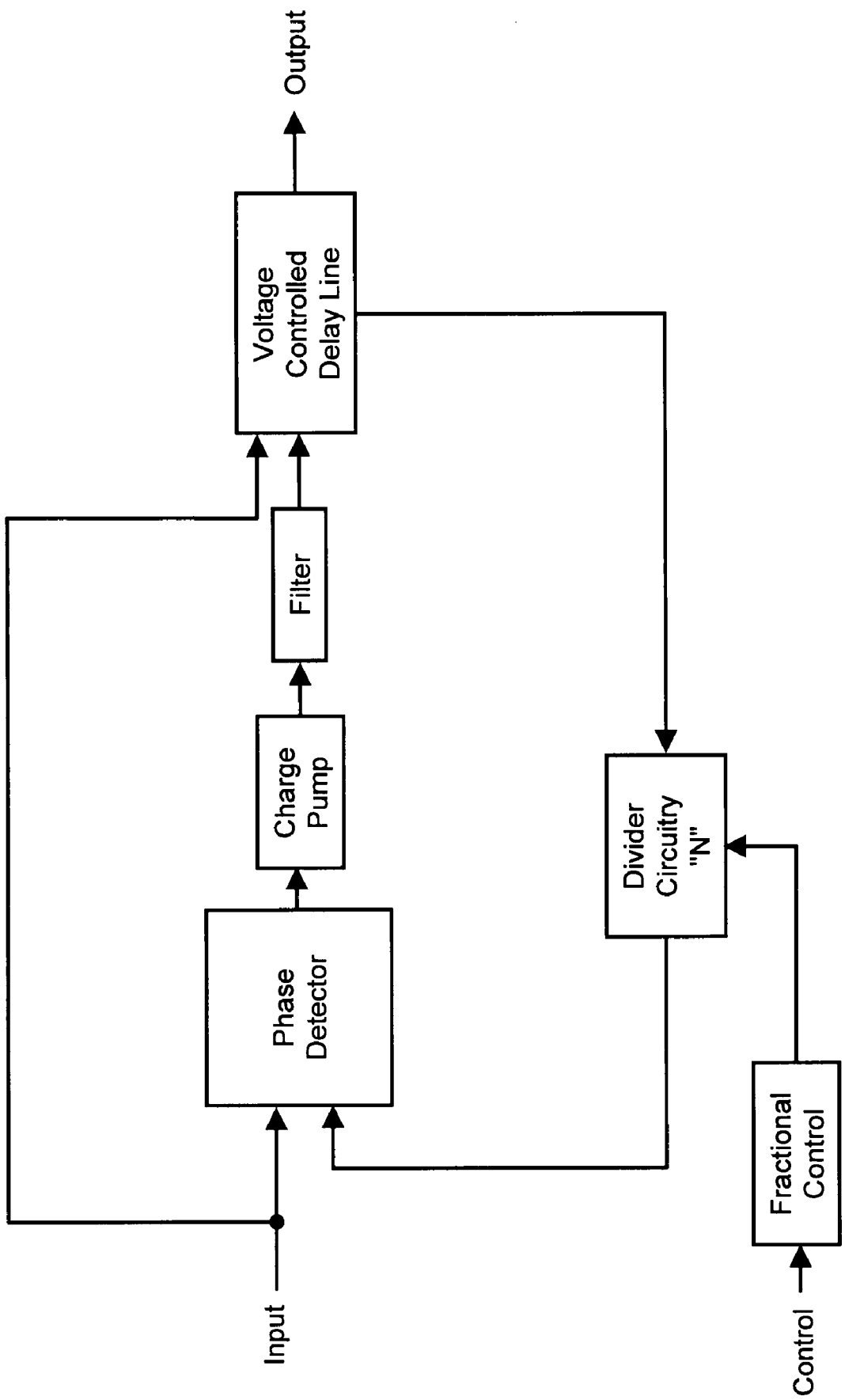
Figure 3H:
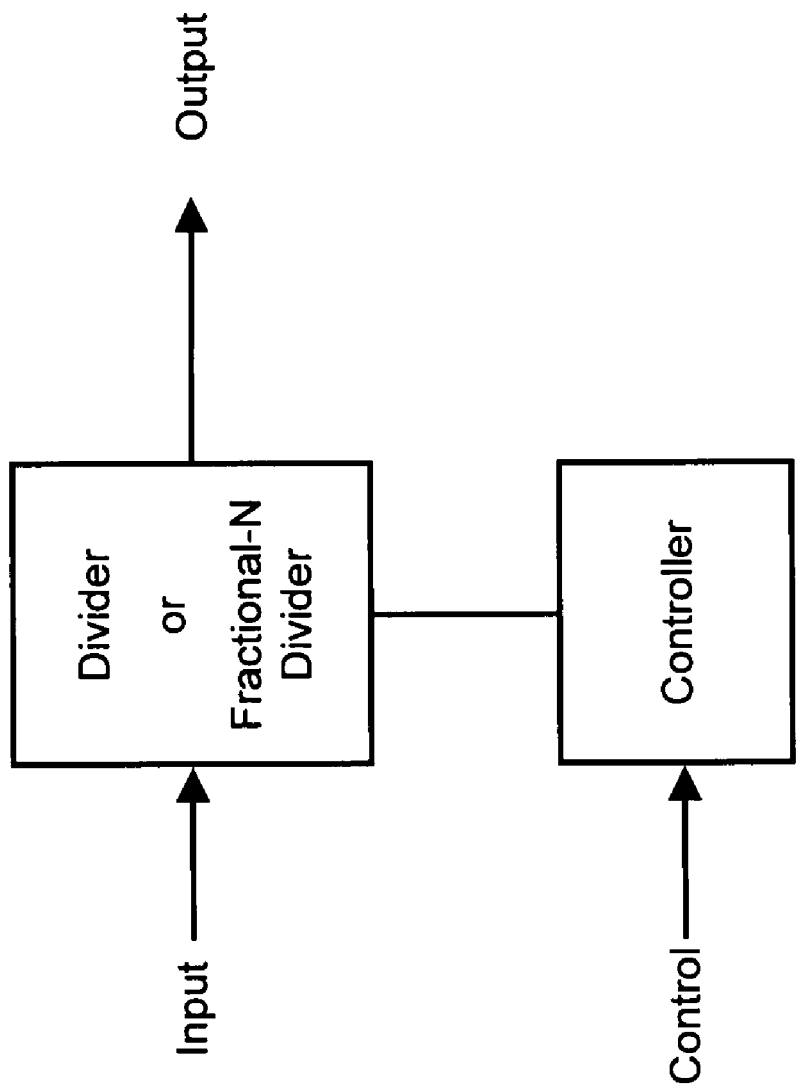

The multiplication or division (and/or phase adjustments) by compensation circuitry 18 may be in fine or coarse increments. For example, compensation circuitry 18 may include an integer PLL, a fractional PLL and/or a fine-fractional-N PLL to precisely select, control and/or set the output signal of compensated MEMS oscillator 100. In this regard, the output of MEMS oscillator 10 may be provided to the input of the fractional-N PLL and/or the fine-fractional-N PLL (hereinafter collectively "fractional-N PLL"), which may be pre-set, pre-programmed and/or programmable to provide an output signal having a desired, selected and/or predetermined frequency and/or phase. Notably, block diagrams of an embodiment of a typical or conventional fractional-N PLL and fractional synthesizer are provided in FIGS. 3E and 3H, respectively; block diagrams of embodiments of typical or conventional fractional-N DLL and are provided in FIGS. 3F and 3G.

Notably, in one embodiment, the parameters, references (for example, frequency and/or phase), values and/or coefficients employed by compensation circuitry 18 in order to generate and/or provide an adjusted, corrected and/or controlled output having, for example, a desired, selected and/or predetermined frequency and/or phase (i.e., the function of compensation circuitry 18), may be externally provided to compensation circuitry 18 either before or during operation of compensated MEMS oscillator 100. In this regard, a user or external circuitry/devices/systems may provide information representative of the parameters, references, values and/or coefficients to set, change, enhance and/or optimize the performance of compensation circuitry 18 and/or compensated MEMS oscillator 100. With continued reference to FIG. 2B, such information may be provided directly to compensation circuitry 18 or to memory 20 for use by compensation circuitry 18.

Notably, compensation circuitry 18 may also provide a plurality of outputs, each having a desired, selected and/or predetermined relative or absolute frequency and/or phase. For example, frequency/phase compensated MEMS oscillator 100 of the present invention may provide a number of output signals each having a desired, selected and/or predetermined frequency (for example, one-quarter, one-half and/or twice the frequency of the output signal of MEMS oscillator 10) as well as a desired, selected and/or predetermined phase relationship relative to a reference input and/or the other output signals (for example, 0°, 45°, 90° and/or 180°). Indeed, the frequency and/or phase relationship may be programmable during, for example, fabrication, test, calibration and/or during normal operation. Notably, the plurality of outputs may be generated by the same or separate or different compensation circuitry 18.

Figure 2A:
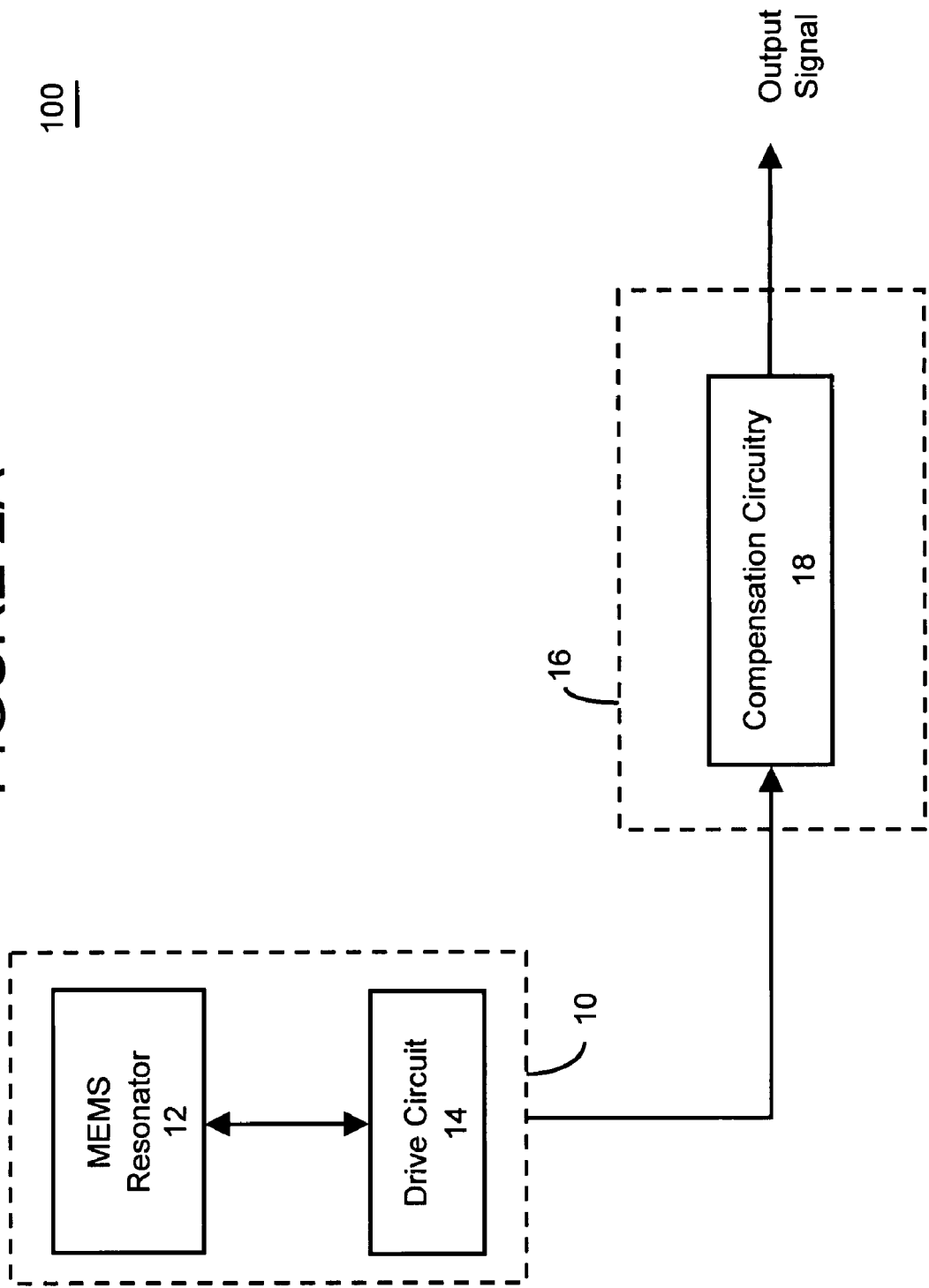
FIGS. 2A-2E are block diagram representations of a frequency and/or phase compensated MEMS oscillator in accordance with certain aspects of the present inventions.
Figure 2B:
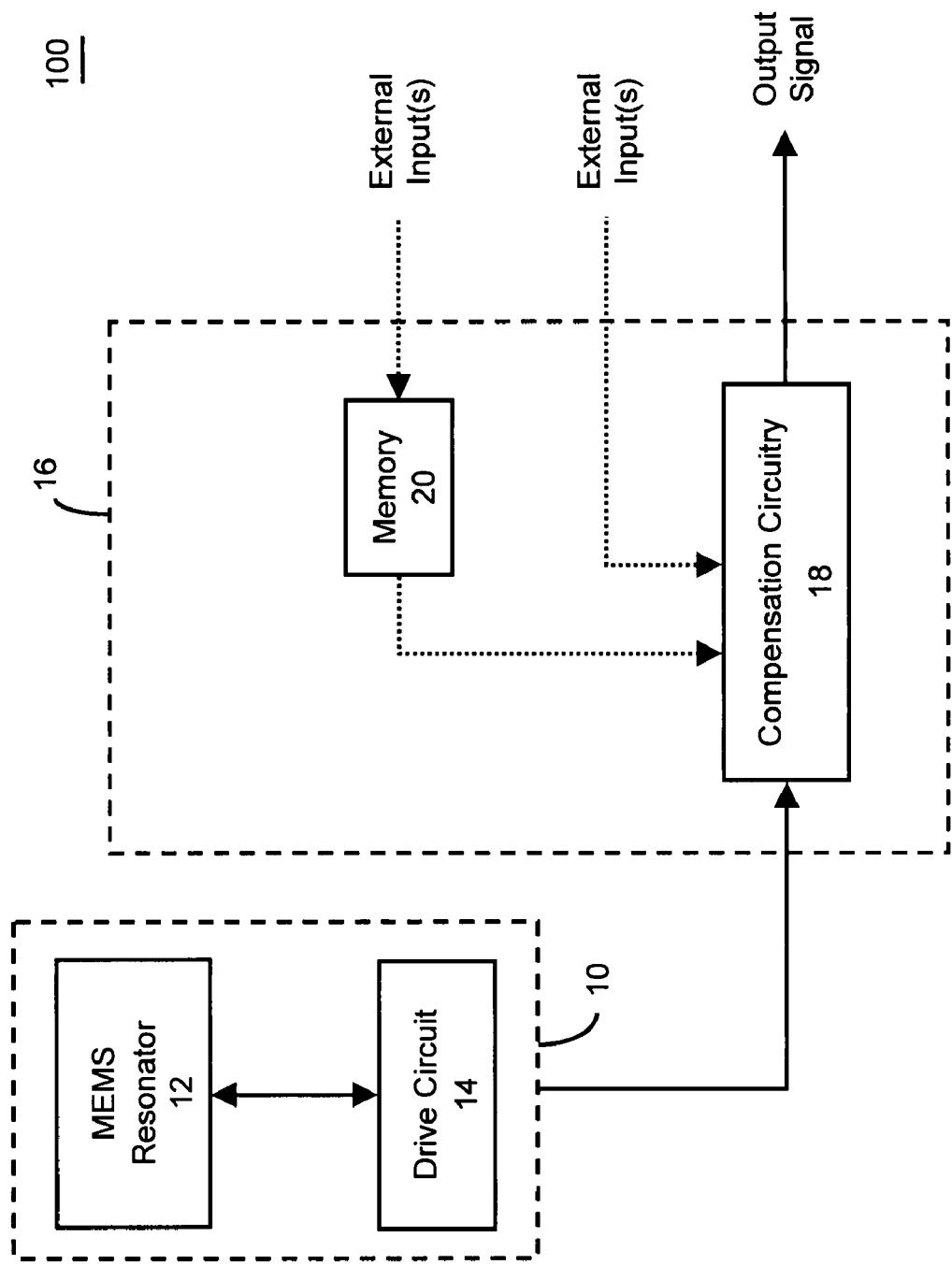
Figure 2C:
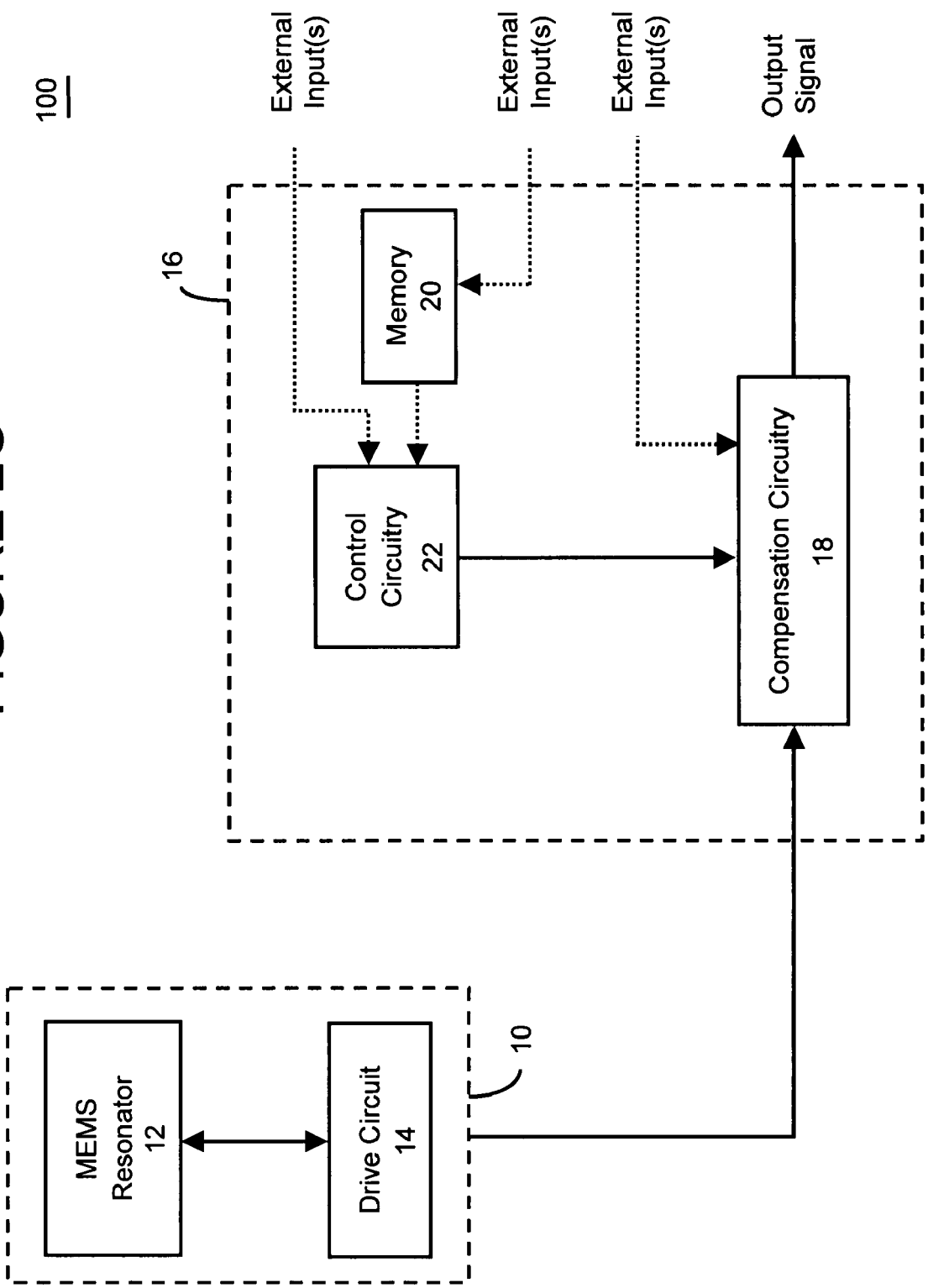
Figure 2D:
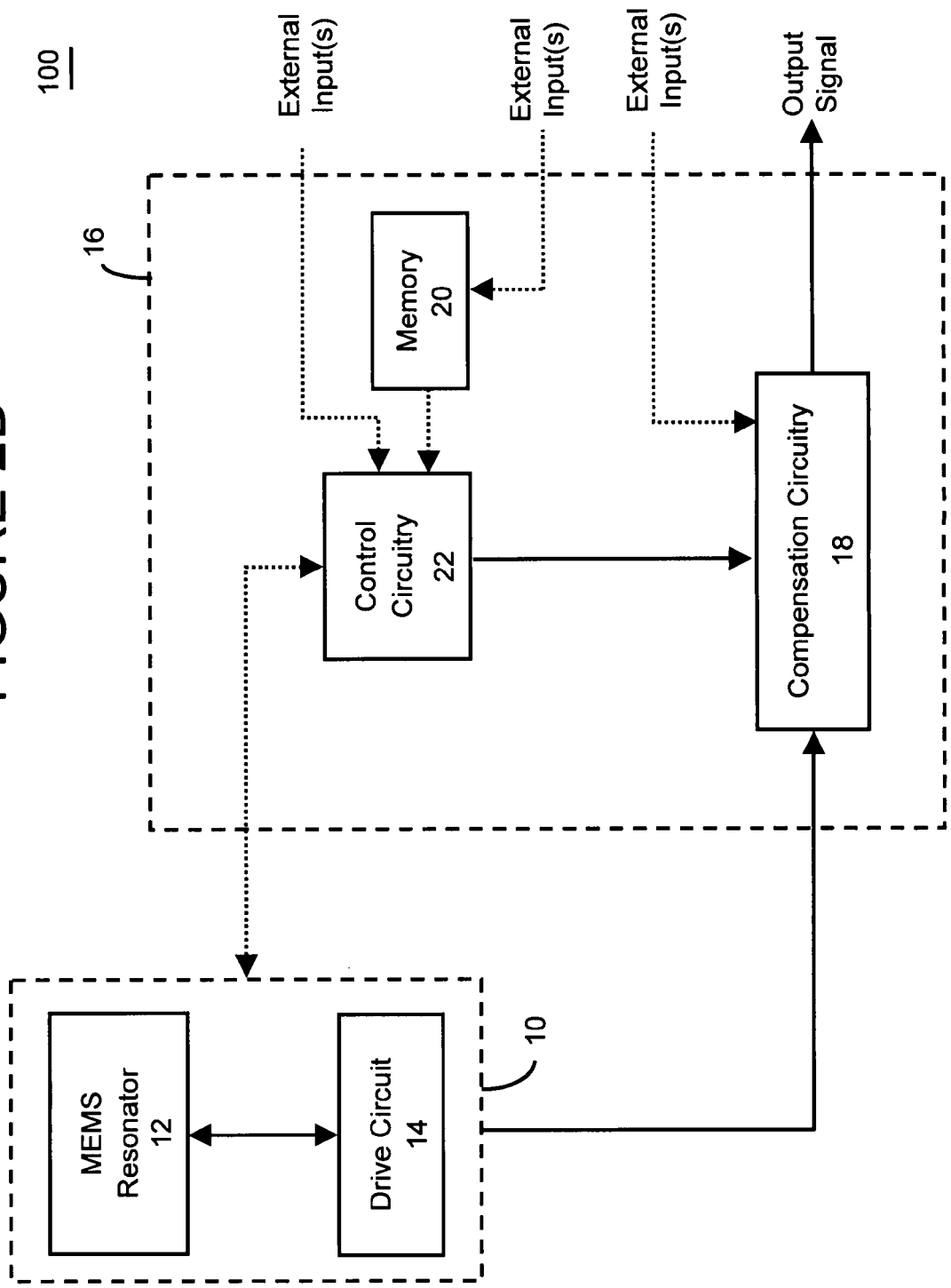
Figure 2E:
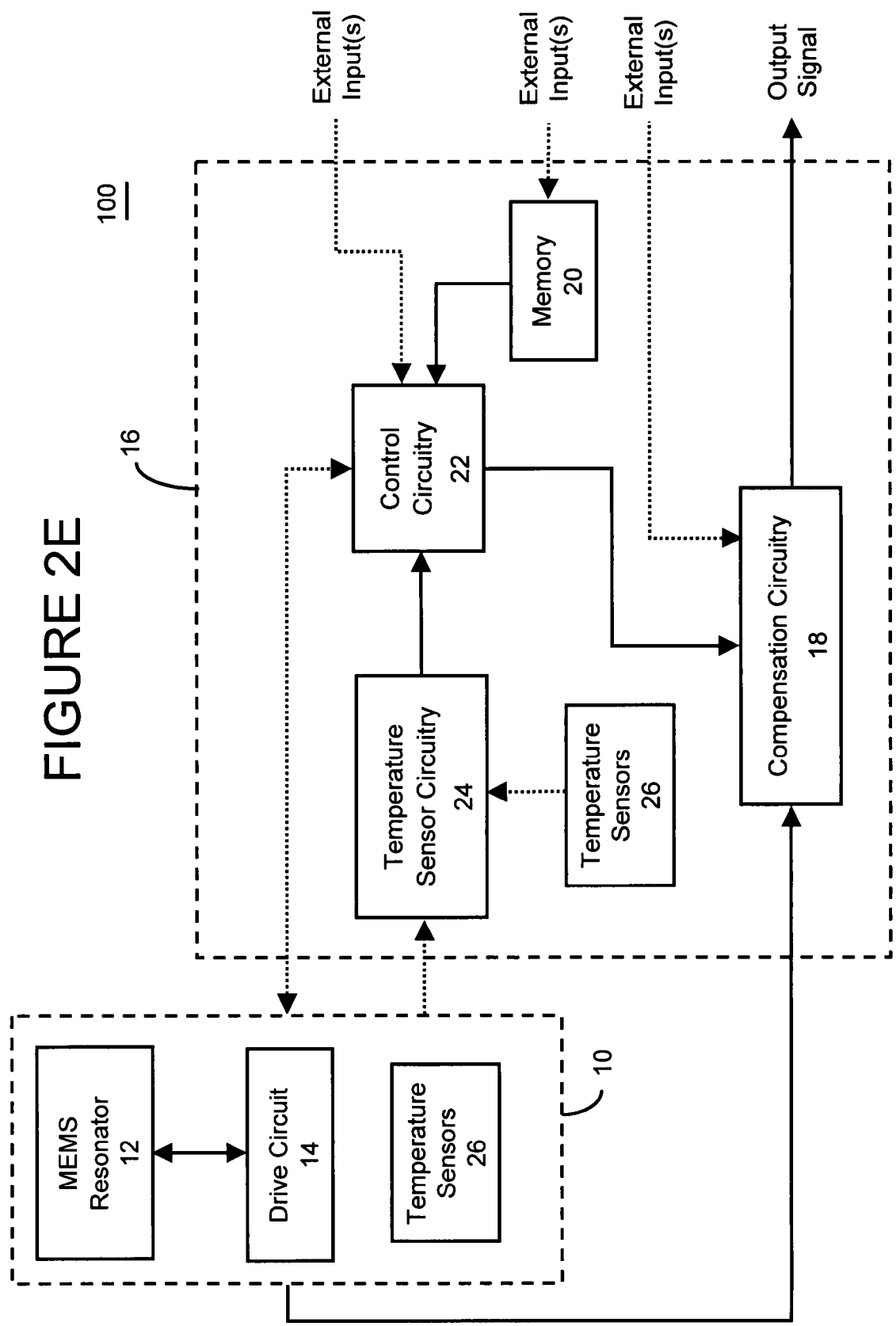

With reference to FIGS. 2C-2E, in certain embodiments, compensated MEMS oscillator 100 includes control circuitry 22 to control compensation circuitry 18. In this regard, control circuitry 22, in one embodiment, may provide, calculate and/or determine (based on external inputs and/or data resident in local and/or resident/integrated memory 20 that may be, for example, programmed during fabrication, test, calibration and/or dynamically during operation) the parameters, references, values and/or coefficients necessary for compensation circuitry 18 (for example, parameters and/or coefficients for a PLL(s), digital/frequency synthesizer and/or DLL(s)) to adjust, correct and/or control the frequency and/or phase of the output of MEMS oscillator 10 so that the attributes and/or characteristics (for example, frequency, phase, modulation, spread, jitter, duty cycle, locking/response time, noise rejection and/or noise immunity) of the output signal(s) of compensated MEMS oscillator 100 are suitable, desired and/or within predetermined or pre-selected limits (for example, within 25 ppm of a desired, suitable and/or predetermined frequency, and 1% of a desired, suitable and/or predetermined phase and/or duty cycle).

Thus, in one embodiment, the parameters, references (for example, frequency and/or phase), values and/or coefficients employed by control circuitry 22 to set and/or control compensation circuitry 18 may be externally provided to control circuitry 22 either before or during operation of compensated MEMS oscillator 100. In this regard, a user or external circuitry/devices/systems may provide information representative of the parameters, references, values and/or coefficients in order to set, change, enhance and/or optimize the performance of compensation circuitry 18 and/or compensated MEMS oscillator 100. Such information may be provided directly to control circuitry 22 or to memory 20 to be used by control circuitry 22.

In another embodiment, the parameters, references, values and/or coefficients employed by control circuitry 22 to set, program and/or control compensation circuitry 18 may be pre-programmed or pre-set, for example, by permanently, semi-permanently or temporarily (i.e., until re-programmed) storing information which is representative of the parameters, references, values and/or coefficients in memory 20 such as SRAM, DRAM, ROM, PROM, EPROM, EEPROM or the like (e.g., configuring the state of a certain pin or pins on the package). In this embodiment of the present invention, the information representative of the parameters, references, values and/or coefficients may be stored in, for example, an SRAM, DRAM, ROM or EEPROM. The information which is representative of the parameters, references, values and/or coefficients may be stored or programmed in memory 20 during fabrication, test, calibration and/or operation. In this way, control circuitry 22 may access memory 20 to retrieve the necessary information during start-up/power-up, initialization, re-initialization and/or during normal operation of frequency/phase compensated MEMS oscillator 100.

It should be noted that memory 20 may be comprised of discrete component(s) or may reside on or in the integrated circuit containing compensation circuitry 18, control circuitry 22 and/or frequency/phase compensated MEMS oscillator 100.

Notably, control circuitry 22 may also control the operation of MEMS oscillator 10. (See, for example, FIGS. 2D and 2E). For example, control circuitry 22 may control the operation of MEMS resonator 12 (directly) and/or drive circuit 14 which, in turn, adjusts the operation and/or performance of MEMS resonator 12. In this way, the output signal of MEMS oscillator 10 may be adjusted, corrected and/or controlled to provide a signal having a frequency within a given, predetermined and/or desired range (for example, 1-100 MHz±10 ppm). All techniques for controlling the operation of MEMS oscillator 10, whether now known or later developed, are intended to be within the present invention. The information or data used to control the operation of the MEMS oscillator may be provided externally or may be retained in memory 20, in the same manner discussed above in connection with the parameters, references, values and/or coefficients employed to control compensation circuitry 18.

With reference to FIG. 2E, frequency/phase compensated MEMS oscillator 100 of the present invention may also include temperature sensor circuitry 24. The temperature sensor circuitry 24, in one embodiment, receives data (current or voltage, in analog or digital form) which is representative of the temperature of MEMS oscillator 10 (or portions thereof and/or compensation circuitry 18 (via temperature sensor(s) 26) from one or more discrete temperature sensors (collectively illustrated as temperature sensors 26 but not individually illustrated). In response, temperature sensor circuitry 24 determines and/or calculates information which is representative of the corresponding operating temperature (i.e., the operating temperature of MEMS oscillator 10 (or portions thereof) and/or compensation circuitry 18). In this regard, one or more temperature sensors (for example, from a diode(s), a transistor(s), a resistor(s) or varistor(s)), and/or one or more MEMS structures may be disposed at selected, significant and/or "critical" locations on the substrate of MEMS oscillator 10 and/or compensation circuitry 18.

The temperature sensor circuitry 24 provides the information to control circuitry 22 which, in response, may determine or calculate new parameters, references, values and/or coefficients (i.e., absolute information), or adjustment to the existing or current parameters, references, values and/or coefficients (i.e., relative information) to address and/or compensate for the change in temperature. In this regard, control circuitry 22 may determine and/or calculate the parameters, references (for example, frequency and/or phase), values and/or coefficients (or adjustments thereto) which are necessary for compensation circuitry 18 to generate and/or provide the suitable, desired and/or predetermined output signal(s) (for example, signals having the desired, suitable and/or predetermined frequency and/or phase).

Indeed, control circuitry 22 may adjust the operation of MEMS oscillator 10 in accordance with changes in the operating conditions and/or environment of frequency/phase compensated MEMS oscillator 100, or parts thereof (for example, MEMS oscillator 10 and/or compensation circuitry 18). For example, in one embodiment, control circuitry 22 may employ the data from temperature sensor circuitry 24 to control the frequency of the output of MEMS oscillator 10 (directly) and/or (indirectly) via drive circuit 14. In this way, the output signal of MEMS oscillator 10 may be adjusted, corrected and/or controlled to accommodate and/or compensate for changes in the operating conditions and/or environment. The control circuitry 22, in one embodiment, employs a look-up table and/or a predetermined or mathematical relationship to adjust and/or control the operation of MEMS oscillator 10 to compensate and/or correct for changes in ambient temperature (i.e., the temperature of MEMS oscillator 10).

In another embodiment, control circuitry 22 may adjust, correct and/or control MEMS oscillator 10 and the performance characteristics of compensation circuitry 18 to, for example, provide a signal having a frequency and/or phase within a given, predetermined and/or desired range. For example, control circuitry 22 may adjust, correct and/or control the frequency of the output of MEMS oscillator 10, as described above. In addition, control circuitry 22 may also determine and/or calculate new parameters, references, values and/or coefficients (or adjustment to the current parameters, references, values and/or coefficients) for use by compensation circuitry 18, as a result of the adjustment, correction and/or control of the frequency of the output of MEMS oscillator 10. In this way, a more optimum performance of compensated MEMS oscillator 100 may be obtained given the operating conditions and/or environment of the MEMS oscillator 10 and/or compensation circuitry 18.

Figure 4A:
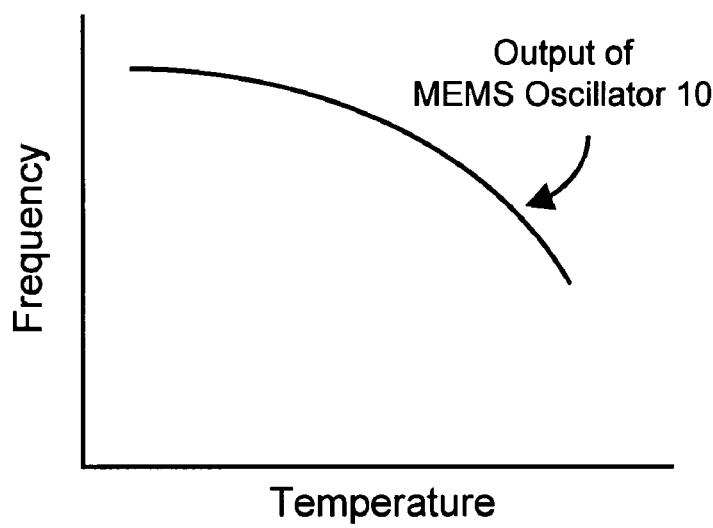

The output signal MEMS oscillator 10 over temperature, the general exemplary compensation operations or functions of compensation circuitry 18 over temperature, and the output signal of compensated MEMS oscillator 100 over temperature (i.e., having a desired, selected and/or predetermined frequency and/or phase) are generally illustrated in FIGS. 4A-4C, 5A-5C, 6A-6C, 7A-7C and 8A-8C. In this regard, the output signal of compensated MEMS oscillator 100 in each instance includes desired, selected and/or predetermined characteristics (for example, desired, selected and/or predetermined frequency and/or phase) at a given, predetermined and/or particular frequency and/or temperature. The output signal of compensated MEMS oscillator 100 in each instance may also include desired, selected and/or predetermined characteristics for a frequency, over a set or range of frequencies and/or set or range of temperatures. For example, with reference to FIGS. 4C 5C, and 8C, the frequency versus temperature of the output signal of compensated MEMS 100 is constant or "flat" (or substantially constant or flat) and, as such, the frequency remains constant (or substantially constant) over a range of temperatures (for example, the operating temperatures of compensated MEMS oscillator 100).

Figure 4B:
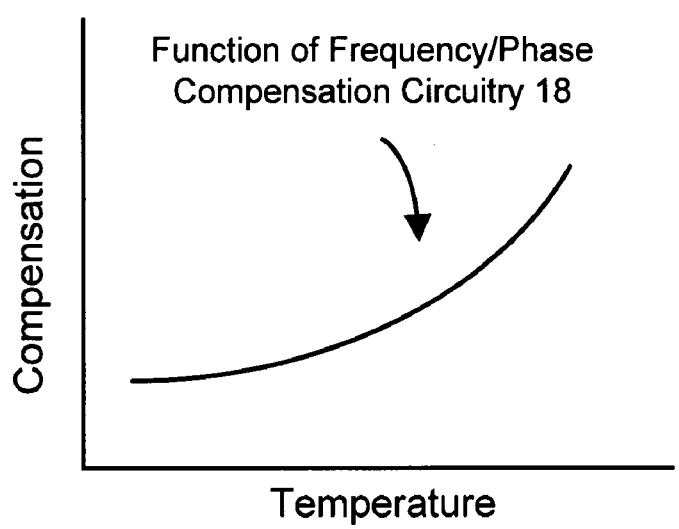
Figure 4C:
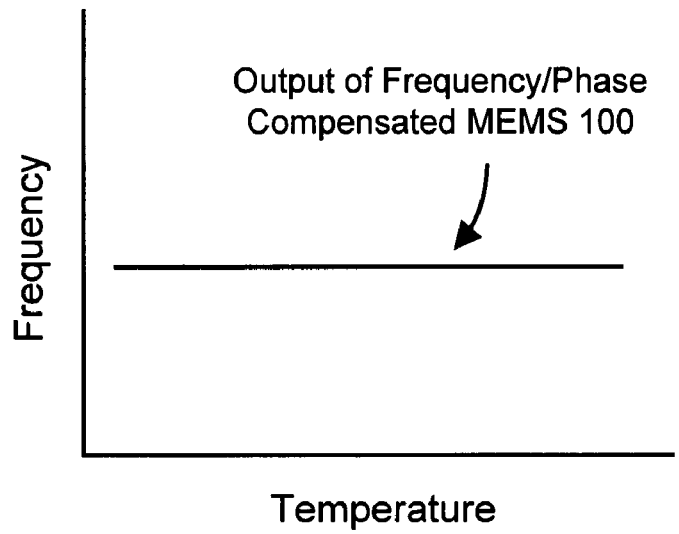
Figure 5A:
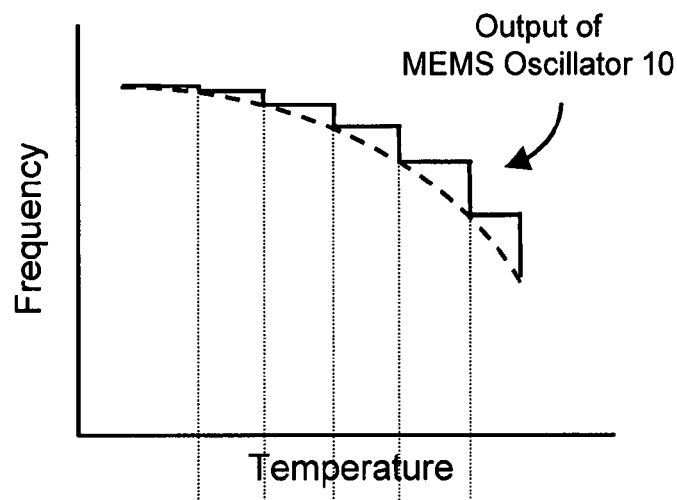
Figure 5B:
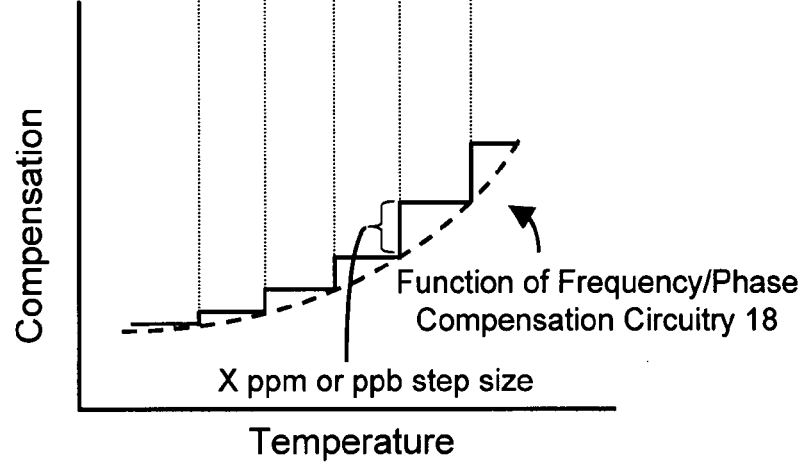
Figure 5C:
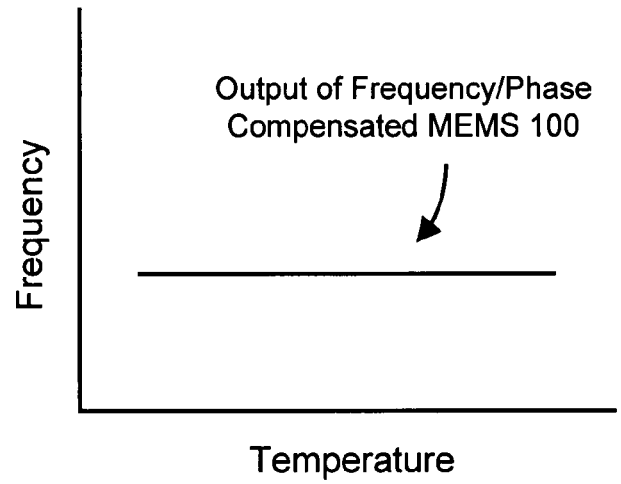
Figure 7A:
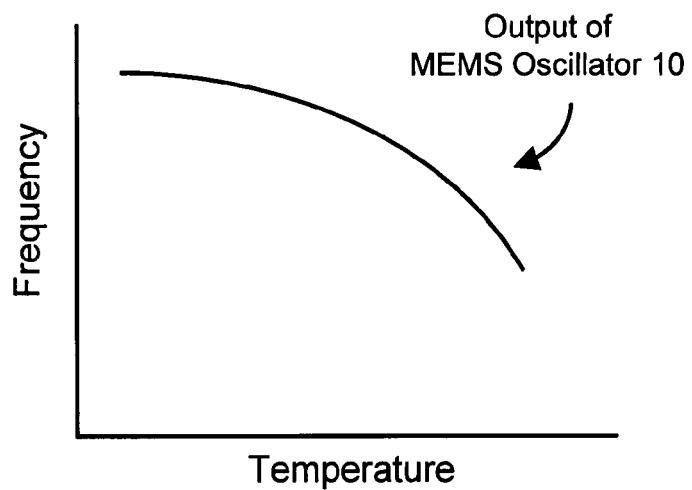
Figure 7B:
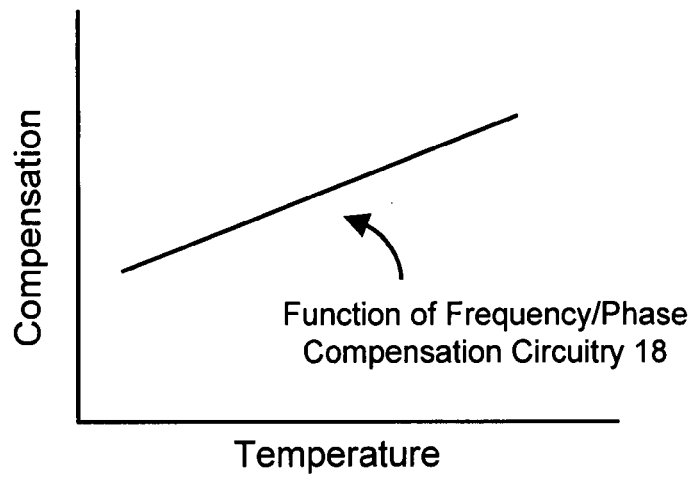
Figure 7C:
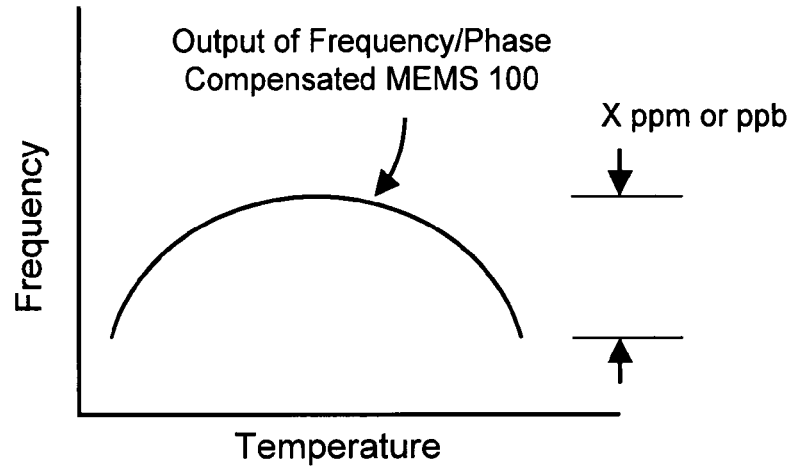
Figure 8A:
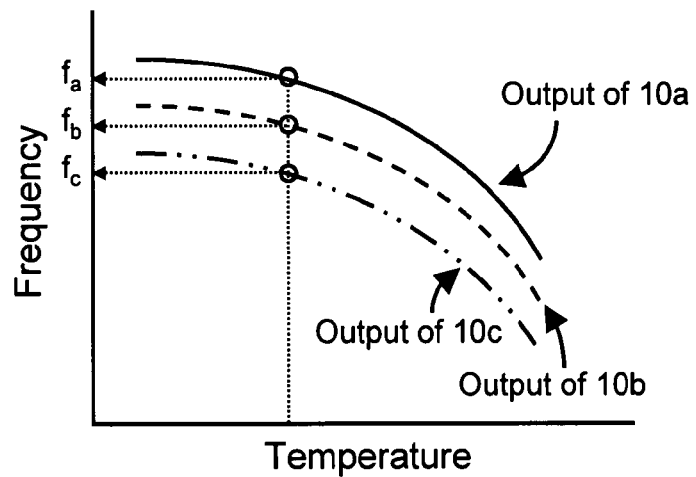
Figure 8B:
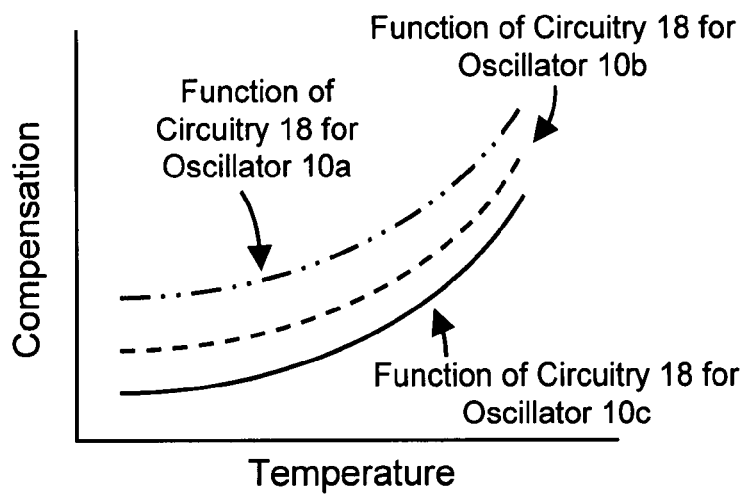
Figure 8C:
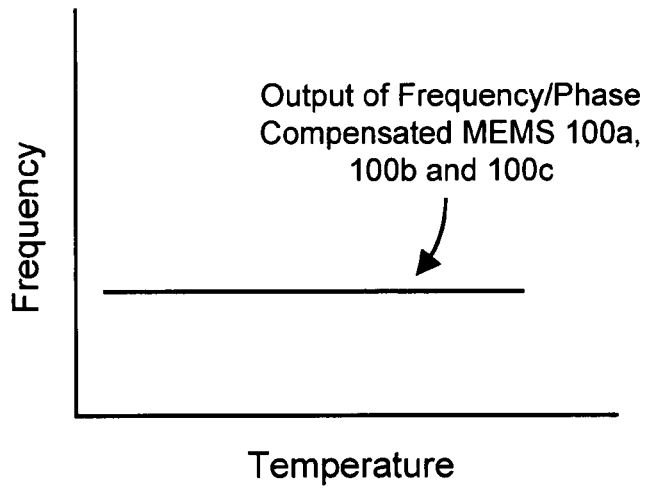

Notably, FIGS. 5B and 6B include a more granular frequency compensation by circuitry 18 than that illustrated in FIGS. 4B, 7B, and 8B. Further, the function of compensation circuitry 18 (see, for example, FIGS. 6B and 7B) may be designed to provide a particular output signal characteristic that, while not constant or "flat" over temperature (see, for example, FIGS. 6C and 7C), are within a desired and/or predetermined specification that is acceptable and/or suitable. In this regard, the function of compensation circuitry 18 does not fully or completely compensate but the amount of "deviation" is or may be within an acceptable, predetermined and/or specified limits. (See, FIGS. 6C and 7C).

In addition, with reference to FIG. 5A, the frequency of the output signal MEMS oscillator 10 over temperature may have a discontinuous relationship. In this embodiment, MEMS resonator 10 may be partially compensated and/or designed for temperature variations. As such, in the embodiment of FIGS. 5A-5C, MEMS oscillator 10 and compensation circuitry 18 each partially compensate and/or contribute to the compensation over a range of temperatures and/or for a predetermined temperature. The characteristics of the output signal of MEMS oscillator 10 over temperature or a narrow and/or discrete range of temperatures may be determined using well-known mathematical modeling techniques (based on, for example, expected or predetermined frequency response over temperature based on the relationship to a given/particular oscillator design and/or material). Those characteristics may also be determined using empirical and/or actual data or measurements. The empirical data may be employed to extrapolate and/or determine a function or relationship of output frequency versus temperature. The relationship may be determined for one, some or all devices. Alternatively, a relationship may be determined for one or more MEMS oscillators 10 and then employed for all "similar" MEMS oscillators (for example, all MEMS oscillators derived from a given fabrication "lot" or "lots", i.e., devices from the same wafer(s)).

The frequency of the output signal of MEMS oscillator 10 depends, to some extent, on the manufacturing variances of the fabrication processes as well as materials. Accordingly, while MEMS oscillators 10a, 10b and 10c may be fabricated using the same techniques, the frequencies may vary (see, FIG. 8A). Notably, these variations may have a significant impact when the MEMS oscillators implemented in a given system.

In certain embodiments of the present invention, the "initial" frequency of the output signal (i.e., $f_a$, $f_b$, $f_c$) of MEMS oscillators 10a, 10b, and 10c may be measured and thereafter, the function of compensation circuitry 18 may be determined, set and/or programmed (see, FIG. 8B). In this regard, the initial frequency may be the frequency of MEMS oscillator 10 at a given or particular temperature (for example, room temperature or an anticipated operating temperature). The "initial" frequency of MEMS oscillator 10 may be measured, sampled, sensed before and/or after packaging or integration/incorporation. The MEMS oscillator 10 may also be calibrated at more than one operating condition (for example, one temperature).

In these embodiments, the initial frequency of the output signal of MEMS oscillators 10a, 10b, and 10c may be employed to calculate and/or determine the parameters, references (for example, frequency and/or phase), values and/or coefficients of compensation circuitry 18a, 18b, and 18c (respectively). In this way, the function of compensation circuitry 18a, 18b and 18c may differ to address and/or compensate the particular characteristics of the output signal of MEMS oscillators 10a, 10b, and 10c (see, FIG. 8B). As such, MEMS oscillator 100a, 100b, and 100c (respectively), regardless of differences of the initial frequency of the output signal of MEMS oscillators 10a, 10b, and 10c, generate and/or provides an output signal having the desired, selected and/or predetermined characteristics (for example, desired, selected and/or predetermined frequency and/or phase) at a given, predetermined or particular frequency and/or temperature (or range of frequencies and/or temperatures) (see, FIG. 8C).

Notably, however, in certain embodiments, no calibration of MEMS oscillator 10 is performed and any adjustment to the characteristics of the output signal of compensated MEMS 100 (due to the absence of calibration of MEMS oscillator 10) may be addressed by compensation and control circuitry 16 (and/or compensation circuitry 18). In this embodiment, it may be advantageous to employ a topology that provides a range of programmability to account or compensate for variations/differences in the characteristics of the output signal of MEMS oscillator 10 (for example, the initial frequency of MEMS oscillator 10).

While FIGS. 4A-4C, 5A-5C, 6A-6C, 7A-7C and 8A-8C illustrate frequency relationships, phase relationships are similar and/or mathematically related to the frequency relationships. Accordingly, such FIGURES imply phase and/or phase relationships may be extracted or determined therefrom.

Figure 9A:
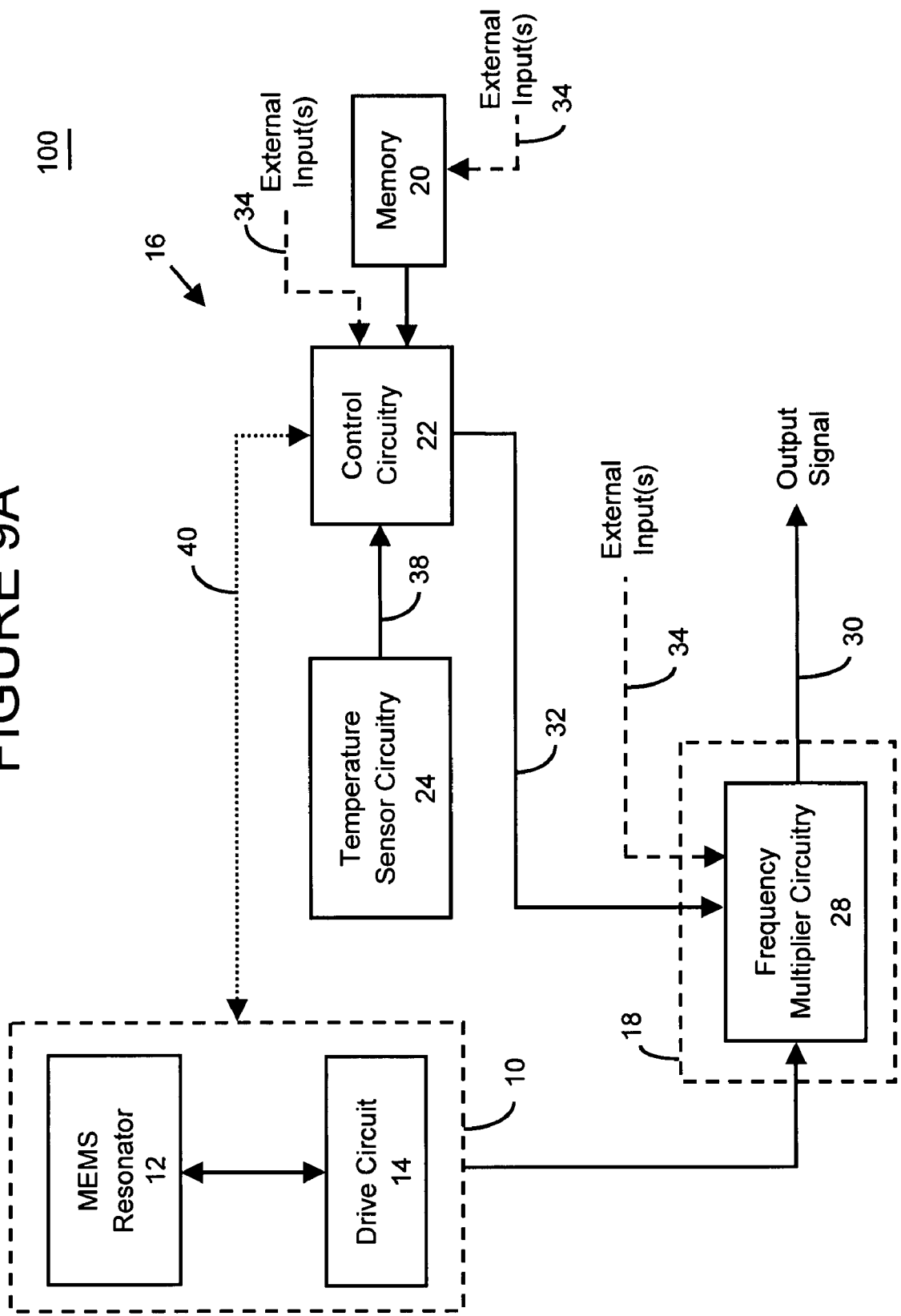

With reference to FIG. 9A, in one embodiment, frequency/phase compensated MEMS oscillator 100 includes MEMS oscillator 10 and compensation and control circuitry 16. The output signal of MEMS oscillator 10 is provided to compensation circuitry 18. The MEMS oscillator 10 may include a one or more output signals (on one or more signal lines) to, for example, provide or transmit a single ended signal and/or a differential signal pair. As such, MEMS oscillator 10 may provide one or more signals, including, for example, differential signals.

In this embodiment, the output signal of MEMS oscillator 10 is provided as an input to frequency multiplier circuitry 28. The frequency multiplier circuitry 28 is employed to controllably increase the frequency of the output of MEMS oscillator 10. For example, this embodiment of the present invention may be employed to provide a highly controllable, programmable, definable, selectable and/or accurate output signal having a stable moderate frequency (for example, 1-100 MHz) or a stable high frequency (for example, 1-10 GHz).

In one embodiment, frequency multiplier circuitry 28 includes one or more FLL(s), PLL(s), DLL(s) and/or digital/frequency synthesizers (for example, numerically controlled oscillators). The frequency multiplier circuitry 28 of this embodiment receive the analog output of MEMS oscillator 10. The FLL(s), PLL(s), DLL(s) and/or digital/frequency synthesizer(s) may be cascaded in series so that a particular, precise and/or selectable frequency and phase are obtained. Notably, the operation and implementation of FLL(s), PLL (s), DLL(s), and/or digital/frequency synthesizer(s) (for example, DDS(s)) are well known to those skilled in the art. Any FLL, PLL, DLL and/or digital/frequency synthesizers, as well as configuration thereof or alternatives therefor, whether now known or later developed, is intended to fall within the scope of the present invention.

Notably, it may be advantageous to employ a fractional-N PLL to generate and/or output a precise and controllable frequency or range of frequencies. Such fractional-N PLLs tend to include a sigma-delta modulator or divider, or a digital to analog converter ramp. In this way, frequency multiplier circuitry 28 may be programmed and/or controlled to provide a precise frequency or frequency range. For example, the fractional-N PLL may be (or similar to) SA8028 or AN10140, both of Philips Semiconductors (The Netherlands), CX72300 from Skyworks Solutions Inc. (Newport Beach, Calif.), and KR-SDS-32, KR-SHDS-32, and KR-SDS45-ST6G all from Kaben Research Inc. (Ontario, Canada). These exemplary fractional-N PLLs provide a finely controlled and selectable resolution of the output frequency. Notably, the implementation and operation of fractional-N PLL(s) are described in detail in application notes, technical/journal articles and data sheets.

Furthermore, it may be advantageous to employ a digital/frequency synthesizer (for example, a DDS and/or numerically controlled oscillator) to generate and/or output a precise and controllable frequency or range of frequencies. For example, the digital/frequency synthesizer may be (or similar to) STEL-1172, STEL-1175 and/or STEL-1178A, all from Intel Corporation (Santa Clara, Calif.), and/or AD9954 from Analog Devices, Inc. (Norwood, Mass.). All the implementation and operation of the digital/frequency synthesizers (for example, DDSs) are described in detail in application notes, technical/journal articles and data sheets.

With continued reference to FIG. 9A, as mentioned above, control circuitry 22 may provide, calculate and/or determine the parameters, references, values and/or coefficients necessary for frequency multiplier circuitry 28 (for example, parameters and/or coefficients for the fractional-N PLL or DDS) to adjust, correct and/or control the frequency and/or phase of output signal 30 of compensation circuitry 18. In this way, the output signal(s) on signal line 30 contain and/or possess suitable, desired, predetermined attributes and/or characteristics (for example, frequency, phase, jitter, duty cycle, locking/response time, noise rejection and/or noise immunity). For example, where a fractional-N PLL is employed, control circuitry 22 may provide the data of the integer value for the pre-divider M and/or the values for the fractional divider N to frequency multiplier circuitry 28 via data/control signal lines 32.

The control circuitry 22 may include a microprocessor(s) and/or controller(s) that is/are appropriately programmed to perform the functions and/or operations described herein. For example, in one embodiment, a microprocessor and/or controller may perform the functions and/or operations of calculating the parameters, references, values and/or coefficients employed by compensation circuitry 18 to generate and/or provide an output signal(s) having accurate, suitable, desired and/or predetermined characteristics (for example, signals having the desired, suitable and/or predetermined frequency and/or phase). All configurations and techniques of calculating the parameters, references, values and/or coefficients employed by compensation circuitry 18, whether now known or later developed, are intended to be within the scope of the present invention.

Notably, control circuitry 22 may include a state machine (in lieu of, or, in addition to a microprocessor and/or controller). That is, the functions and/or operations described herein may be executed and/or implemented by a state machine circuitry(s) either alone or in combination with a processor and/or controller. The state machine may be fixed, microcoded and/or programmable.

The parameters, references, values and/or coefficients employed by control circuitry 22 to set, program and/or control frequency multiplier circuitry 28 may be externally provided to control circuitry 22 either before or during operation of compensated MEMS oscillator 100. In this regard, as mentioned above, a user/operator or external circuitry/devices/systems may provide information representative of the parameters, references, values and/or coefficients, via data signal lines 34, to set, change, enhance and/or optimize the characteristics of the output signal(s) on signal line 30. Such information may be provided directly to control circuitry 22 or to memory 20 to be used by control circuitry 22.

The parameters, references, values and/or coefficients may also be pre-programmed, for example, by permanently, semi-permanently or temporarily stored in memory 20. The information may be stored or programmed in memory 20 during fabrication, test, calibration and/or operation. In this way, control circuitry 22 may access memory 20 to retrieve the necessary information during start-up/power-up, initialization, re-initialization and/or during normal operation of frequency multiplier circuitry 28.

With continued reference to FIG. 9A, compensated MEMS oscillator 100 of this embodiment further includes temperature sensor circuitry 24. The temperature sensor circuitry 24, in one embodiment, receives data (current or voltage, in analog or digital form), on temperature data lines 36, from one or more temperature sensors (not illustrated). In response, temperature sensor circuitry 24 determines and/or calculates the operating temperature of MEMS oscillator 10. The temperature sensor circuitry 24 provides the information to control circuitry 22, via signal lines 38.

The control circuitry 22, in response, may determine or calculate new parameters, references, values and/or coefficients (i.e., absolute information), or adjustment to the existing or "current" parameters, references, values and/or coefficients (i.e., relative information) to address and/or compensate for the change in temperature. In this regard, control circuitry 22 may determine that the calculated operating temperature of MEMS oscillator 10 requires adjustment to the existing or "current" parameters, references, values and/or coefficients (i.e., relative information) to address and/or compensate for the change in temperature. Accordingly, control circuitry 22 may determine or calculate new parameters, references, values and/or coefficients (i.e., absolute information), or adjustment to the existing or "current" parameters, references, values and/or coefficients and provide that data to frequency multiplier 28 via data/control signal lines 32.

In addition, or in lieu thereof, control circuitry 22 may adjust the operation of MEMS oscillator 10 in accordance with changes in the operating conditions and/or environment of frequency/phase compensated MEMS oscillator 100, or parts thereof (for example, MEMS oscillator 10 and/or compensation circuitry 18). For example, control circuitry 22 may employ the data from temperature sensor circuitry 24 to control the frequency of the output of MEMS oscillator 10 and, in particular, MEMS resonator 10 and/or drive circuit 14, via control line 40. As mentioned above, by controlling drive circuit 18 the operation and/or performance of MEMS resonator 12 may be adjusted accordingly. In this way, the output signal of MEMS oscillator 10 may be adjusted, corrected and/or controlled to accommodate and/or compensate for changes in the operating conditions and/or environment. The control circuitry 22, in one embodiment, employs a look-up table and/or a predetermined or mathematical relationship to adjust and/or control the operation of MEMS oscillator 10 to compensate and/or correct for changes in ambient temperature (i.e., the temperature of MEMS oscillator 10).

Notably, the temperature sensors may be, for example, diode(s), transistor(s), resistor(s) or varistor(s), one or more MEMS structures, and/or other well-known temperature sensing circuits, which are disposed and/or located on or in the substrate of MEMS oscillator 10 and/or compensation circuitry 18. As discussed in more detail below, the temperature sensors may be integrated into the substrate of MEMS oscillator 10 and/or the substrate of compensation circuitry 18 (in those instances where MEMS oscillator 10 and compensation circuitry 18 are located on or in discrete substrates) to sense, sample and/or detect the temperature of various, significant and/or critical portions of MEMS resonator 12 and/or compensation circuitry 18. Alternatively, or in addition to, temperature sensors may be discrete devices positioned and/or located above and/or below MEMS oscillator 10 and, in particular, MEMS resonator 12 (for example, as part of (or integrated into) compensation and control circuitry 16 in a hybrid integrated or flip-chip packaging configuration (see, FIGS. 17B and 17C, respectively), which is discussed below.

Figure 9B:
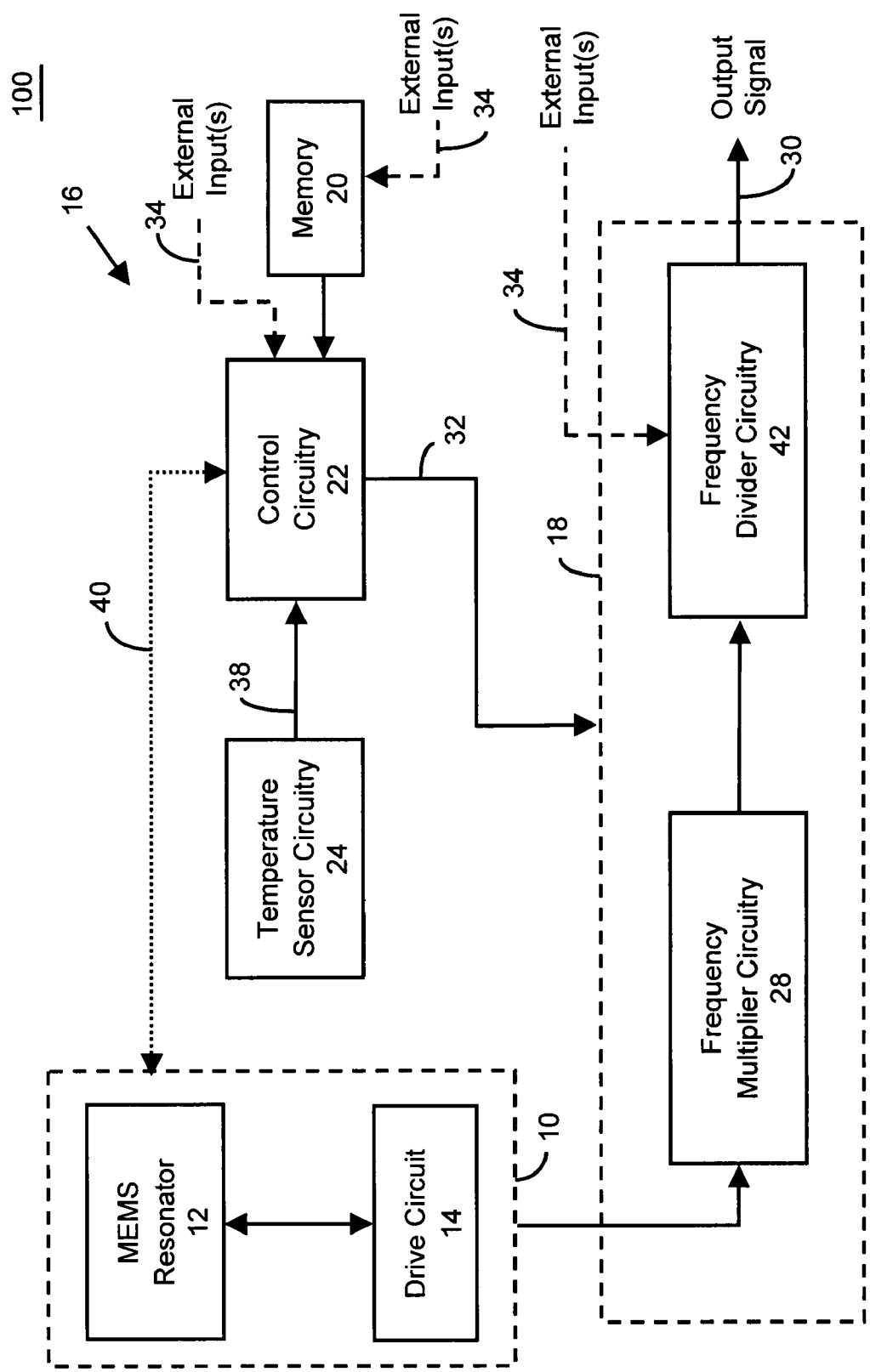

With reference to FIG. 9B, in another embodiment, compensation circuitry 18 may also include frequency divider circuitry 42. This embodiment provides the flexibility to provide a signal(s) having a wide range of output frequencies after fabrication, test, and/or calibration and/or during operation. In this regard, compensated MEMS 100 of FIG. 9B may generate or provide an output signal having a stable and precise higher or lower frequency than the frequency of the output of MEMS oscillator 10. For example, in this embodiment, the present invention may be employed to provide a highly controllable, programmable, definable, selectable and/or accurate output signal having a stable low frequency (for example, 1 Hz-1 MHz) or a stable moderate frequency (for example, 1-1 GHz) or a higher frequency (for example, 1-10 GHz). That is, the "post" frequency divider circuitry 42 may be employed to divide or reduce a relatively high and stable frequency output by the frequency multiplier circuitry 28 to relatively lower stable frequencies of, for example, 1 Hz-10 MHz.

Notably, certain PLLs may output more precise/stable signals (for example, a more precise/stable frequency, phase, jitter, duty cycle, locking/response time, noise rejection and/or noise immunity) at higher frequencies (for example, 1-2 GHz) when compared to lower frequencies (for example, 10-50 MHz). As such, in this embodiment, the output of frequency multiplier circuitry 28 may be provided to frequency divider circuitry 42 which divides the precise/stable signal(s) at the higher frequencies (for example, 1-2 GHz) to a precise/stable signals having lower frequencies (for example, 1 Hz-50 MHz). In this way, the characteristics of the output signal of compensation circuitry 18 may be enhanced and/or optimized for a particular application (after fabrication, test, and/or calibration and/or during operation) by controlling, adjusting and/or programming frequency multiplier circuitry 28 and/or frequency divider circuitry 42.

The frequency divider circuitry 42 may include one or more PLLs, DLLs, digital/frequency synthesizers and/or FLLs. The division may be in fine or coarse increments. The PLLs, DLLs and/or FLLs may be cascaded in series so that a particular, precise, stable and/or selectable frequency and phase are obtained. For example, compensation circuitry 18 may include an integer or a fractional-N PLL (or a precisely controllable DLL, fine-fractional-N DLL or fractional-N DLL (hereinafter collectively "fractional-N DLL")), or combinations thereof, to precisely select, control and/or set the output signal of compensated MEMS oscillator 100. In this regard, the output of MEMS oscillator 10 is provided to the input of the fractional-N PLL or fractional-N DLL, which may be pre-set, pre-programmed and/or programmable to provide an output signal having a precise and/or stable frequency that is lower than the output signal of MEMS 10.

Figure 9C:
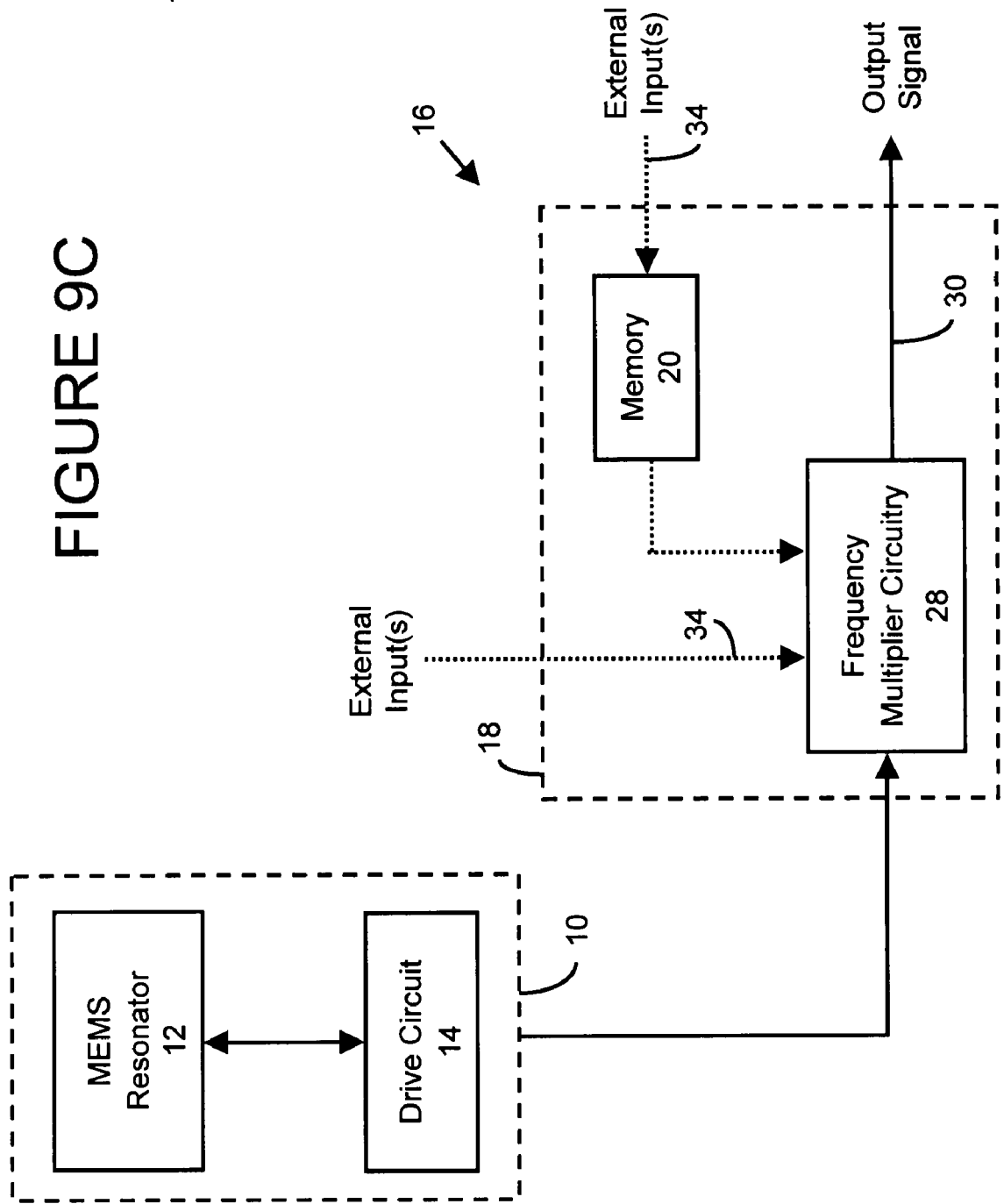

The parameters, references, values and/or coefficients employed in frequency multiplier circuitry 28 may be provided by control circuitry 22 (see, for example, FIGS. 9A and 9B) and/or externally or via memory 20 (see, for example, FIG. 9C). These parameters, references, values and/or coefficients may be provided either before or during operation of compensated MEMS oscillator 100. In this regard, as mentioned above, a user/operator or external circuitry/devices/systems may provide information representative of the parameters, references, values and/or coefficients, via data signal lines 34, to set, change, and/or program frequency multiplier circuitry 28. Indeed, in all of the embodiments describing and illustrating the present invention, the parameters, references (for example, frequency and/or phase), values and/or coefficients may be provided directly to circuitry comprising compensation circuitry 18 in lieu of (or in addition to) control circuitry 22.

Notably, with reference to FIG. 9D, frequency multiplier circuitry 28 may be configured to output a plurality of signals, each having desired, selected and/or predetermined characteristics (for example, frequency and/or phase). In this embodiment, frequency/phase compensated MEMS oscillator 100 provides and/or generates a number of precise, stable and controllable output signals using the output of MEMS oscillator 10. For example, each output of frequency multiplier circuitry 28 may be a predetermined frequency (for example, 2.5×, 10×, 12.34× or 23.4567× the frequency of the output signal of MEMS oscillator 10) as well as a desired, selected and/or predetermined phase relationship relative to the other output signals (for example, 0°, 45°, 90° and/or 180°). Indeed, the frequency and/or phase relationship may be programmable (for example, via an operator, external device or control circuitry 22) during, for example, fabrication, test, and calibration and/or during normal operation. Notably, the plurality of outputs may be generated by the same or separate or different frequency multiplier circuitry 28.

Figure 10A:
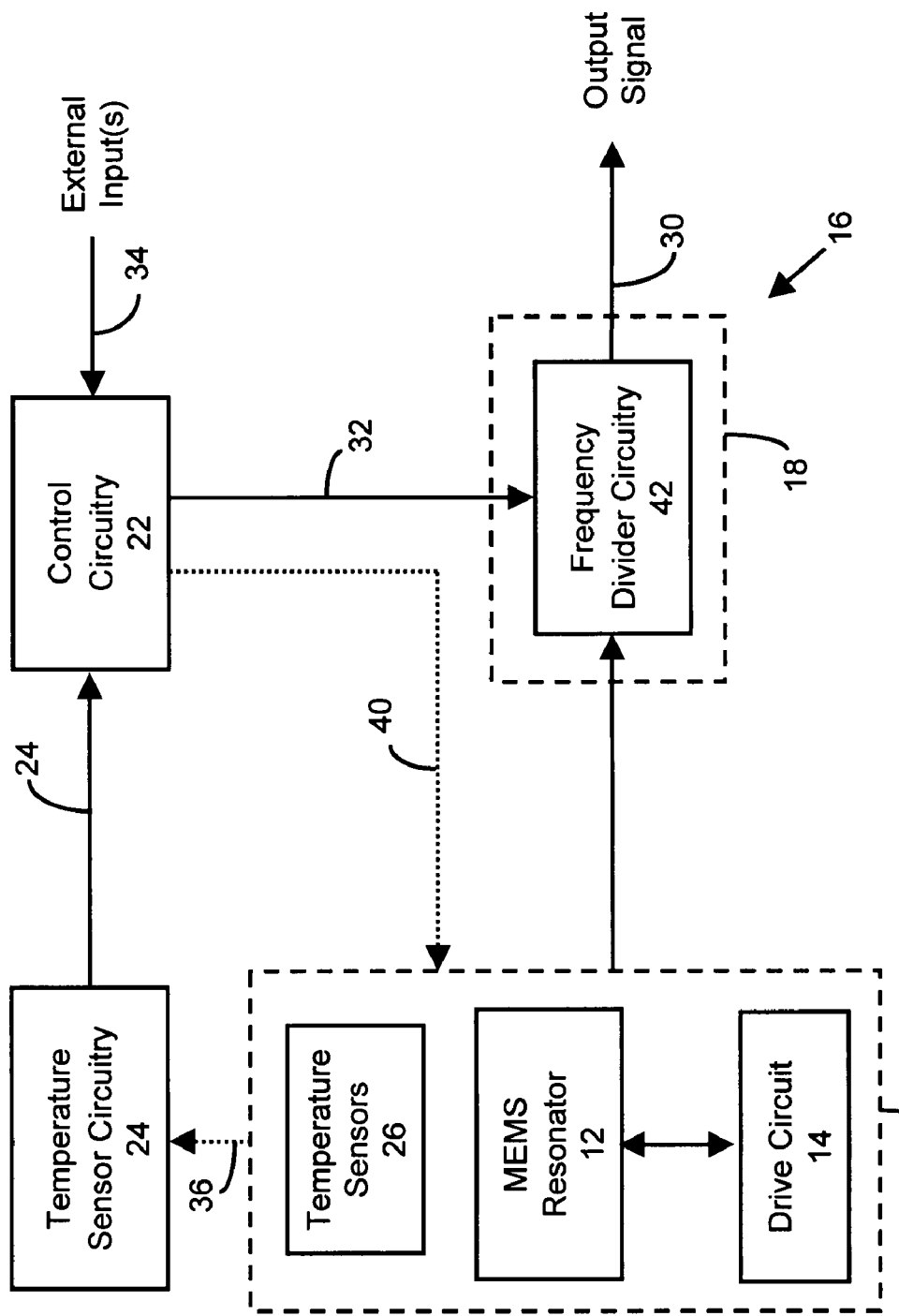
FIGS. 10A-10D illustrate detailed block diagrams of MEMS oscillators, including frequency divider circuitry, according to certain other aspects of the present inventions.
Figure 10B:
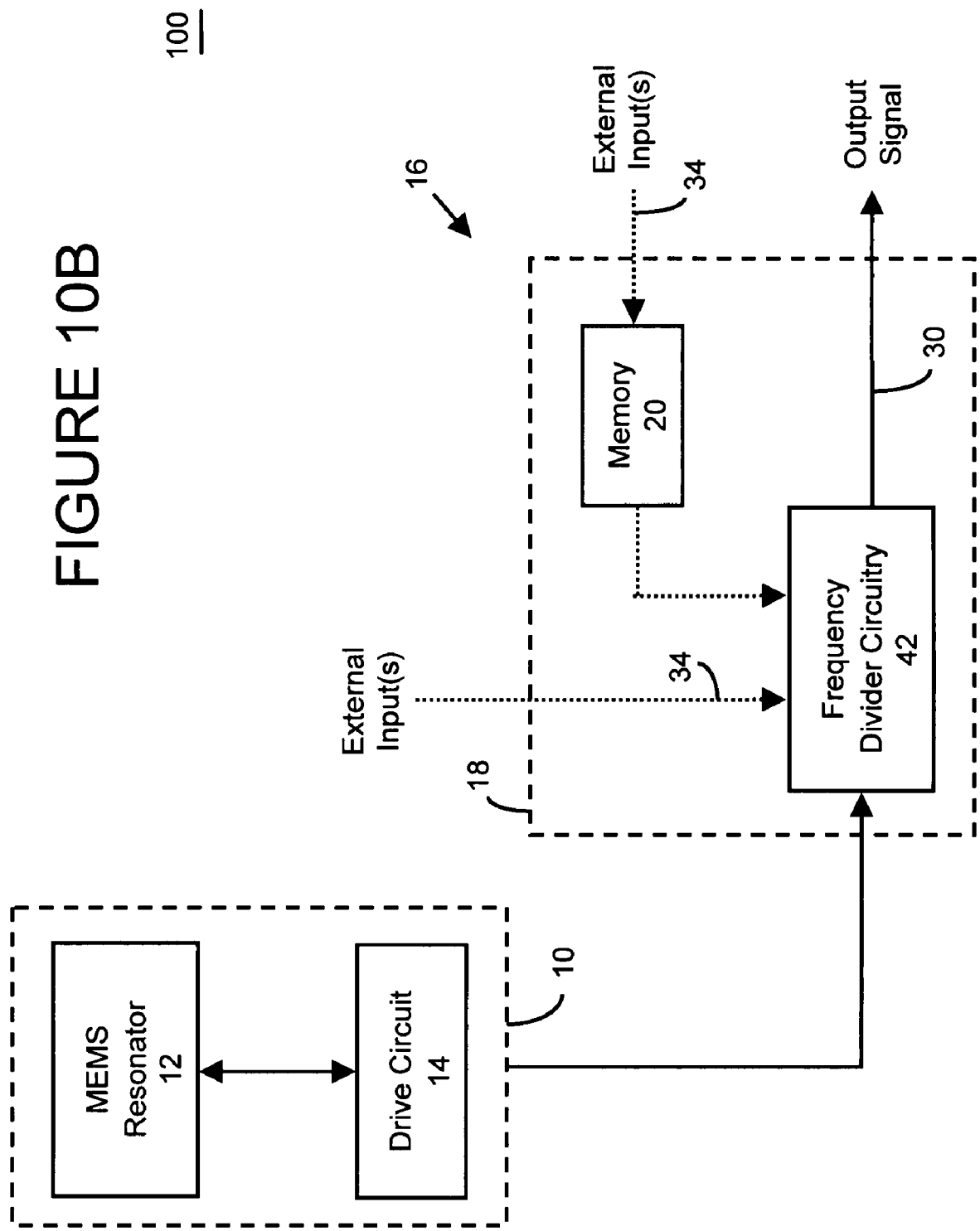

With reference to FIGS. 10A and 10B, in another embodiment of the present invention, compensation circuitry 18 consists of frequency divider circuitry 42. In this regard, compensation circuitry 18 divides the frequency of the output signal of MEMS oscillator 10 to a precise and/or stable frequency that is lower than the frequency of the output signal of MEMS oscillator 10. As mentioned above, frequency divider circuitry 42 may include one or more PLLs, DLLs, digital/frequency synthesizers (for example, DDSs) and/or FLLs. The division may be in fine or coarse increments. The PLLs, DLLs and/or FLLs may be cascaded in series so that a particular, precise, stable and/or selectable frequency and phase are obtained. The characteristics of the output signal of compensated MEMS 100 may be precise and/or stable over a short period of time (for example, over 1-10 microseconds, 1-60 seconds or 1-10 minutes) or an extended period of time (for example, over 1-10 hours, 1-10 days or a month).

Figure 10C:
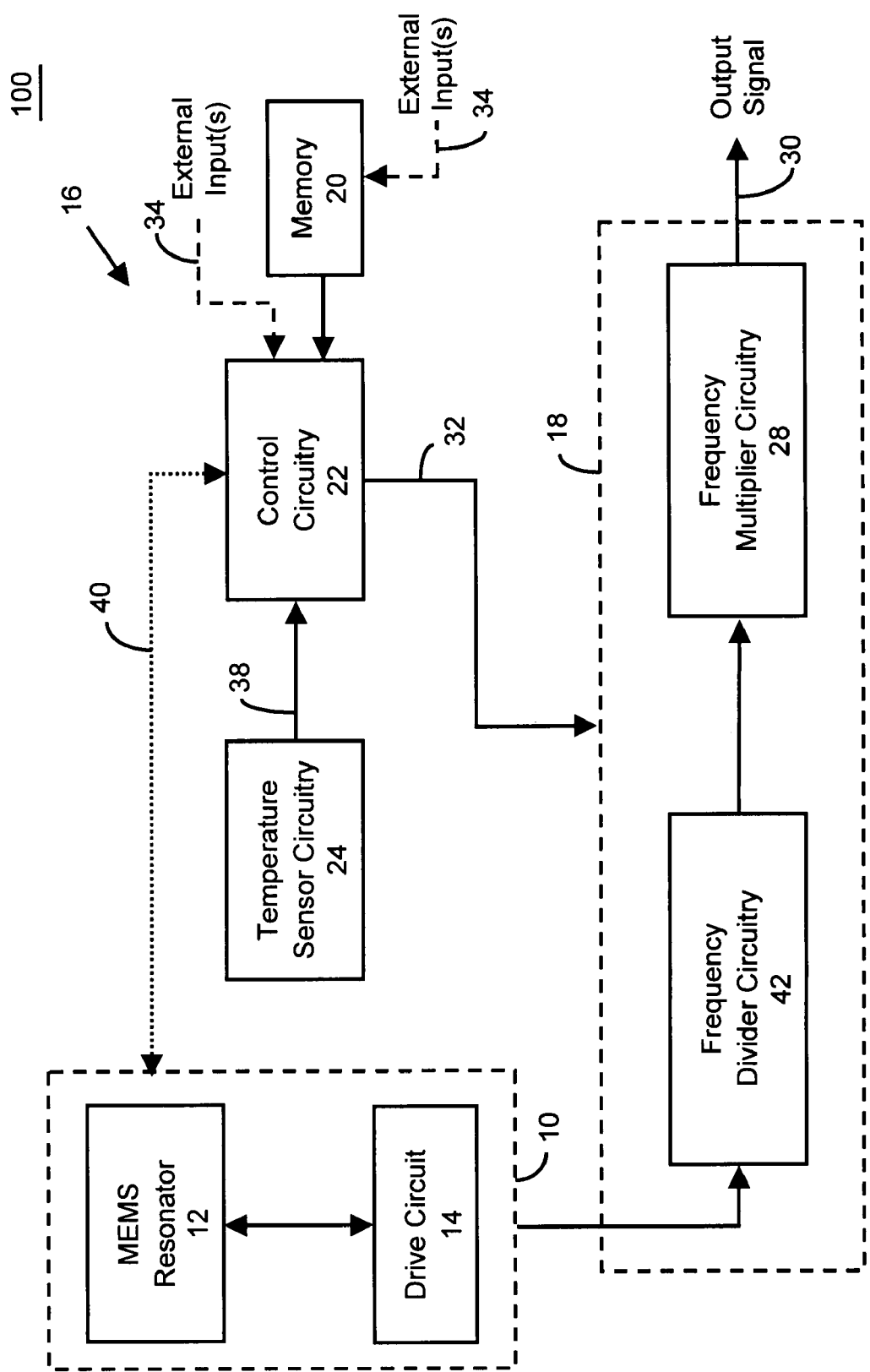

With reference to FIG. 10C, in another embodiment, compensation circuitry 18 may also include frequency multiplier circuitry 28. Similar to the embodiment of FIG. 9B, this embodiment provides the flexibility to provide a signal(s) having a wide range of output frequencies after fabrication, test, and/or calibration and/or during operation. In this regard, compensated MEMS 100 of FIG. 10C may generate or provide an output signal having a stable and precise higher or lower frequency than the frequency of the output of MEMS oscillator 10. For example, in this embodiment, the "post" frequency multiplier circuitry 28 may be employed to multiply or increase a relatively low and stable frequency output by the frequency divider circuitry 42 to relatively high stable frequencies of, for example, 1-50 GHz.

Indeed, certain circuitry that may be employed in frequency divider circuitry 42 (for example, certain DLLs) may output more precise/stable signals (for example, a more precise/stable frequency, phase, jitter, duty cycle, locking/response time, noise rejection and/or noise immunity) at higher frequencies (for example, 1-2 GHz) when compared to lower frequencies (for example, 1-50 MHz). As such, in one embodiment, the output of frequency divider circuitry 42 may be provided to frequency multiplier circuitry 28 which multiplies the precise/stable signal(s) at the lower frequencies (for example, 1-50 MHz) to a precise/stable signals having higher frequencies (for example, 1-2 GHz). In this way, the characteristics of the output signal of compensation circuitry 18 may be enhanced and/or optimized for a particular application (after fabrication, test, and/or calibration and/or during operation) by controlling, adjusting and/or programming frequency divider circuitry 42 and/or frequency multiplier circuitry 28.

The frequency multiplier circuitry 28 may include one or more PLLs, DLLs, digital/frequency synthesizers (for example, DDS) and/or FLLs. The multiplication may be in fine or coarse increments. The PLLs, DLLs and/or FLLs may be cascaded in series so that a particular, precise, stable and/or selectable frequency and phase are obtained. For example, compensation circuitry 18 may include an integer or a fractional-N PLL or fractional-N DLL, or combinations thereof, to precisely select, control and/or set the output signal of compensated MEMS oscillator 100. In this regard, the output of MEMS oscillator 10 is provided to the input of the fractional-N PLL or fractional-N DLL, which may be pre-set, pre-programmed and/or programmable to provide an output signal having a precise and/or stable frequency that is lower than the output signal of MEMS 10.

The parameters, references (for example, frequency and/or phase), values and/or coefficients employed in frequency multiplier circuitry 28 may be provided by control circuitry 22 (see, for example, FIGS. 9A and 9B) and/or externally or via memory 20 (see, for example, FIG. 9C). These parameters, references, values and/or coefficients may be provided either before or during operation of compensated MEMS oscillator 100. In this regard, as mentioned above, a user/operator or external circuitry/devices/systems may provide information representative of the parameters, references, values and/or coefficients, via data signal lines 34, to set, change, and/or program frequency multiplier circuitry 28. Indeed, in all of the embodiments describing and illustrating the present invention, the parameters, references, values and/or coefficients may be provided directly to circuitry comprising compensation circuitry 18 in lieu of (or in addition to) control circuitry 22.

Figure 10D:
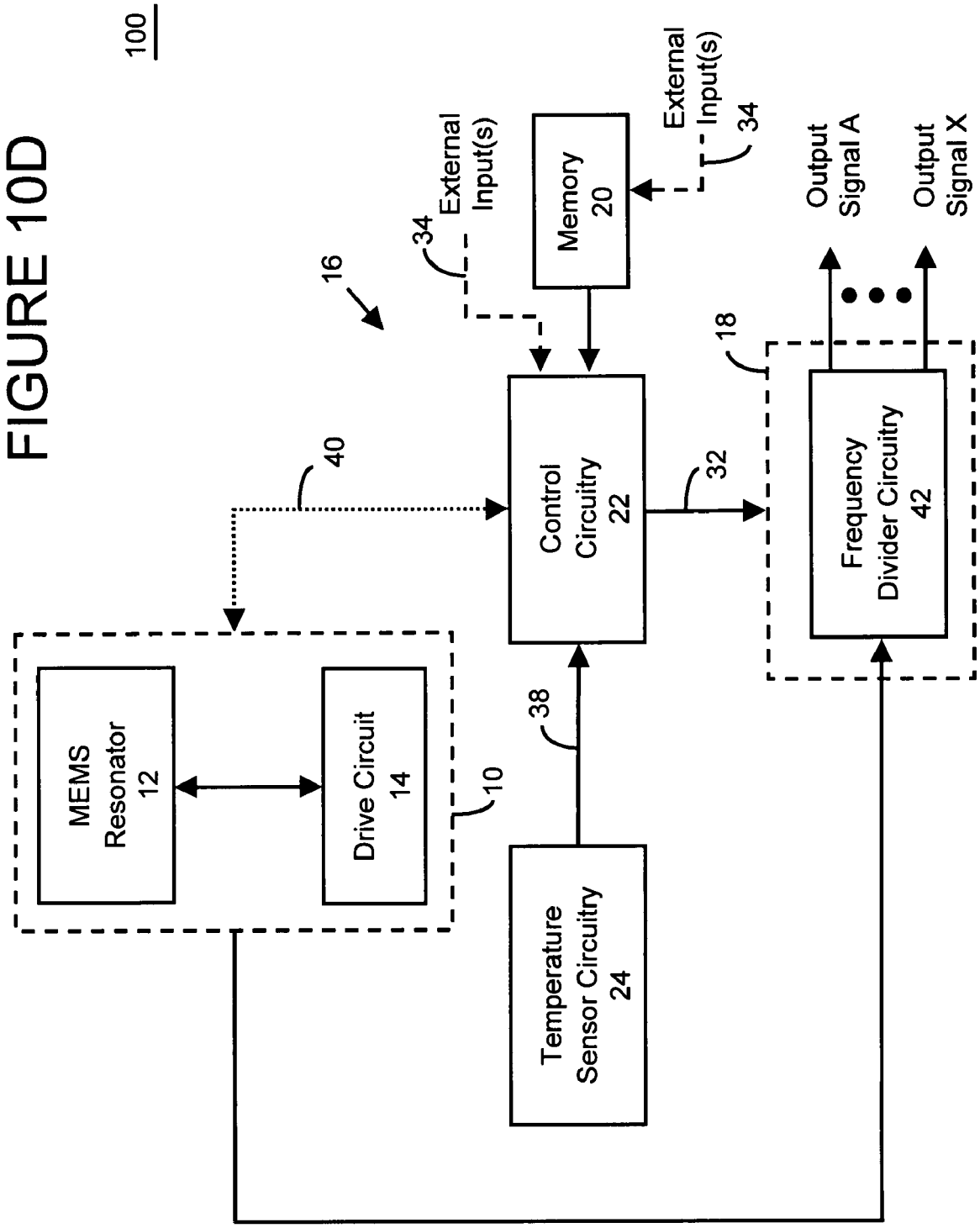
Figure 11A:
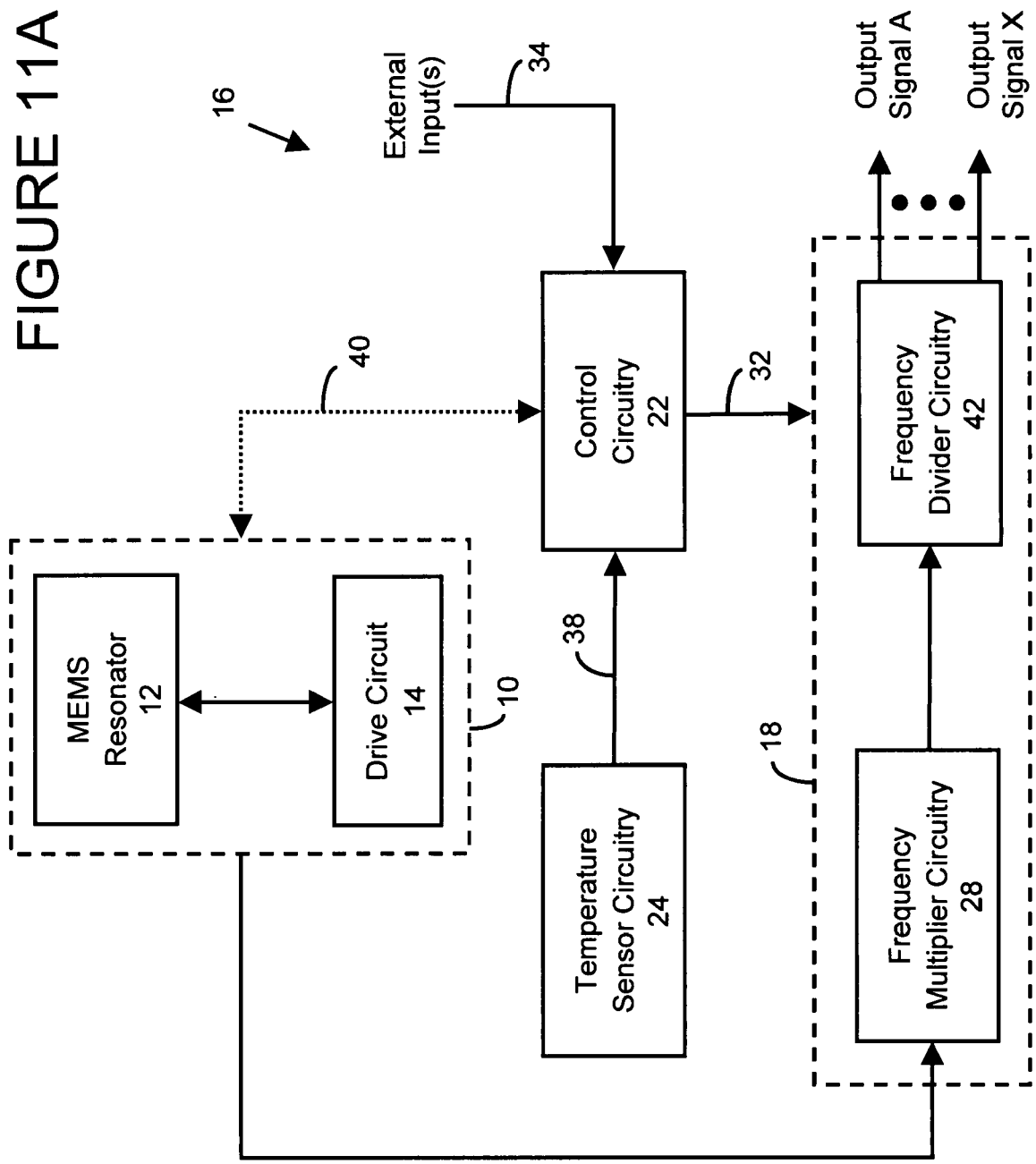
FIGS. 11A and 11B illustrate block diagram representations of a frequency and/or phase compensated MEMS oscillator including a plurality of output signals, according to certain aspects of the present invention.
Figure 11B:
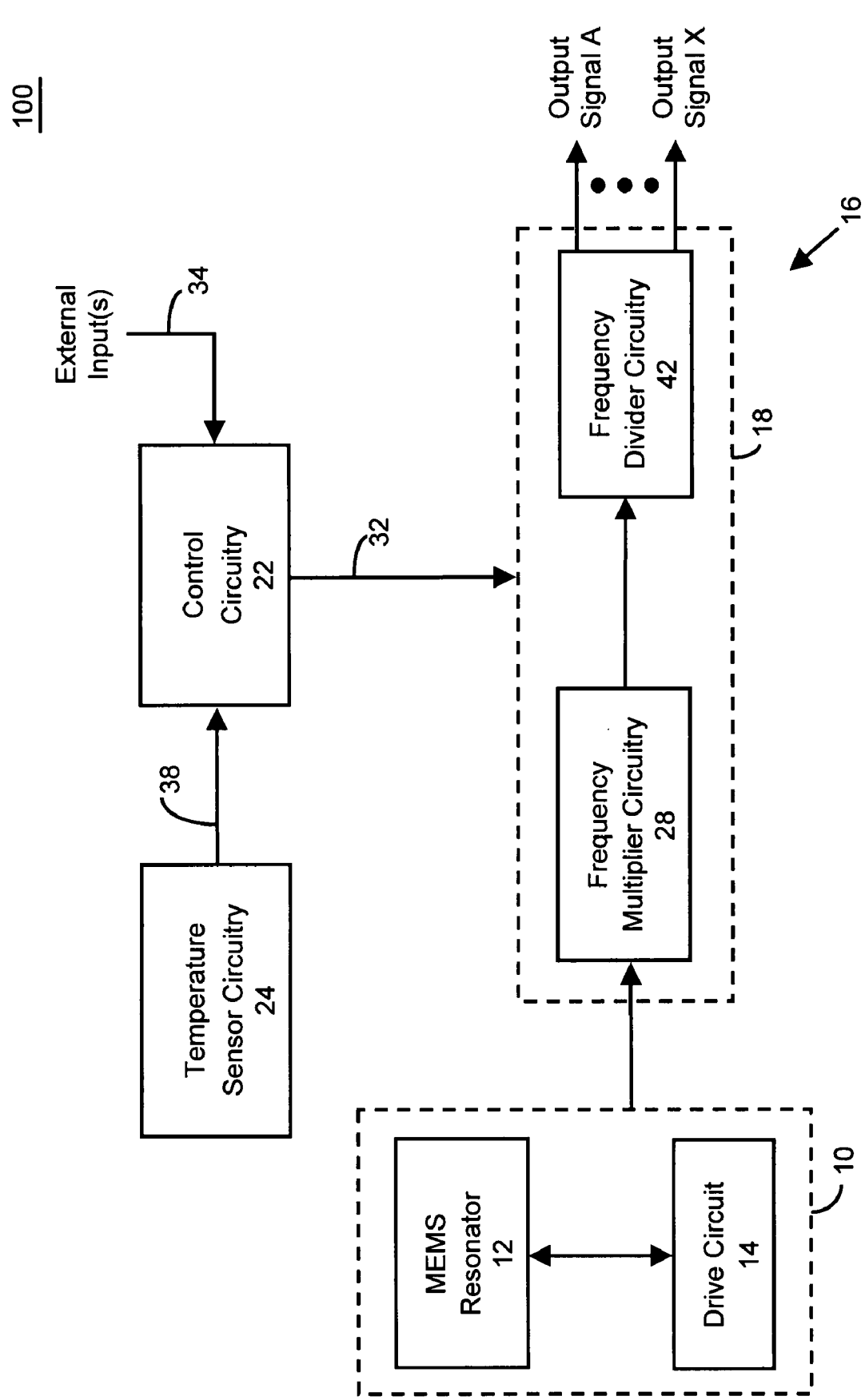
Figure 12B:
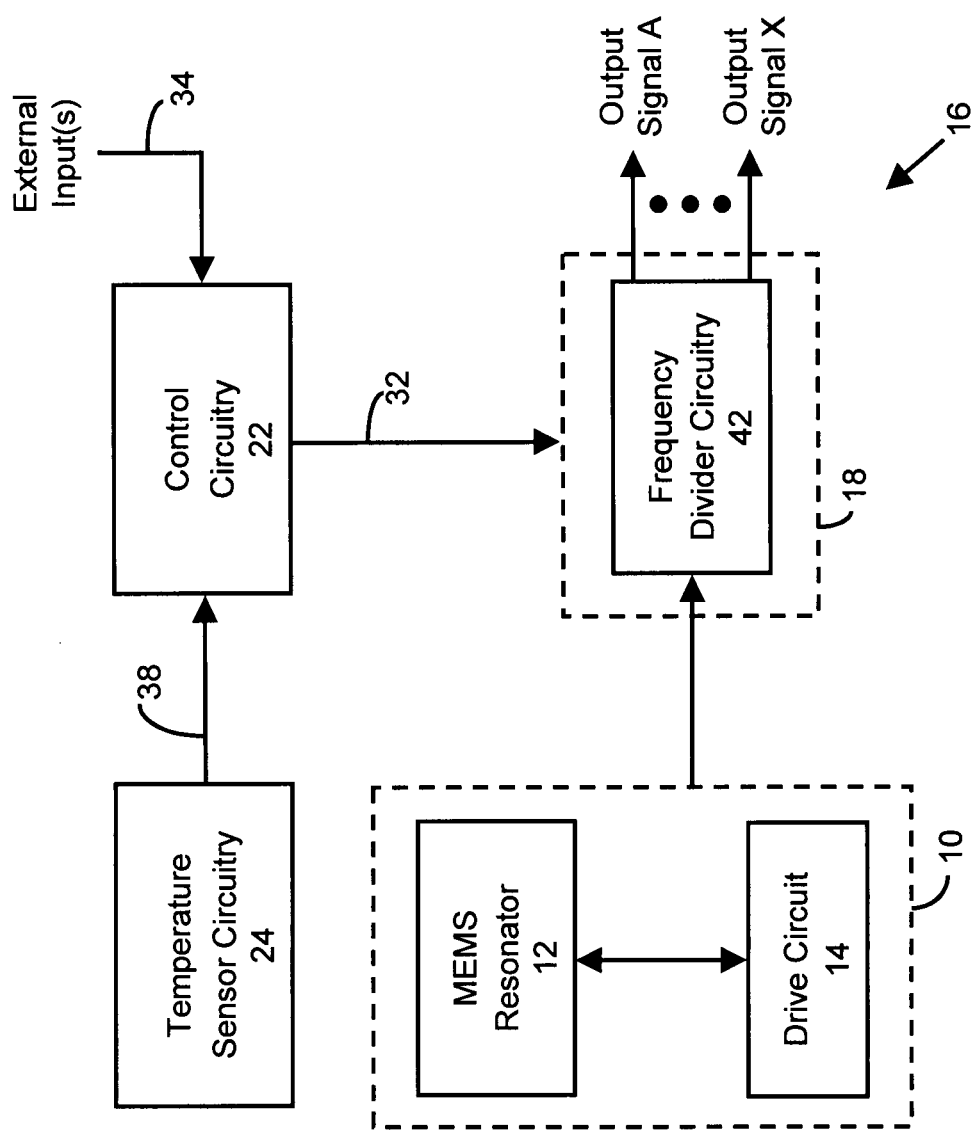

Notably, with reference to FIG. 10D, frequency divider circuitry 42 may be configured to output a plurality of signals, each having desired, selected and/or predetermined characteristics (for example, frequency and/or phase). In this embodiment, frequency/phase compensated MEMS oscillator 100 provides and/or generates a number of precise, stable and controllable output signals using the output of MEMS oscillator 10. For example, each output of frequency divider circuitry 42 may be a predetermined frequency (for example, 1×, 0.5×, 0.25× or 0.23456× the frequency of the output signal of MEMS oscillator 10) as well as a desired, selected and/or predetermined phase relationship relative to the other output signals (for example, 0°, 45°, 90° and/or 180°). Indeed, the frequency and/or phase relationship may be programmable (for example, via an operator, external device or control circuitry 22) during, for example, fabrication, test, and calibration and/or during normal operation. Notably, the plurality of outputs may be generated by the same or separate or different frequency divider circuitry 42.

The parameters, references (for example, frequency and/or phase), values and/or coefficients employed in frequency divider circuitry 42 (and frequency multiplier circuitry 28) may be provided by control circuitry 22 (see, for example, FIG. 10A) and/or externally or via memory 20 (see, for example, FIG. 10B). These parameters, references, values and/or coefficients may be provided either before (for example, fabrication, test, and/or calibration) or during operation of compensated MEMS oscillator 100.

As mentioned above, compensated MEMS oscillator 100 may provide and/or generate a plurality of output signals each having a programmable, precise, stable and/or selectable frequency and/or phase. With reference to FIGS. 11A, 11B, 12A and 12B, in several embodiments, frequency divider circuitry 42 may include one or more PLLs, DLLs, digital/frequency synthesizers (for example, DDSs) and/or FLLs. For example, where frequency divider circuitry 42 employs a DLL, each output signal may be one of the delay points between adjustable delay elements thereby providing a plurality of output signals each having the same (or substantially the same) frequency but a different phase relative to the other output signals.

Further, frequency divider circuitry 42 may be comprised of a plurality of PLLs, DLLs, digital/frequency synthesizers and/or FLLs. In this regard, the PLLs, DLLs, digital/frequency synthesizers and/or FLLs may be configured in parallel to receive the output of MEMS oscillator 10 and to generate and provide a plurality of output signals each having a programmable, precise, stable and/or selectable frequency and/or phase. The particular frequency and/or phase of each output signal may be programmed, set and/or determined by the parameters, references (for example, frequency and/or phase), values and/or coefficients applied and/or employed by frequency divider circuitry 42. For example, in those instances where a plurality of fractional-N PLLs are employed, the parameters, references, values and/or coefficients (for example, data of the integer value for the main and auxiliary divider circuitry and/or the values for the fractional-N divider circuitry) provided to and/or programmed into each fractional-N PLL determines the frequency of the corresponding output signal.

Figure 13B:
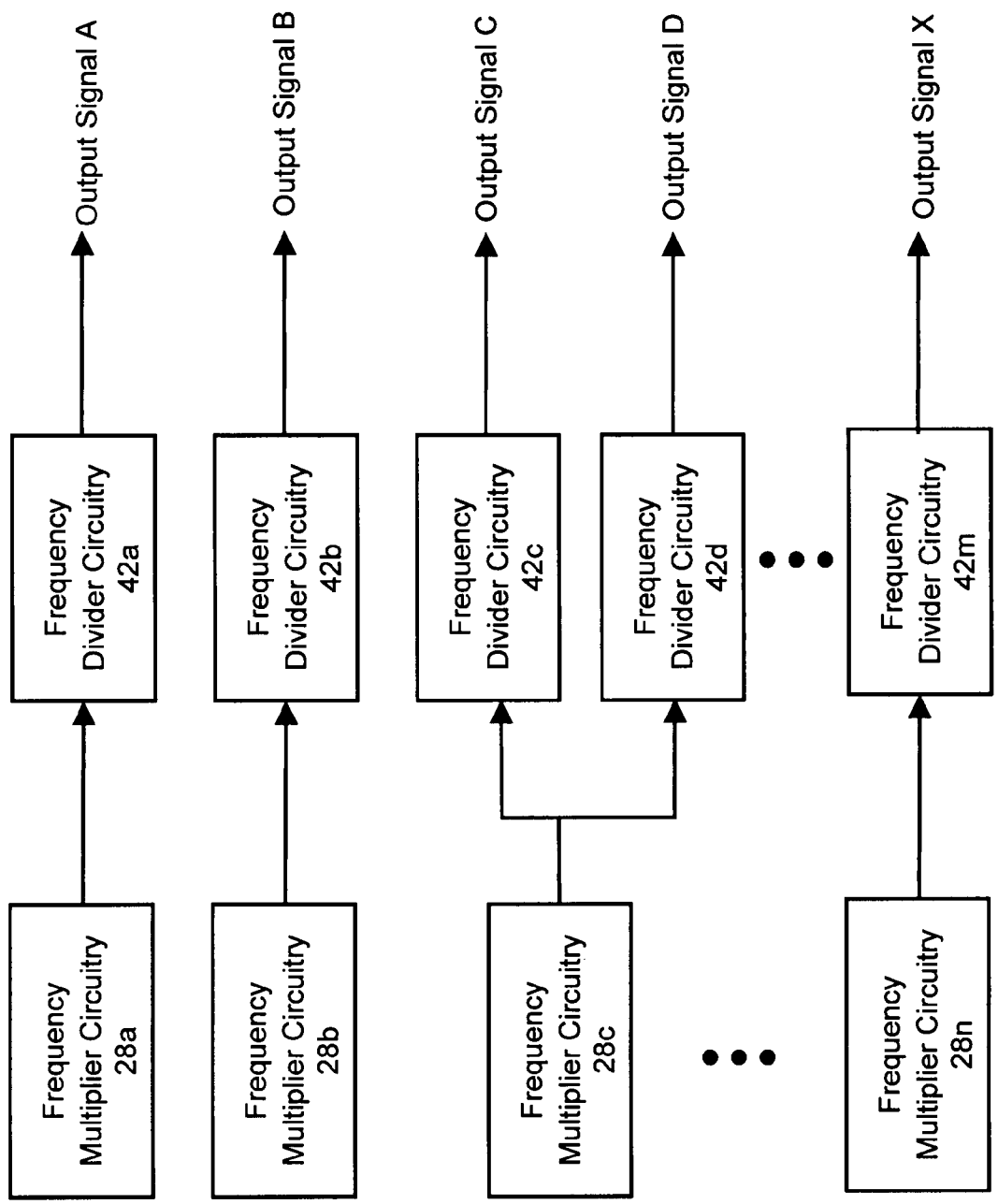

As mentioned above, compensated MEMS oscillator 100 of the present invention may include a plurality of programmable output signals. With reference to FIGS. 13A and 13B, compensated MEMS oscillator 100, in one embodiment, may include compensation circuitry 18 having a plurality of frequency multiplier circuitry 28 connected to a plurality of frequency divider circuitry 42, wherein each frequency divider circuitry 42 is associated with one frequency multiplier circuitry 28. In this embodiment, each output signal of compensated MEMS oscillator 100 may have independent characteristics (for example, an independent frequency and/or independent phase) relative to the other output signals.

Figure 14A:
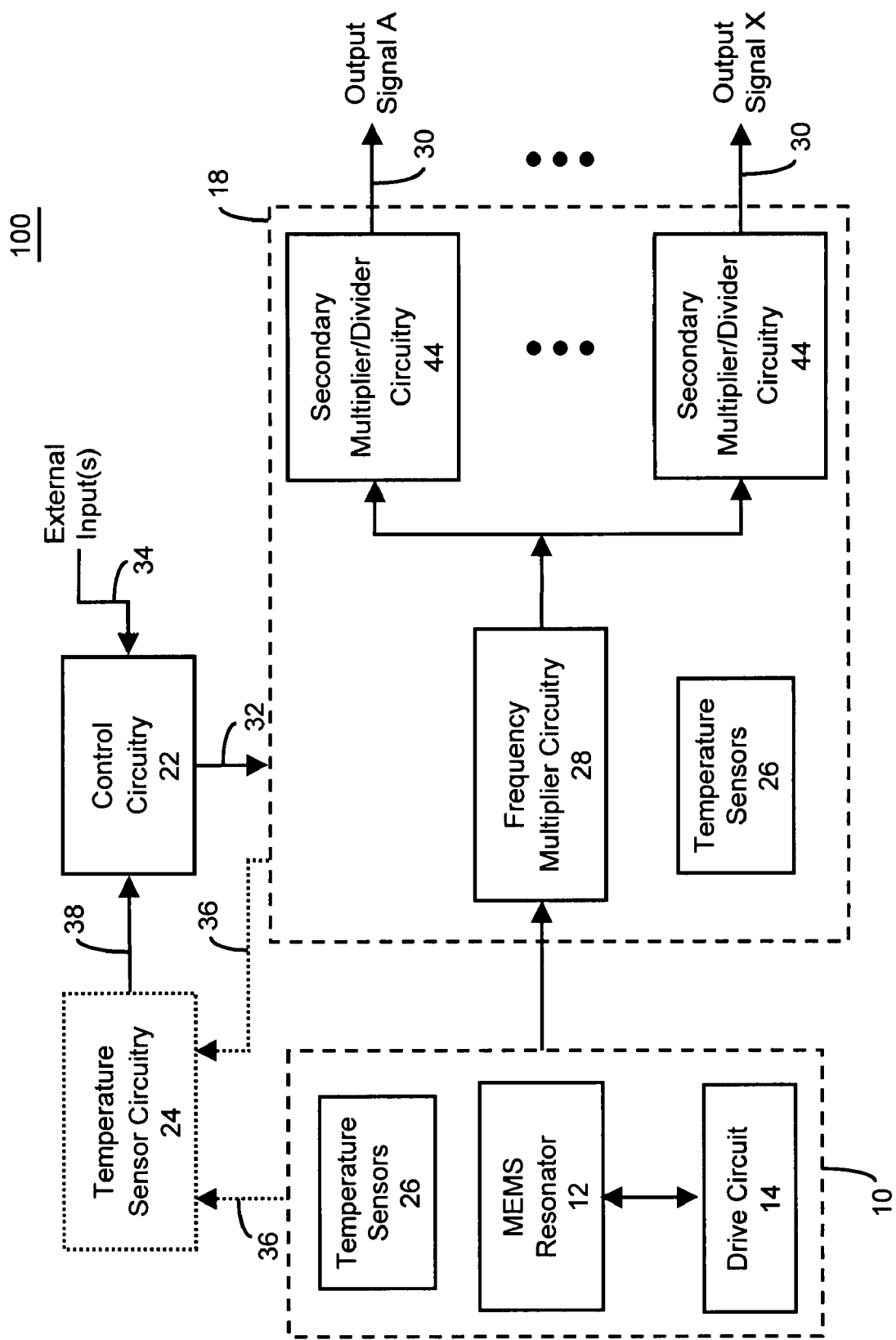
FIGS. 14A-14D illustrate block diagram representations of a MEMS oscillator having frequency multiplier/divider circuitry and secondary multiplier/divider circuitry, in accordance with certain aspects of the present invention.
Figure 14B:
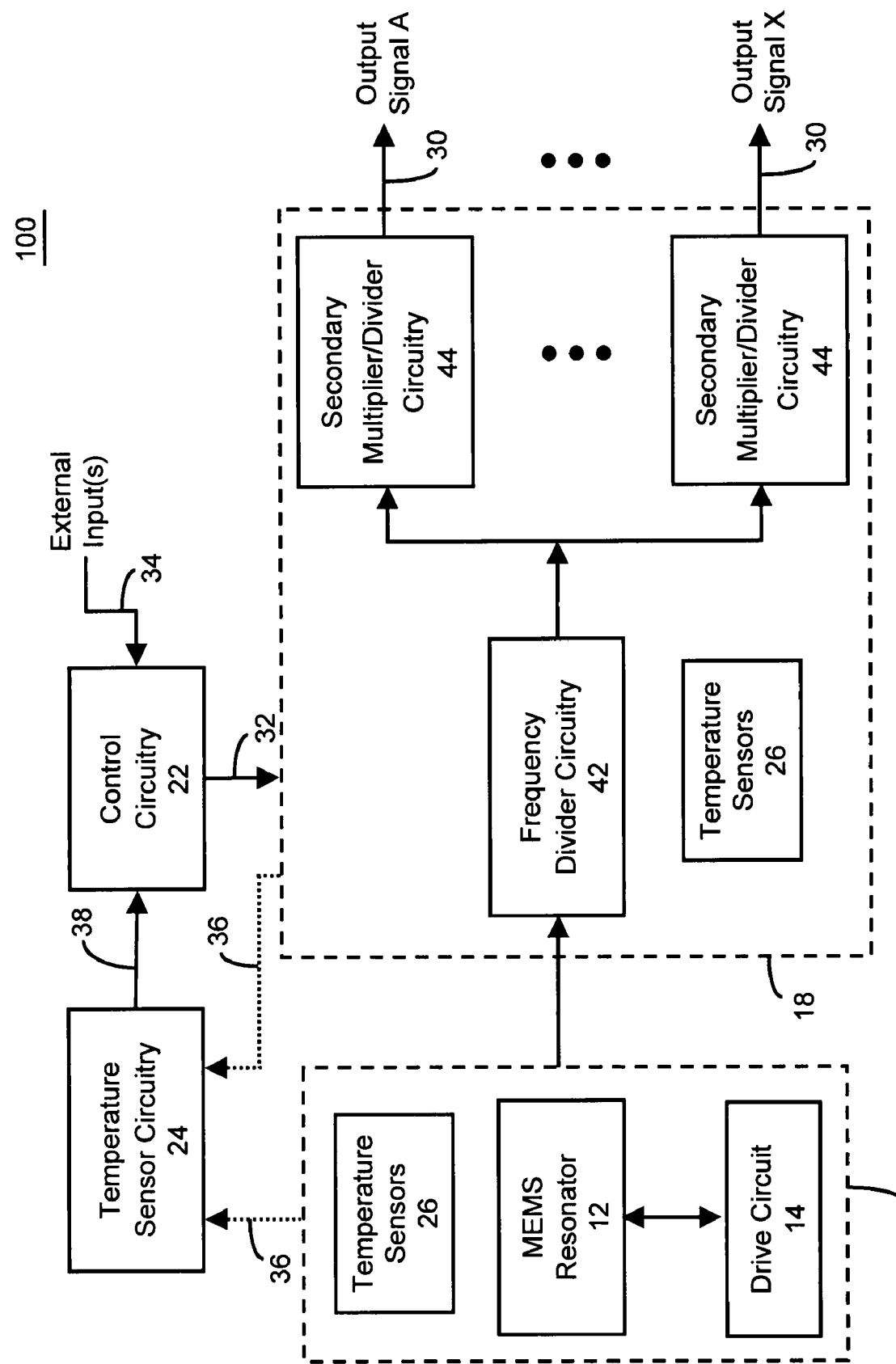

With reference to FIGS. 14A and 14B, in other embodiments, compensated MEMS oscillator 100 may include frequency multiplier circuitry 28 (FIG. 14A) or frequency divider circuitry 42 (FIG. 14B) coupled to a plurality of secondary frequency multiplier/divider circuitry 44. In this embodiment, each output signal of compensated MEMS oscillator 100 may have programmable characteristics (for example, a programmable frequency and/or a programmable phase) thereby providing a flexible MEMS oscillator device having a plurality of programmable output signals.

For example, in these embodiments, frequency multiplier circuitry 28 (FIG. 14A) and frequency divider circuitry 42 (FIG. 14B) may generate a stable, precise output signal having a predetermined frequency and/or phase. The secondary frequency multiplier/divider circuitry 44, each having different parameters, references, values and/or coefficients, may be programmed, predetermined and/or preset (for example, during fabrication, test, calibration and/or dynamically during operation) to provide an output signal having a predetermined frequency and/or phase that is different from the frequency and/or phase of the output of frequency multiplier circuitry 28 (FIG. 14A) or frequency divider circuitry 42 (FIG. 14B).

Figure 14C:
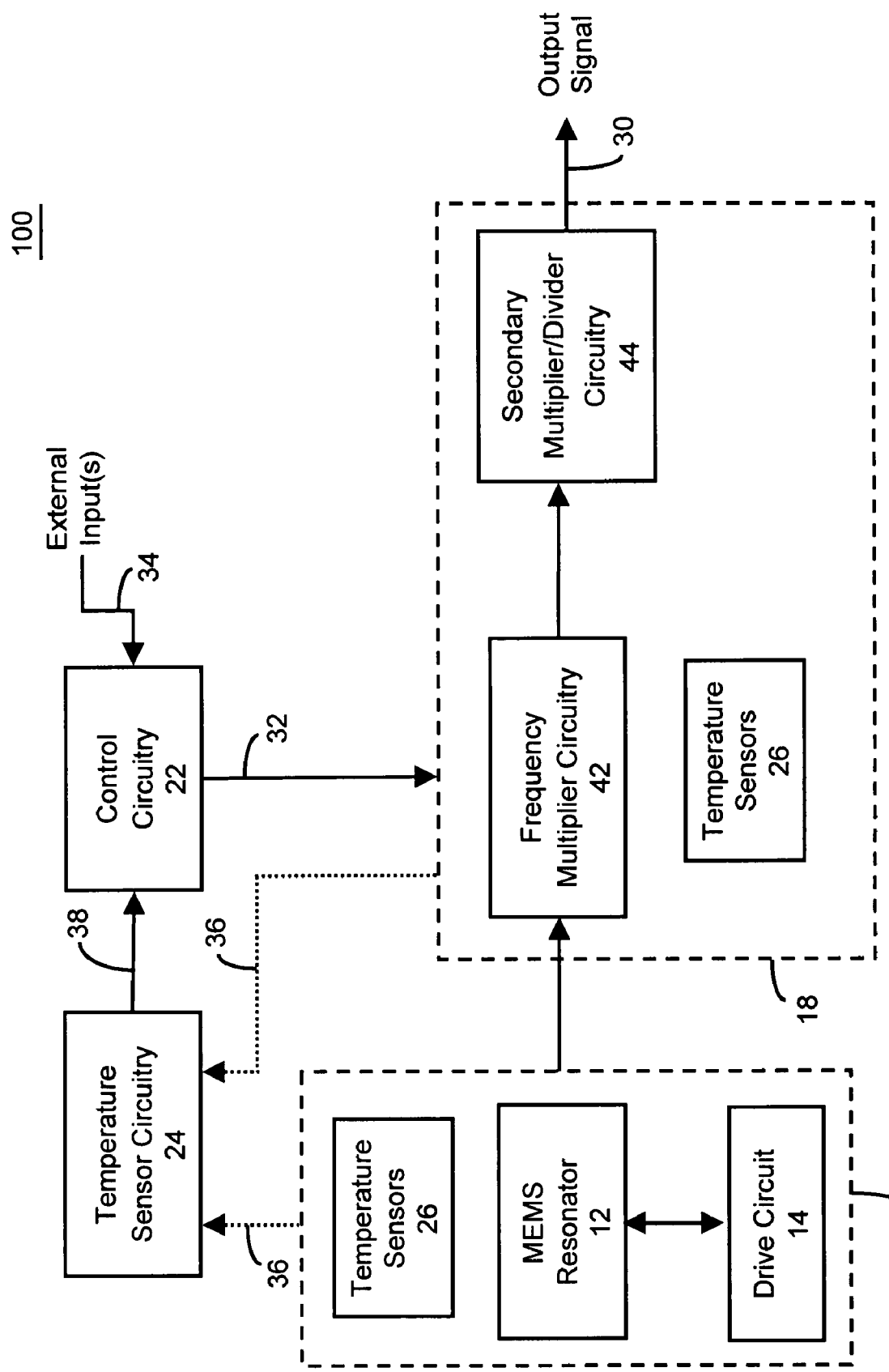
Figure 14D:
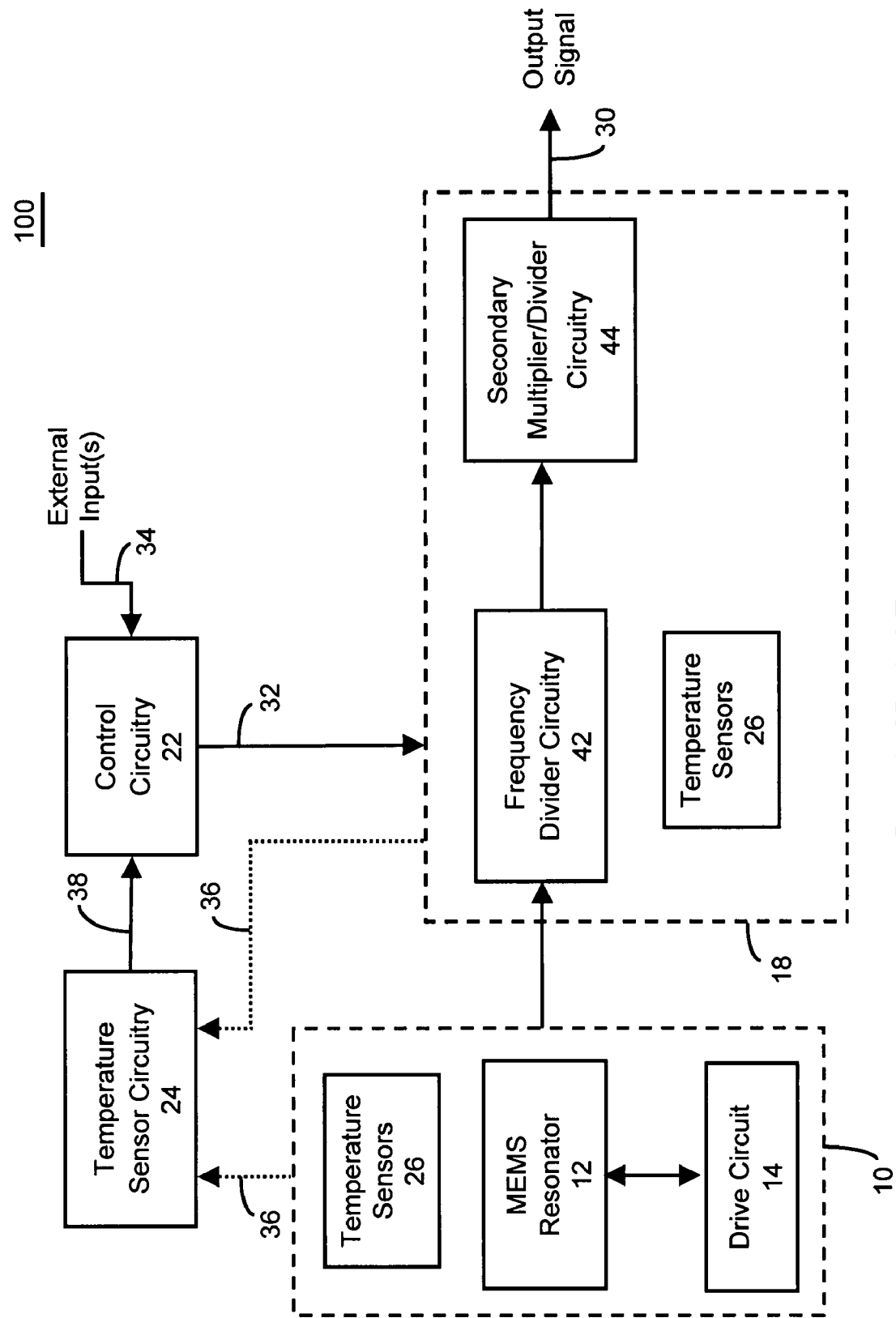

With reference to FIGS. 14C and 14D, in another embodiment, compensated MEMS oscillator 100 may include frequency multiplier circuitry 28 (FIG. 14C) or frequency divider circuitry 42 (FIG. 14D) coupled to secondary frequency multiplier/divider circuitry 44. Similar to the embodiments of FIGS. 14A and 14B, in these embodiments, the output signal of MEMS oscillator 10 is provided to frequency multiplier circuitry 28 (FIG. 14C) or frequency divider circuitry 42 (FIG. 14D) to generate a stable, precise output signal having a predetermined frequency and/or phase. The frequency multiplier circuitry 28 and frequency divider circuitry 42 of FIGS. 14C and 14D, respectively, may include circuitry that responds "slowly" to changes in parameters, references, values and/or coefficients. The secondary frequency multiplier/divider circuitry 44 may include circuitry that responds "rapidly" to such changes. In this way, compensated MEMS 100 of FIGS. 14C and 14D may be employed to provide a stable and precise output signal having a frequency and/or phase that may be rapidly modified.

For example, frequency multiplier circuitry 28 (FIG. 14C) and frequency divider circuitry 42 (FIG. 14D) may provide an output signal having a first frequency (for example, 1 MHz). The secondary frequency multiplier/divider circuitry 44 may be rapidly and dynamically programmed and/or re-programmed to provide an output signal having second frequencies (for example, 8 MHz, 9 MHz and/or 10 MHz).

Notably, in one embodiment, frequency multiplier circuitry 28 (FIG. 14C) and frequency divider circuitry 42 (FIG. 14D) may be a fractional-N PLL or fractional-N DLL which may be "slow" to respond to changes in parameters, references, values and/or coefficients. However, secondary frequency multiplier/divider circuitry 44 may be an integer type PLL or DLL which may respond quickly to changes in parameters, references, values and/or coefficients. As such, the frequency of the output signal of frequency multiplier circuitry 28 (FIG. 14C) and frequency divider circuitry 42 (FIG. 14D) may be a base frequency which is employed by secondary frequency multiplier/divider circuitry 44 to generate an output that responds rapidly to dynamic programming and/or re-programming and is an integer multiple of the base frequency. In this regard, the granularity of frequency of the output signal of compensated MEMS 100 depends on the base frequency.

For example, where the base frequency is 200 kHz and secondary frequency multiplier/divider circuitry 44 is an integer type PLL or DLL, the frequency of the output signal of compensated MEMS 100 may be, for example, 10 MHz (i.e., multiplication factor is 50), 10.2 MHz (i.e., multiplication factor is 51), 10.4 MHz (i.e., multiplication factor is 52) or 10.6 MHz (i.e., multiplication factor is 53). Notably, the discussions pertaining to FIGS. 14C and 14D are also applicable to FIGS. 14A and 14B. For the sake of brevity, those discussions will not be repeated.

Notably, any and all of the techniques and/or configurations described herein for supplying or providing the parameters, references, values and/or coefficients to, as well as controlling, programming and/or adjusting the performance of compensation circuitry 18 may be implemented in the embodiments/inventions of FIGS. 11A, 11B, 12A, 12B, 13A, 13B, 14A and 14B. For the sake of brevity, those discussions will not be repeated.

Figure 17A:
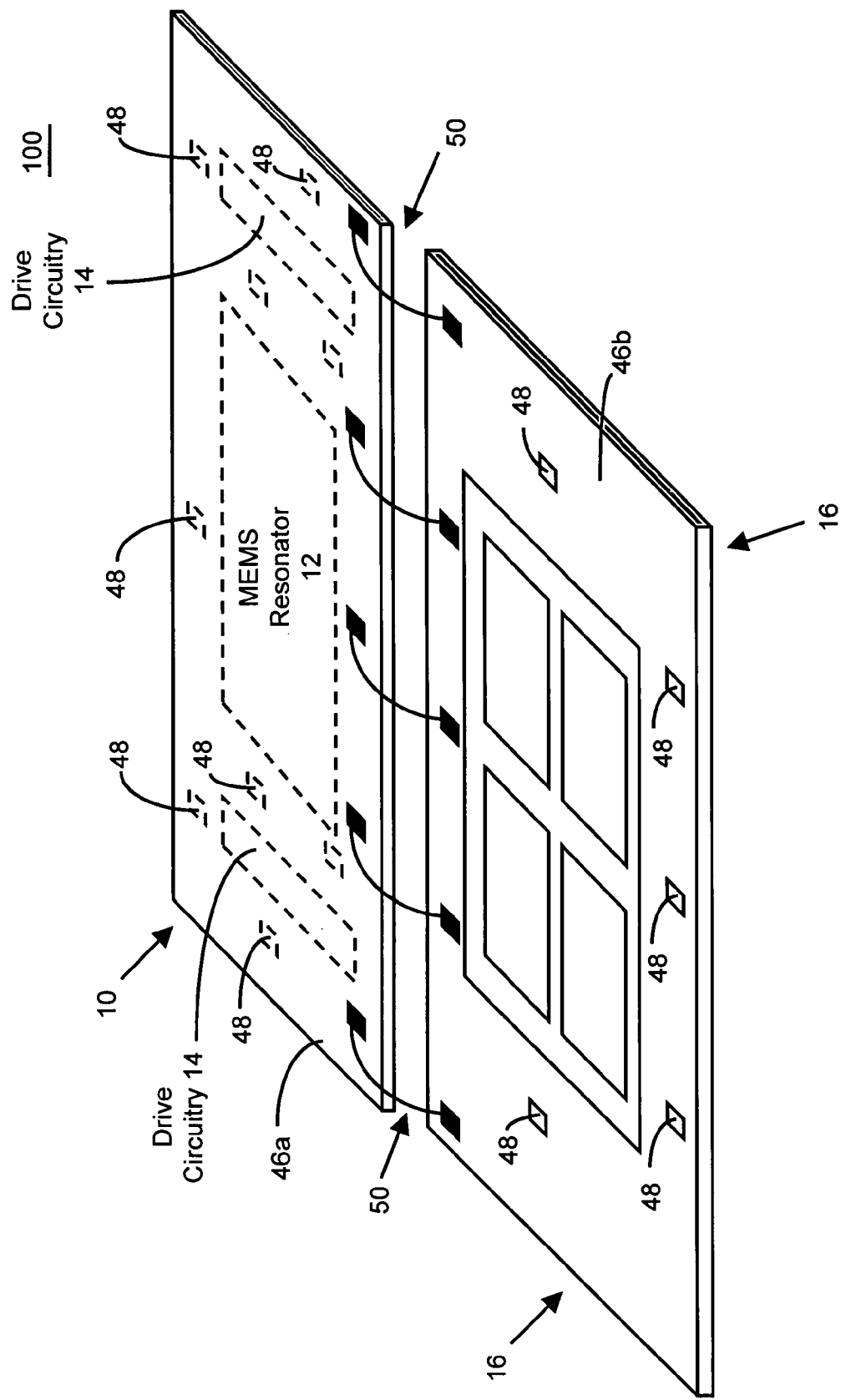
FIGS. 17A-17C illustrate plan view block diagram representations of interconnection techniques of the MEMS oscillators of FIGS. 13C-13F, according to certain aspects of the present invention.
Figure 17B:
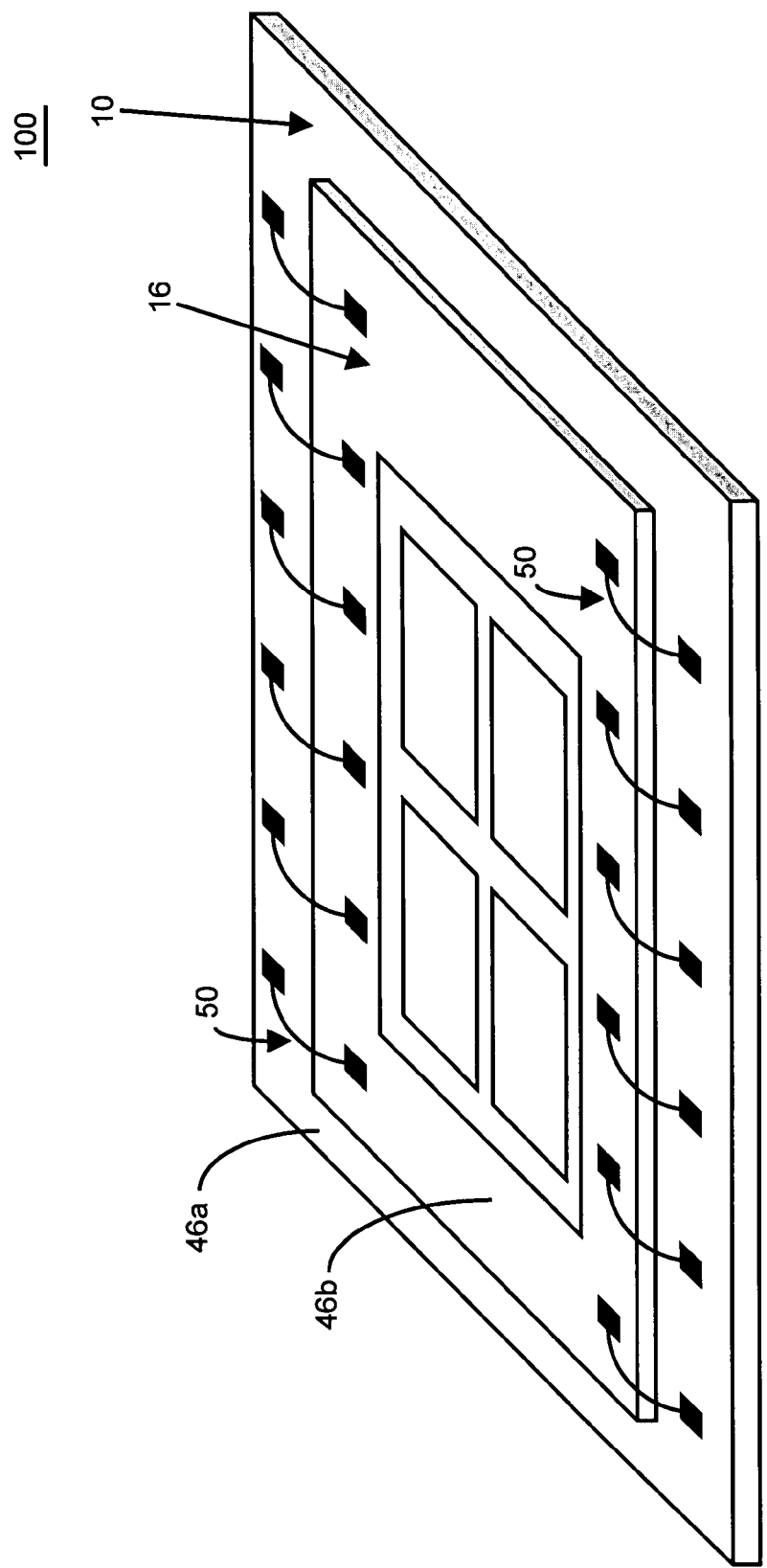
Figure 17C:
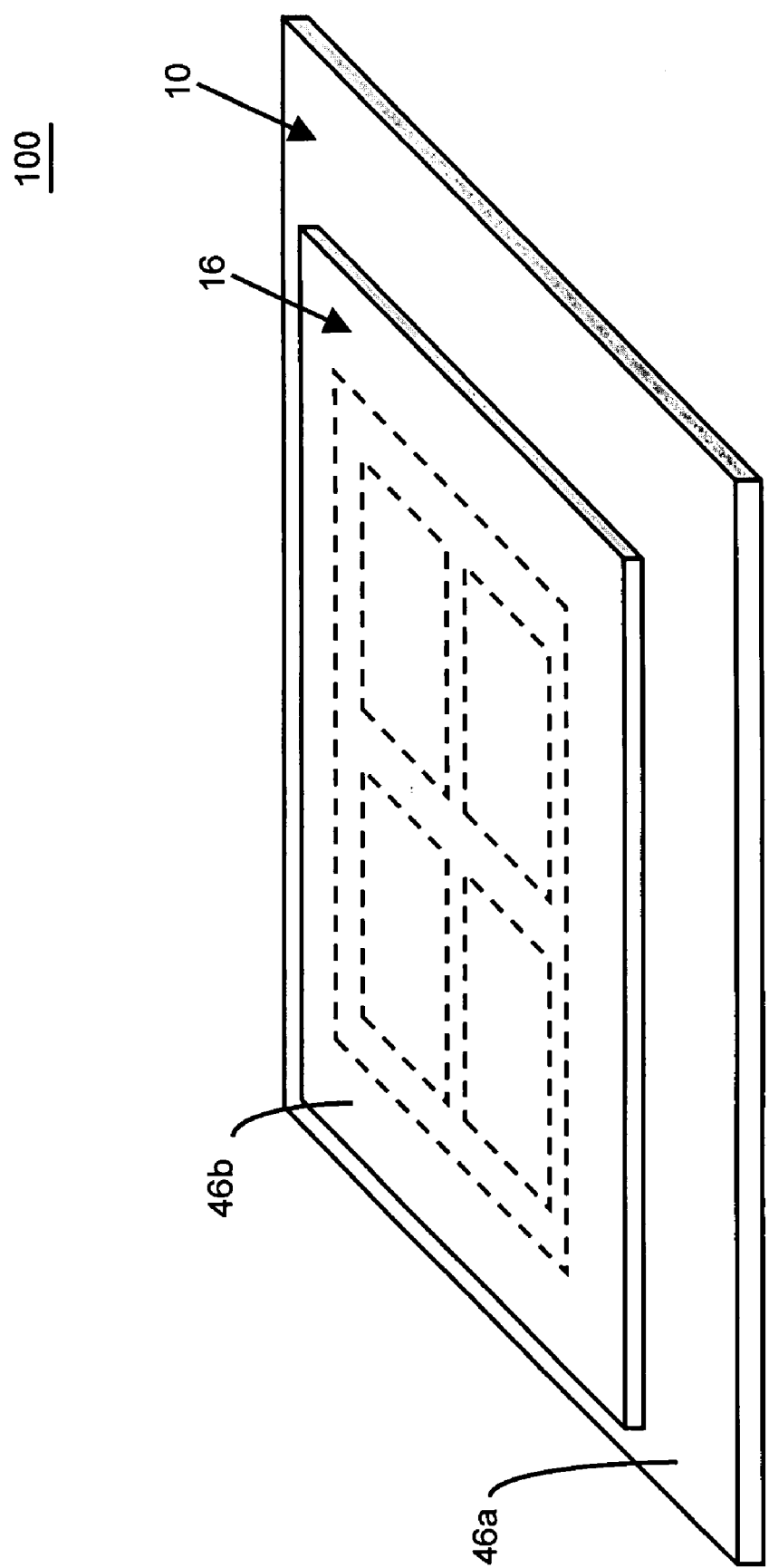
Figure 18A:
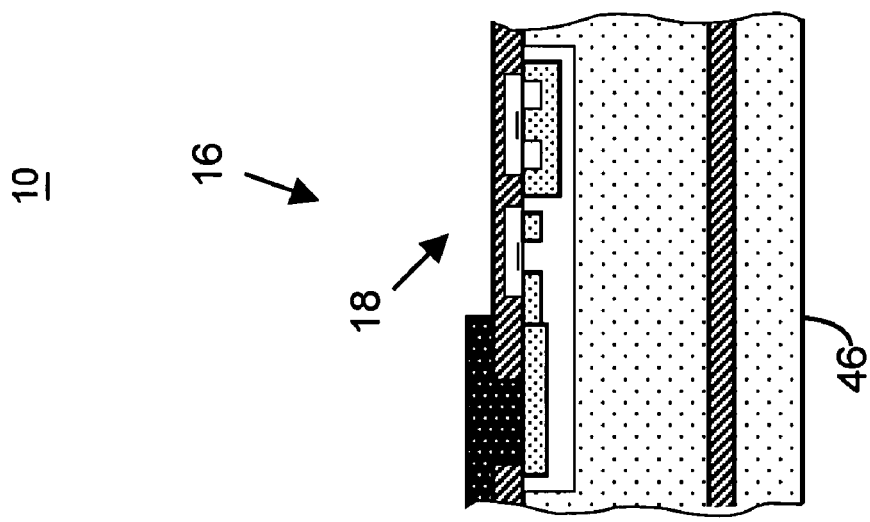
FIGS. 18A-18H illustrate cross-sectional views of a portion of the MEMS oscillator, integrated in or on a common substrate, with a portion of the compensation and control circuitry, according to certain aspects of the present inventions.
Figure 18A:
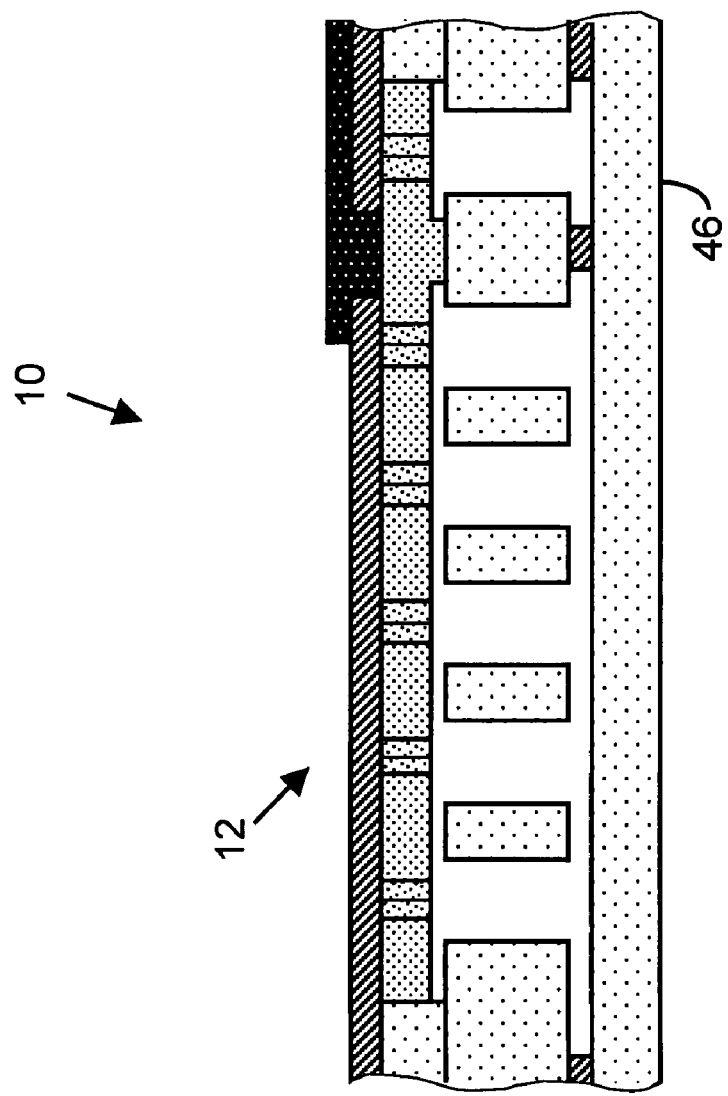
Figure 18B:
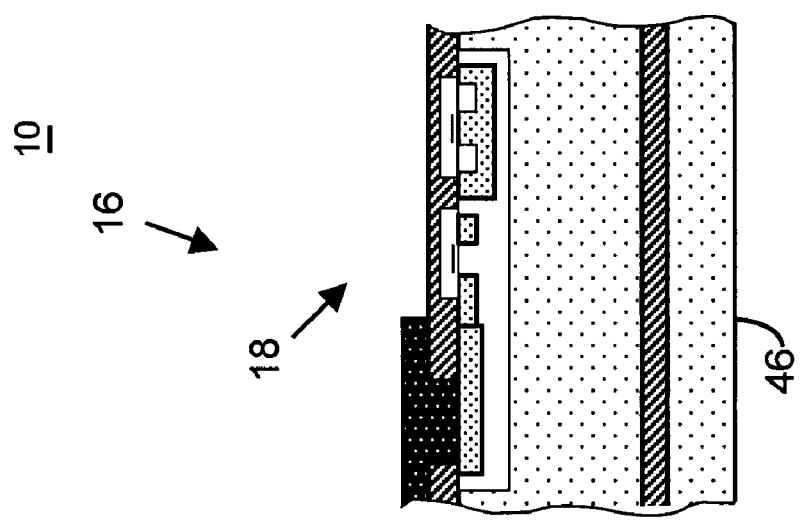
Figure 18B:
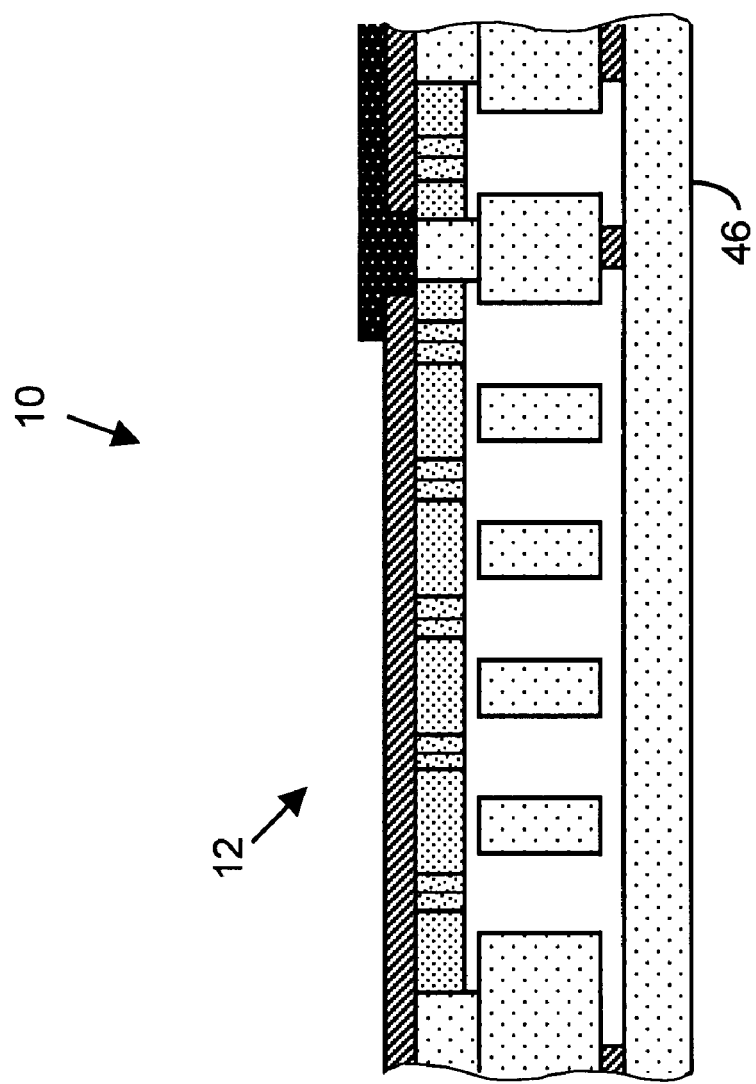
Figure 18C:
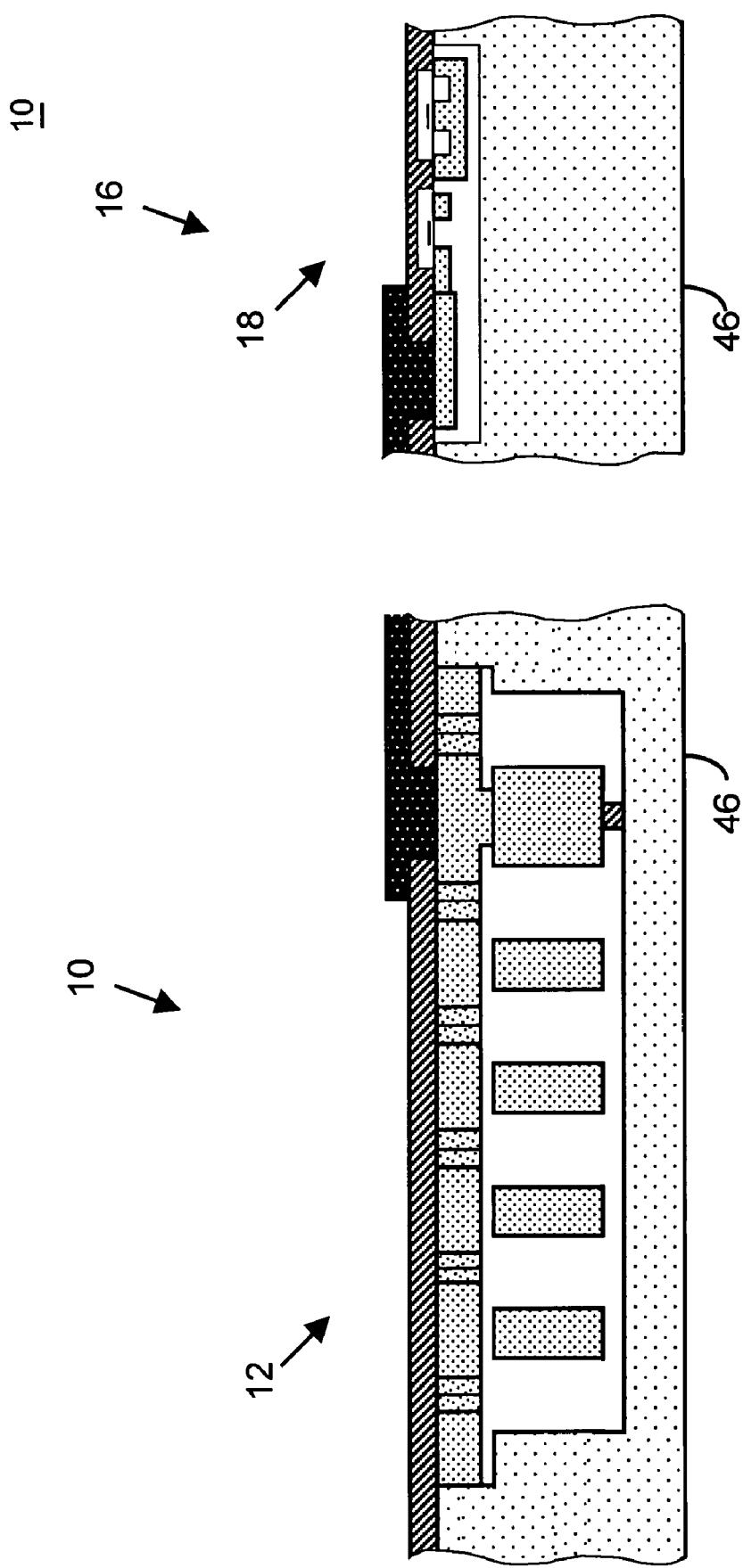
Figure 18D:
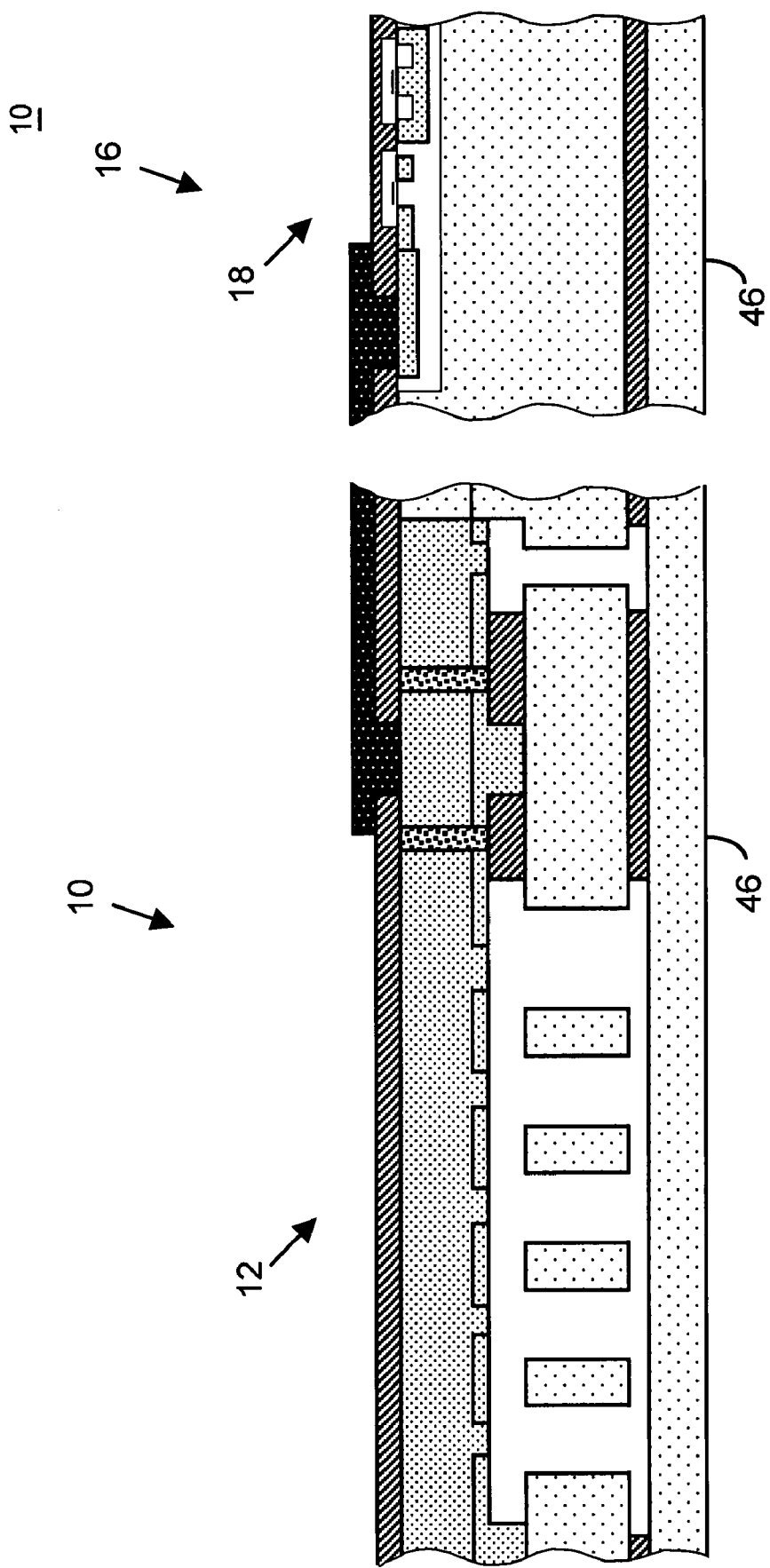
Figure 18E:
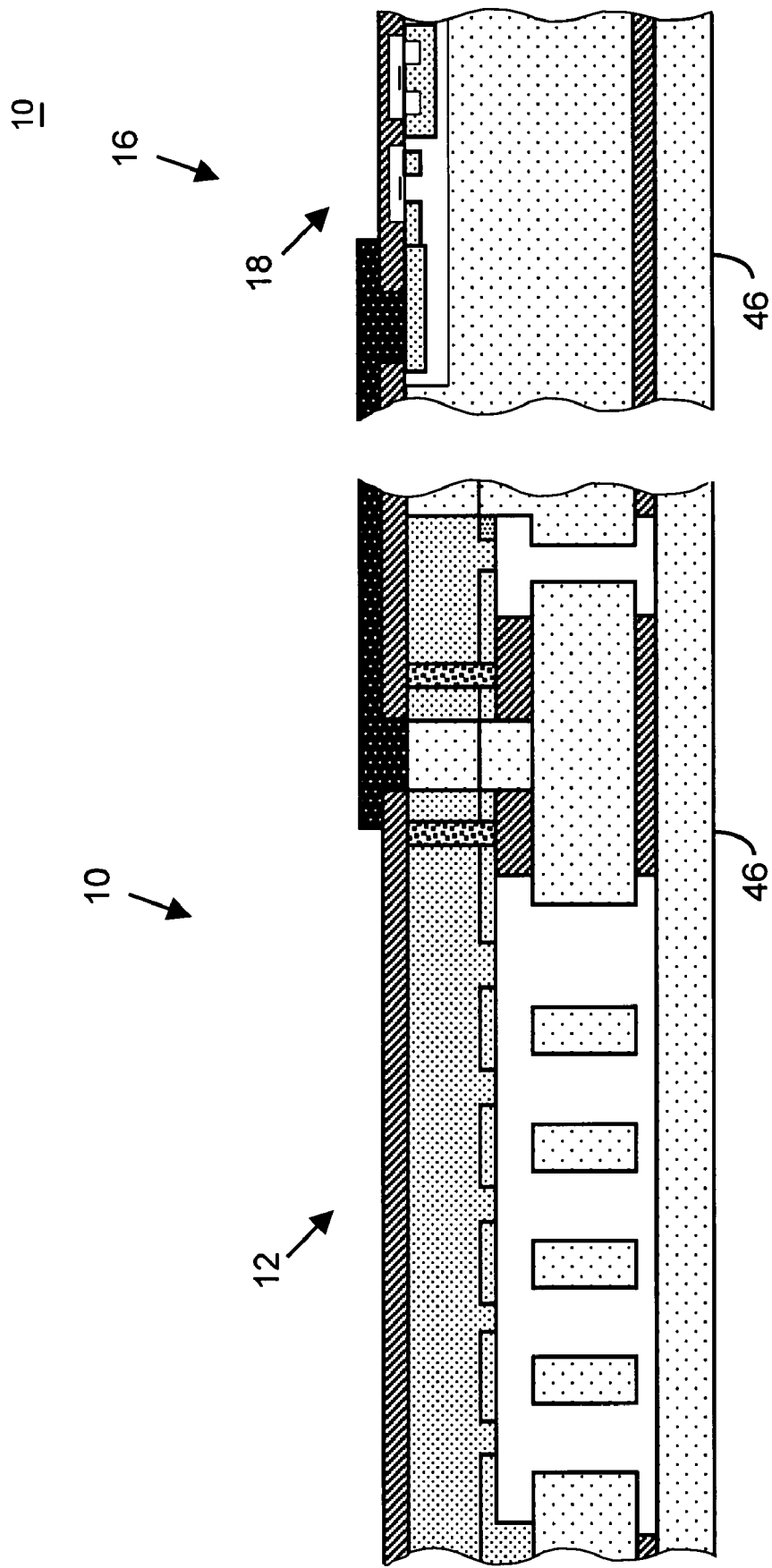
Figure 18F:
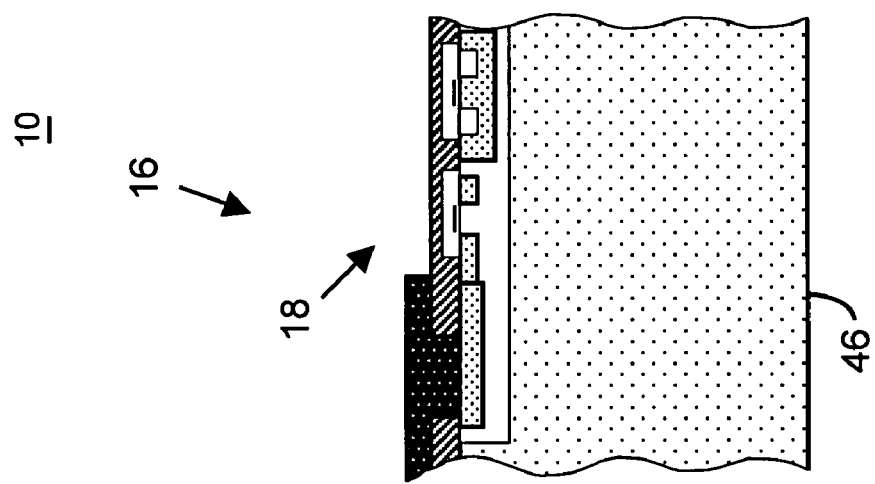
Figure 18F:
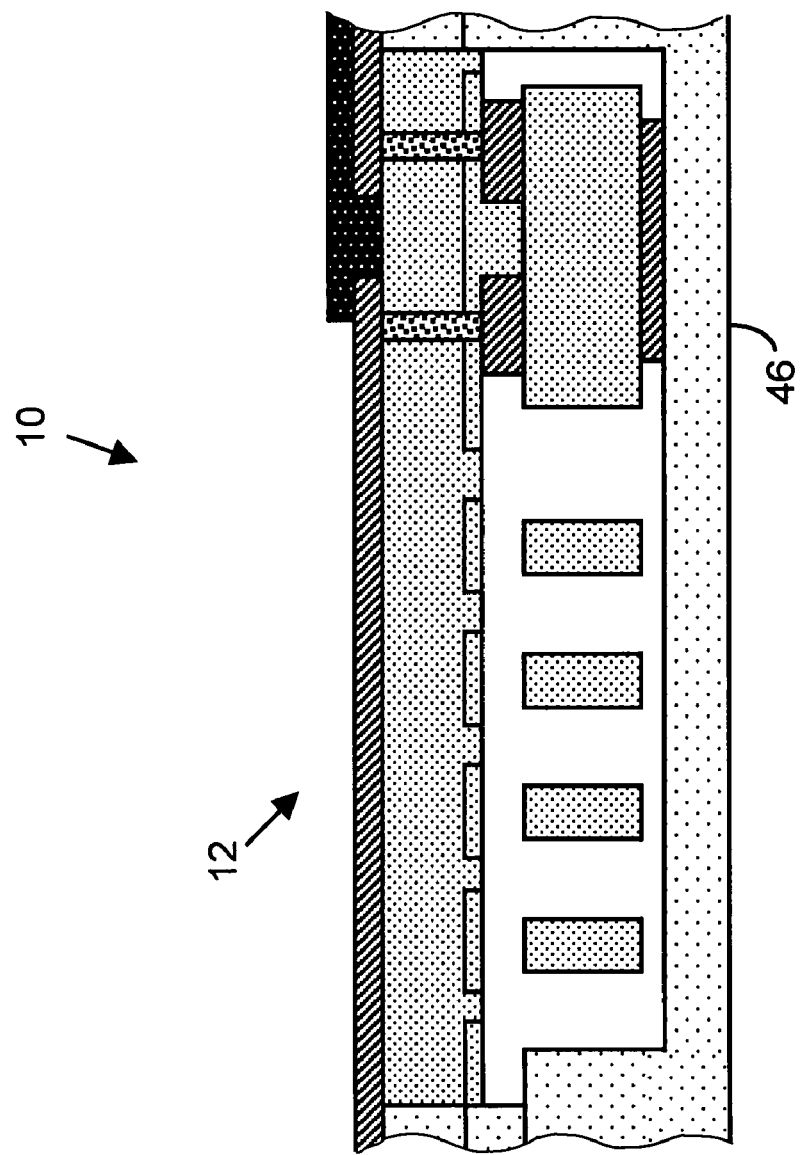
Figure 18G:
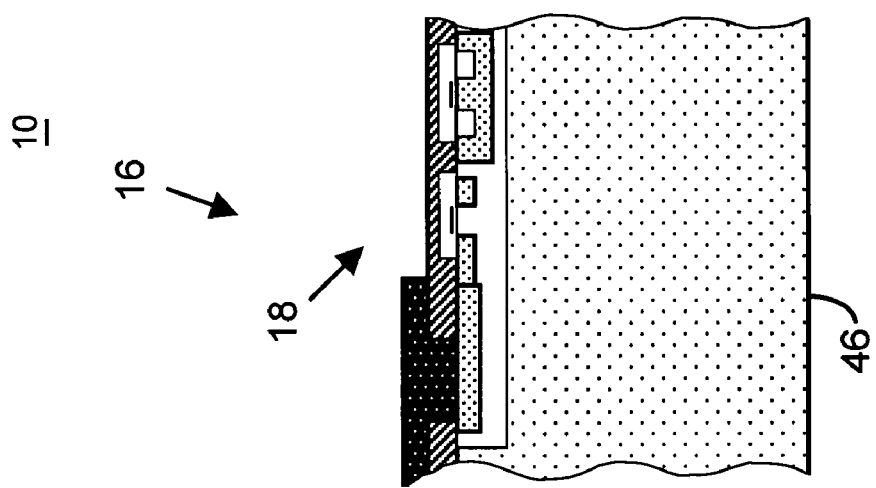
Figure 18G:
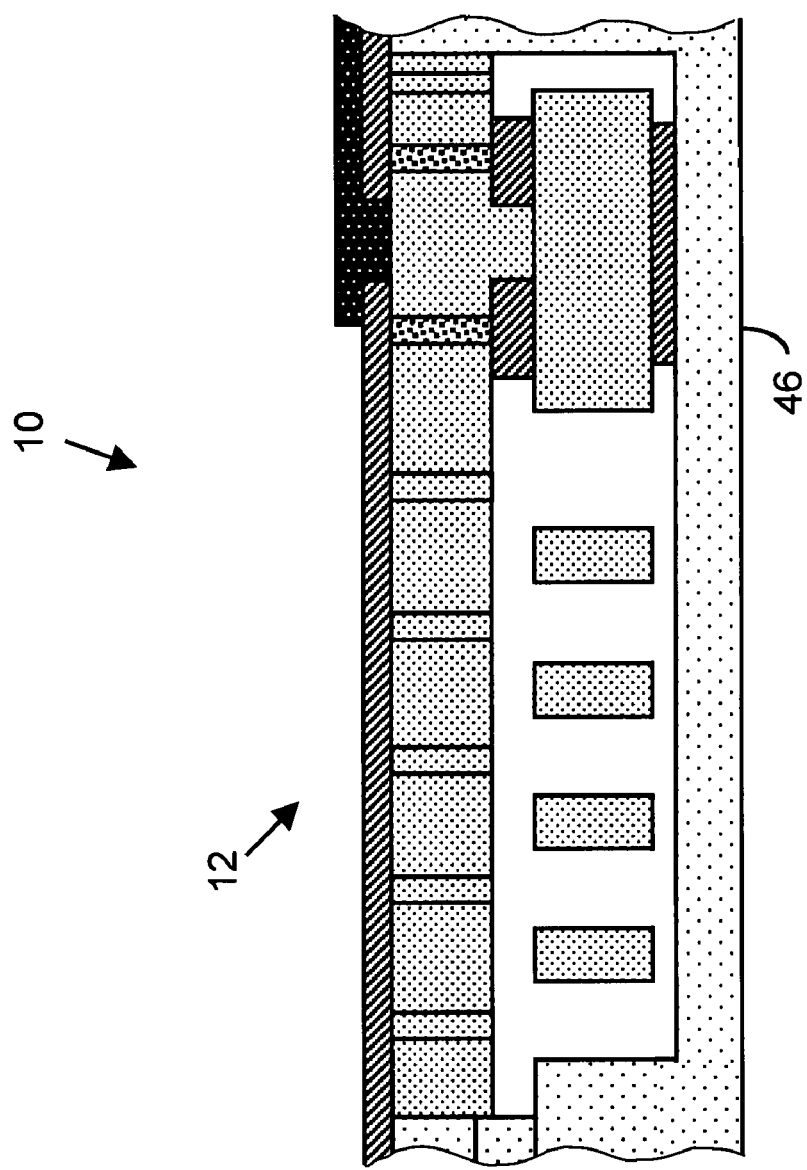
Figure 18H:
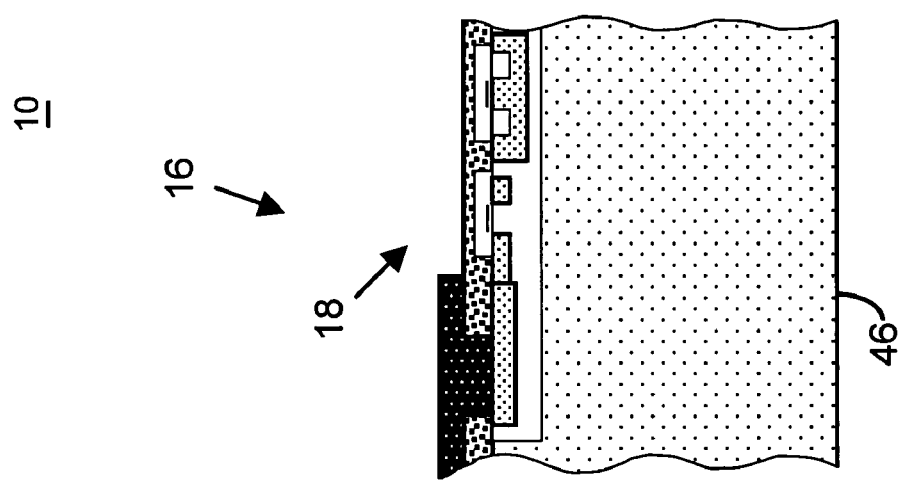
Figure 18H:
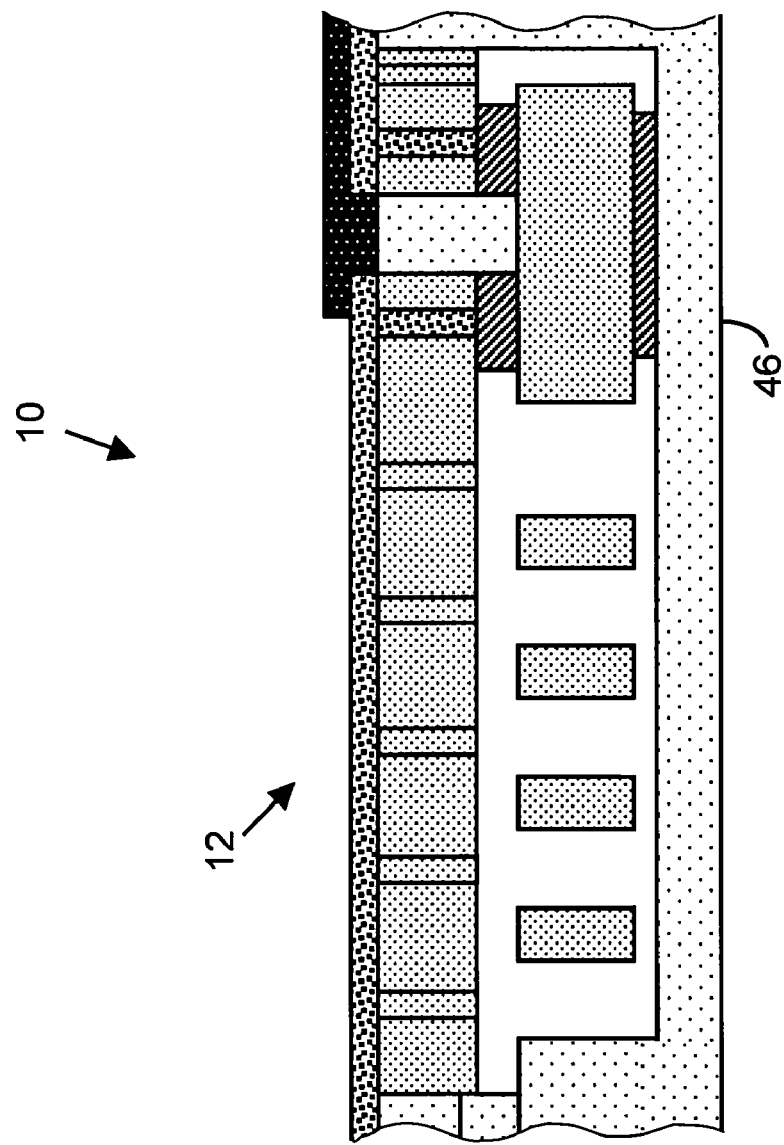
Figure 19A:
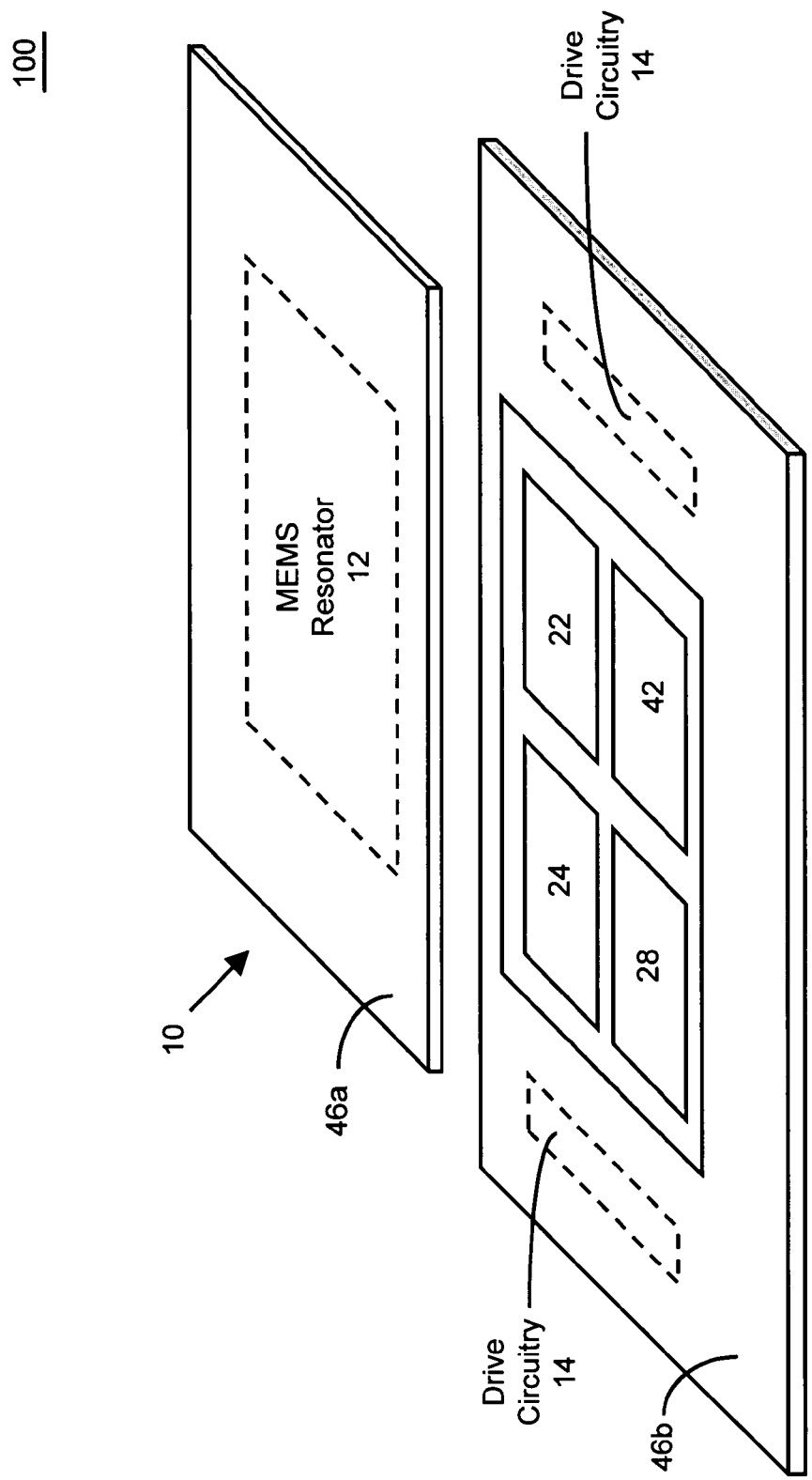
FIGS. 19A-19D illustrate plan view block diagram representations of compensated MEMS oscillators, wherein the drive circuitry is disposed on the substrate of the compensation and control circuitry, according to certain aspects of the present invention.
Figure 19B:
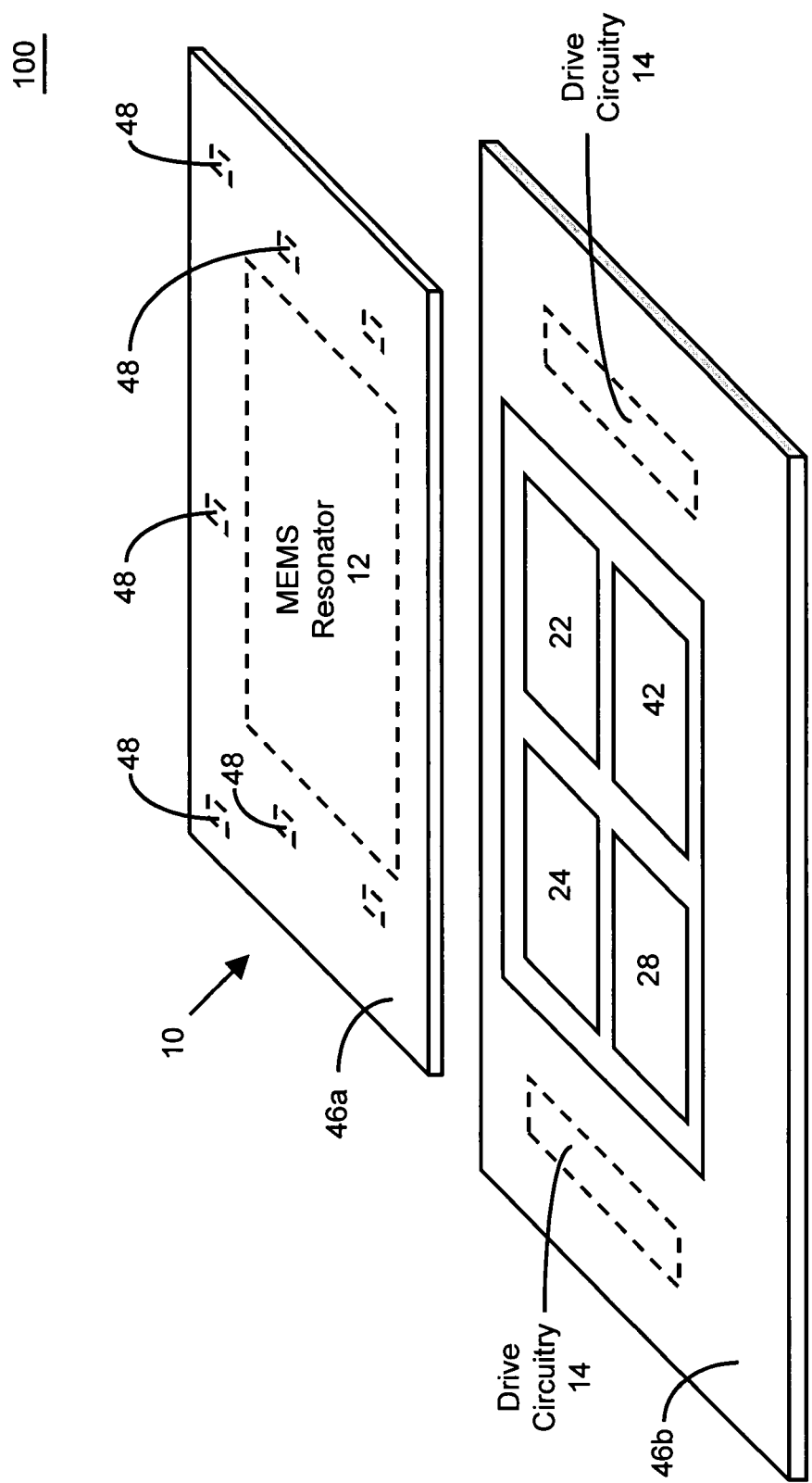
Figure 19C:
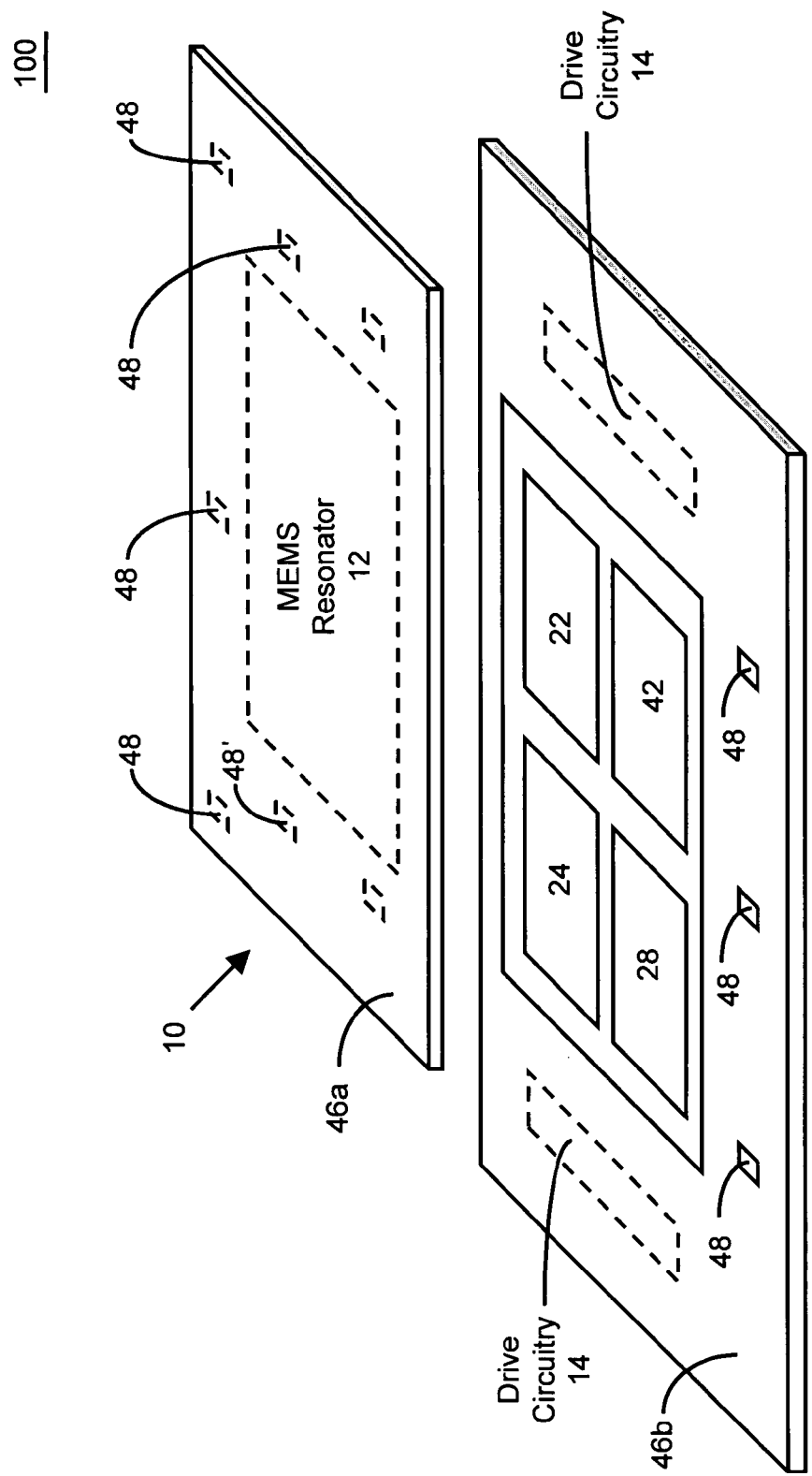
Figure 19D:
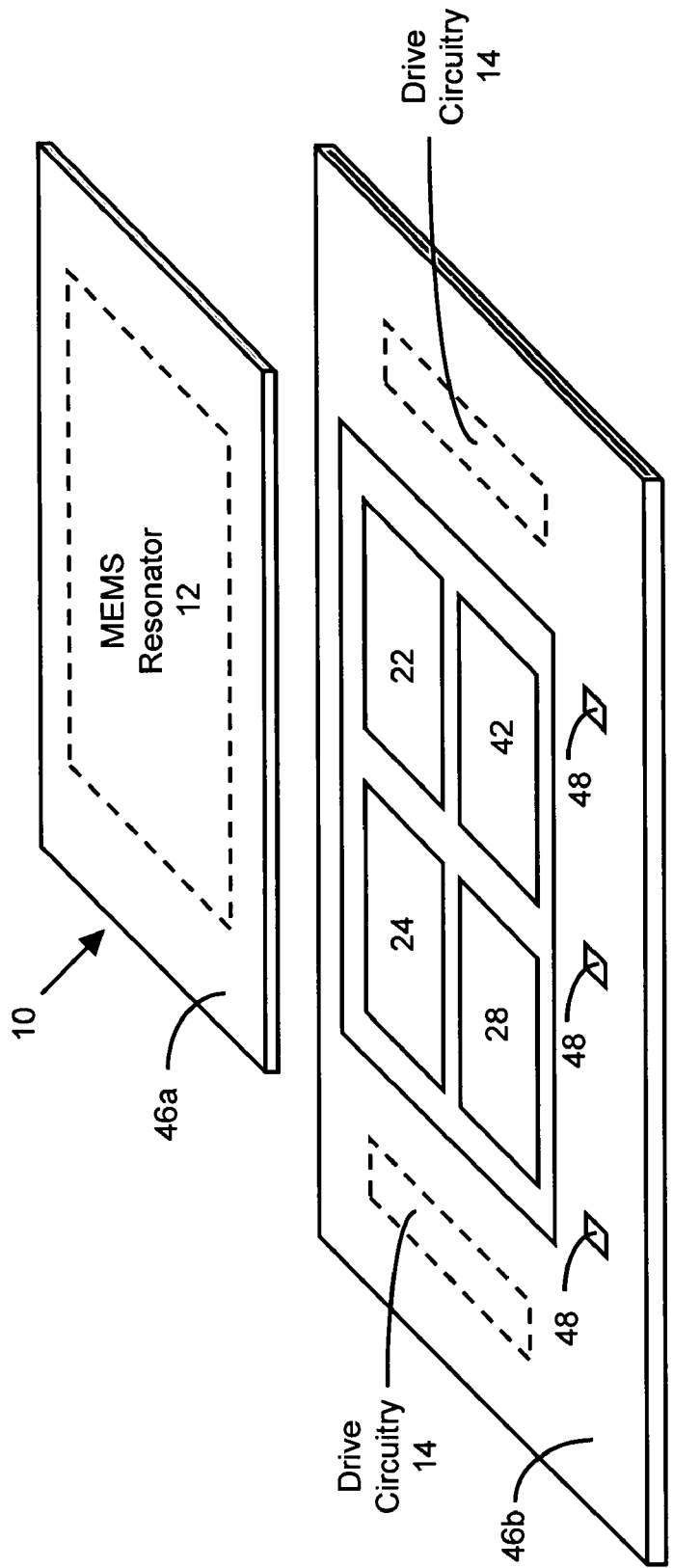

The compensated MEMS oscillator 100 of the present invention may be packaged/fabricated using a variety of techniques, including, for example, monolithically (see, for example, FIGS. 15A-15F), multi-chip (see, for example, FIGS. 16A-16C and 17A), hybrid integrated (see, for example, FIG. 17B), and/or flip-chip (see, for example, FIG. 17C). Indeed, any fabrication and/or packaging techniques may be employed, whether now known or later developed. As such, all such fabrication and/or packaging techniques are intended to fall within the scope of the present invention.

In particular, with reference to FIGS. 15A-15F, MEMS resonator 12 and drive circuitry 14 may be integrated on substrate 46 as compensation and control circuitry 16. Any fabrication technique and/or process may be implemented. For example, the systems, devices and/or techniques described and illustrated in the following non-provisional patent applications may be implemented (see, for example, FIGS. 18A-18H):

(1) "Electromechanical System having a Controlled Atmosphere, and Method of Fabricating Same", which was filed on Mar. 20, 2003 and assigned Ser. No. 10/392,528;

(2) "Microelectromechanical Systems, and Method of Encapsulating and Fabricating Same", which was filed on Jun. 4, 2003 and assigned Ser. No. 10/454,867;

(3) "Microelectromechanical Systems Having Trench Isolated Contacts, and Methods of Fabricating Same", which was filed on Jun. 4, 2003 and assigned Ser. No. 10/455,555;

(4) "Anchors for Microelectromechanical Systems Having an SOI Substrate, and Method for Fabricating Same", which was filed on Jul. 25, 2003 and assigned Ser. No. 10/627,237; and (5) "Anti-Stiction Technique for Thin Film and Wafer-Bonded Encapsulated Microelectromechanical Systems", which was filed on Oct. 31, 2003 and assigned Ser. No. 10/698,258.

The inventions described and illustrated in the aforementioned patent applications may be employed to fabricate compensated MEMS oscillator 100 of the present inventions. For the sake of brevity, those discussions will not be repeated. It is expressly noted, however, that the entire contents of the aforementioned patent applications, including, for example, the features, attributes, alternatives, materials, techniques and advantages of all of the inventions, are incorporated by reference herein.

Figure 15A:
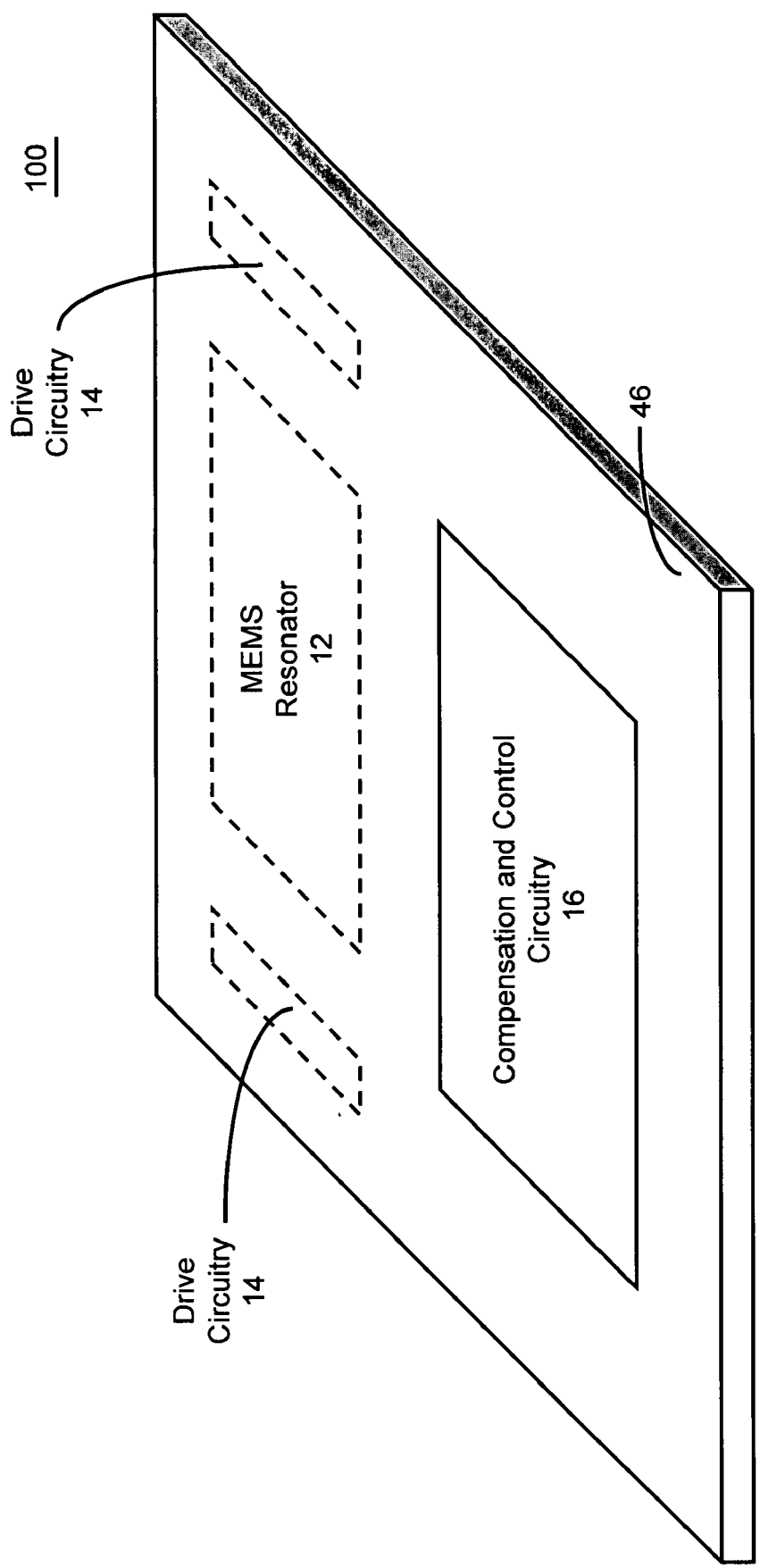
FIG. 15A illustrates a plan view (i.e., three-dimensional) block diagram representation of the frequency and/or phase compensated MEMS oscillator integrated in or on a common substrate, according to certain aspects of the present invention.
Figure 15B:
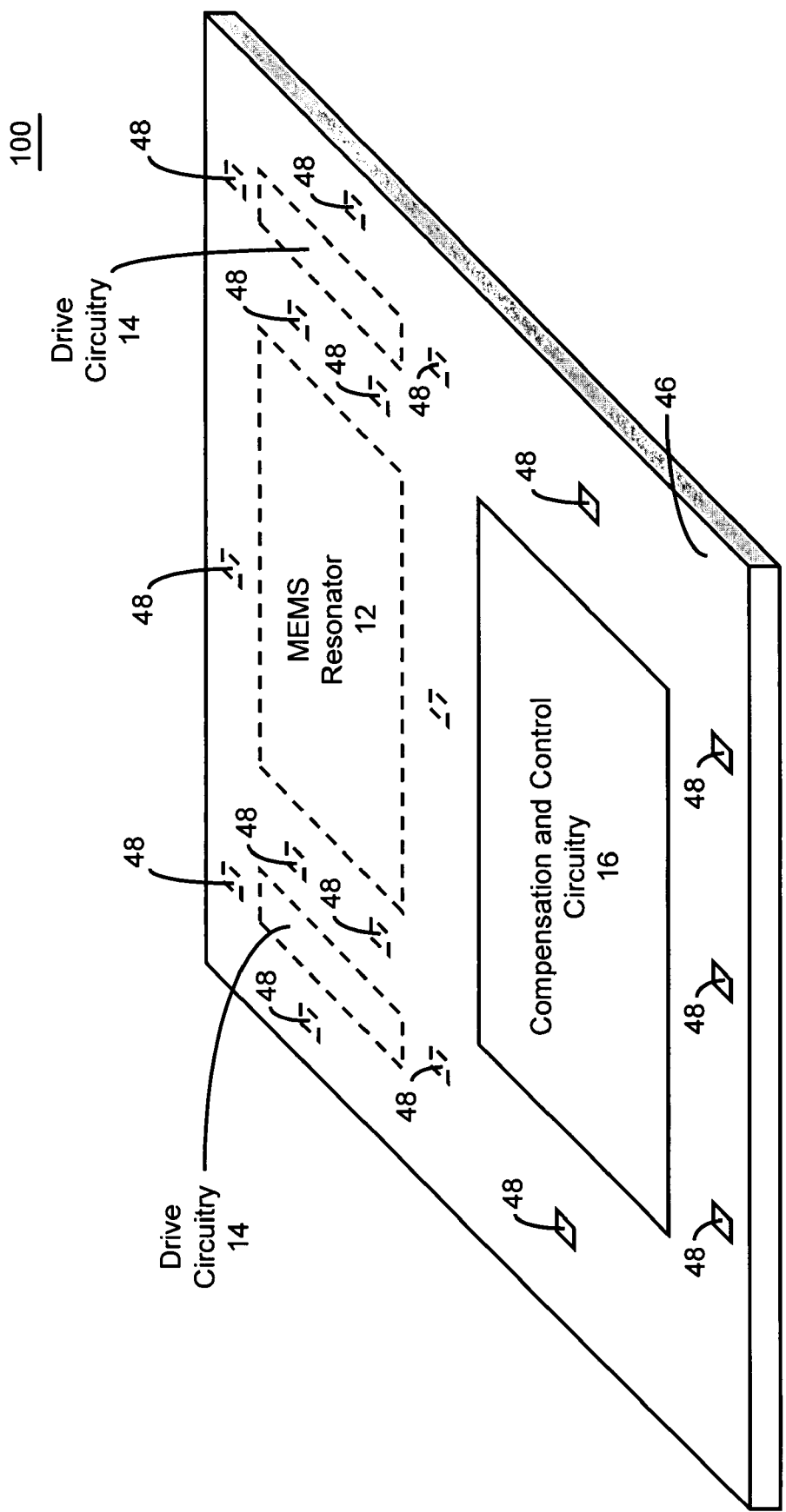
FIG. 15B illustrates a plan view block diagram representation of the frequency and/or phase compensated MEMS oscillator, including integrated temperature sensors, integrated on or in a common substrate, according to certain aspects of the present invention.
Figure 15C:
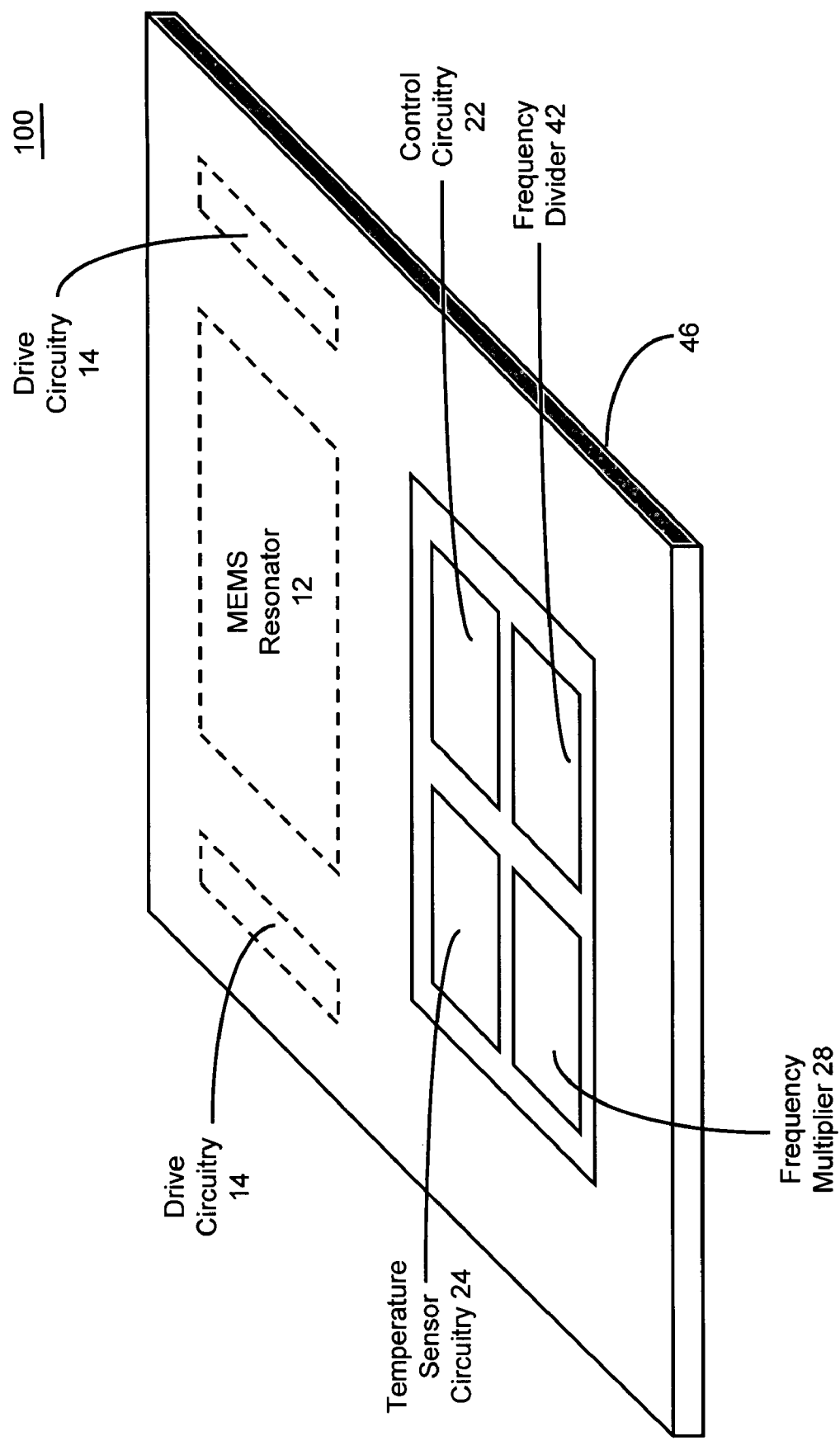
FIGS. 15C-15F illustrate plan view block diagram representations of frequency and/or phase compensated MEMS oscillators, integrated in or on a common substrate, according to certain aspects of the present invention.
Figure 15D:
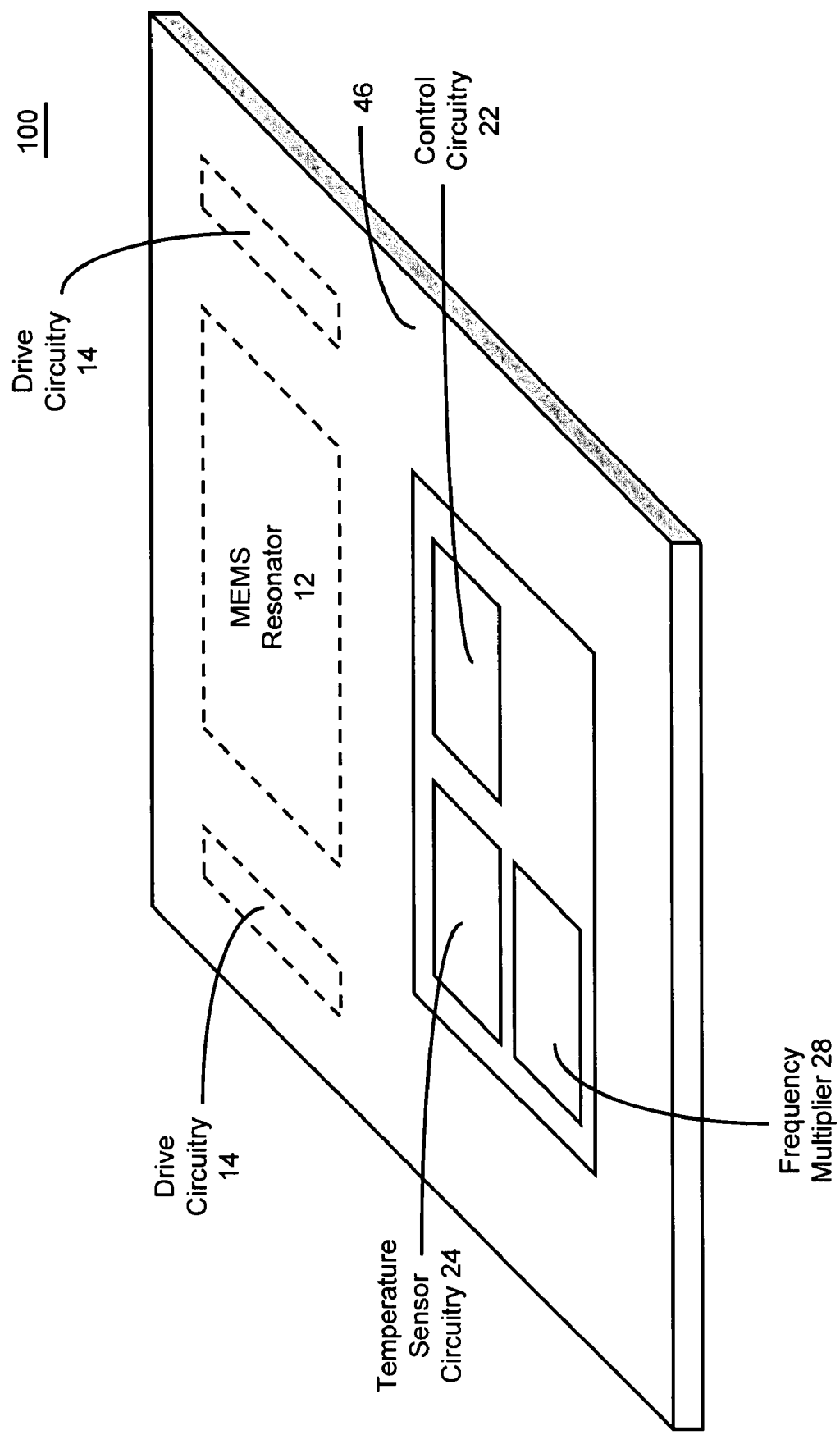
Figure 15E:
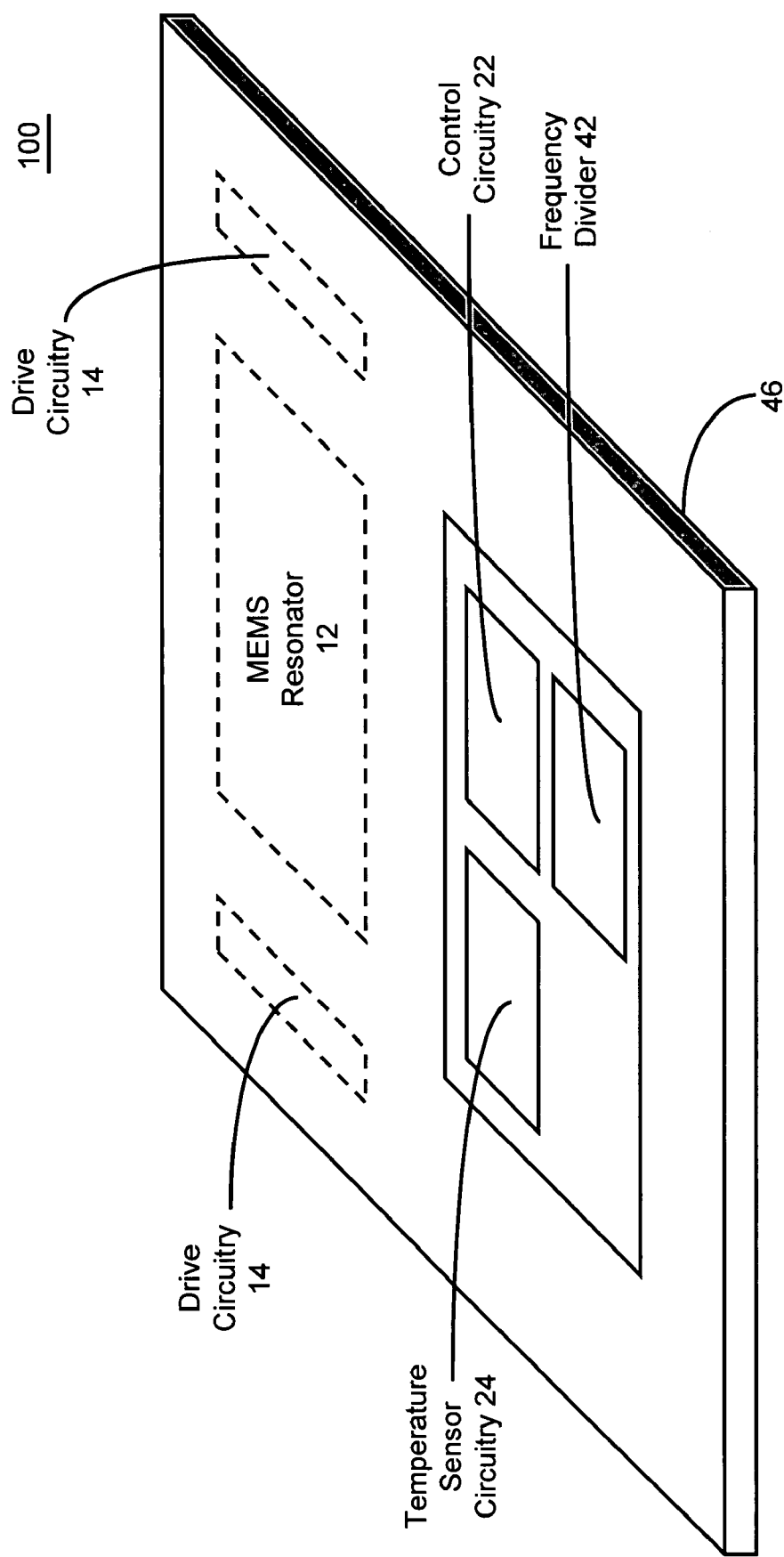
Figure 15F:
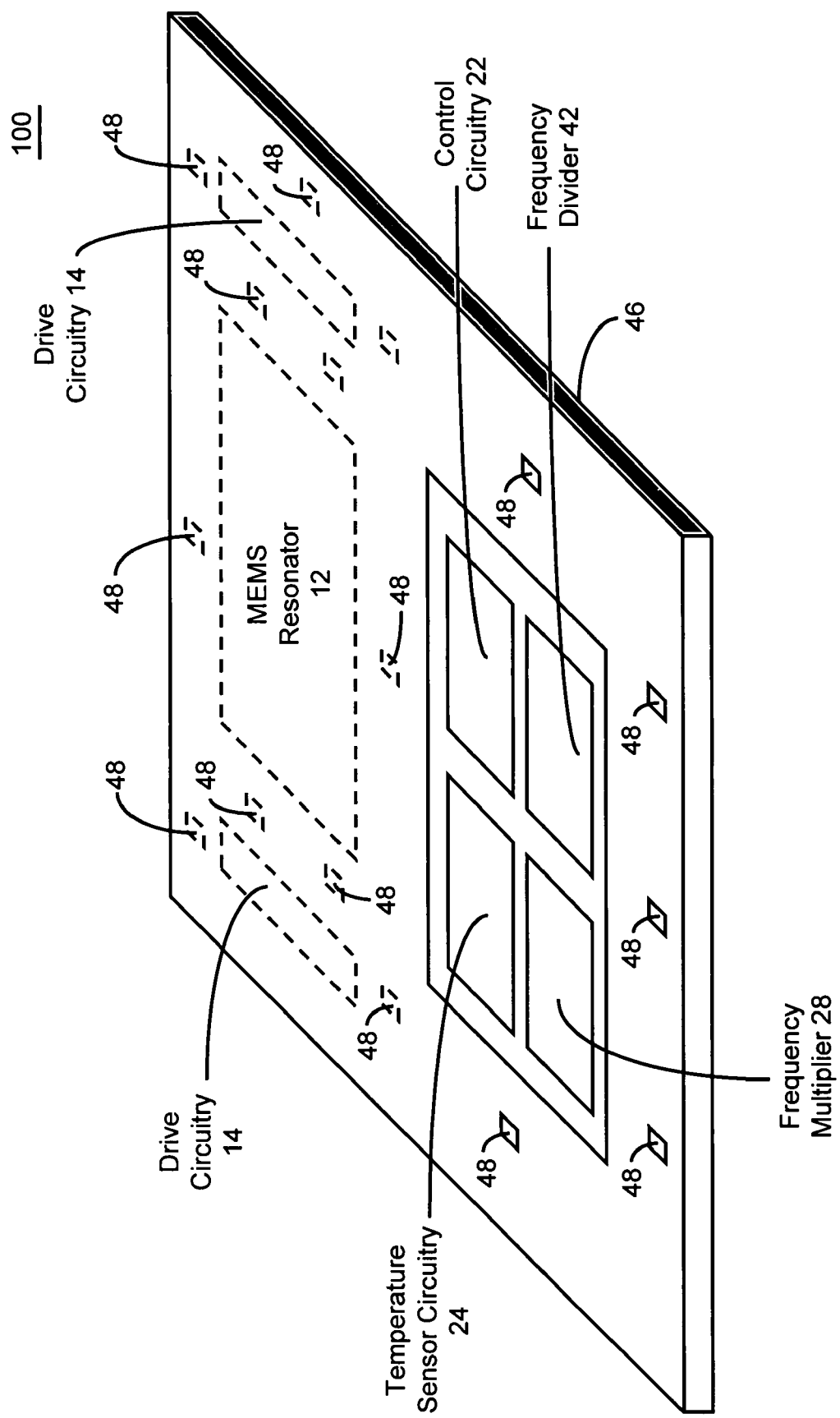
Figure 16A:
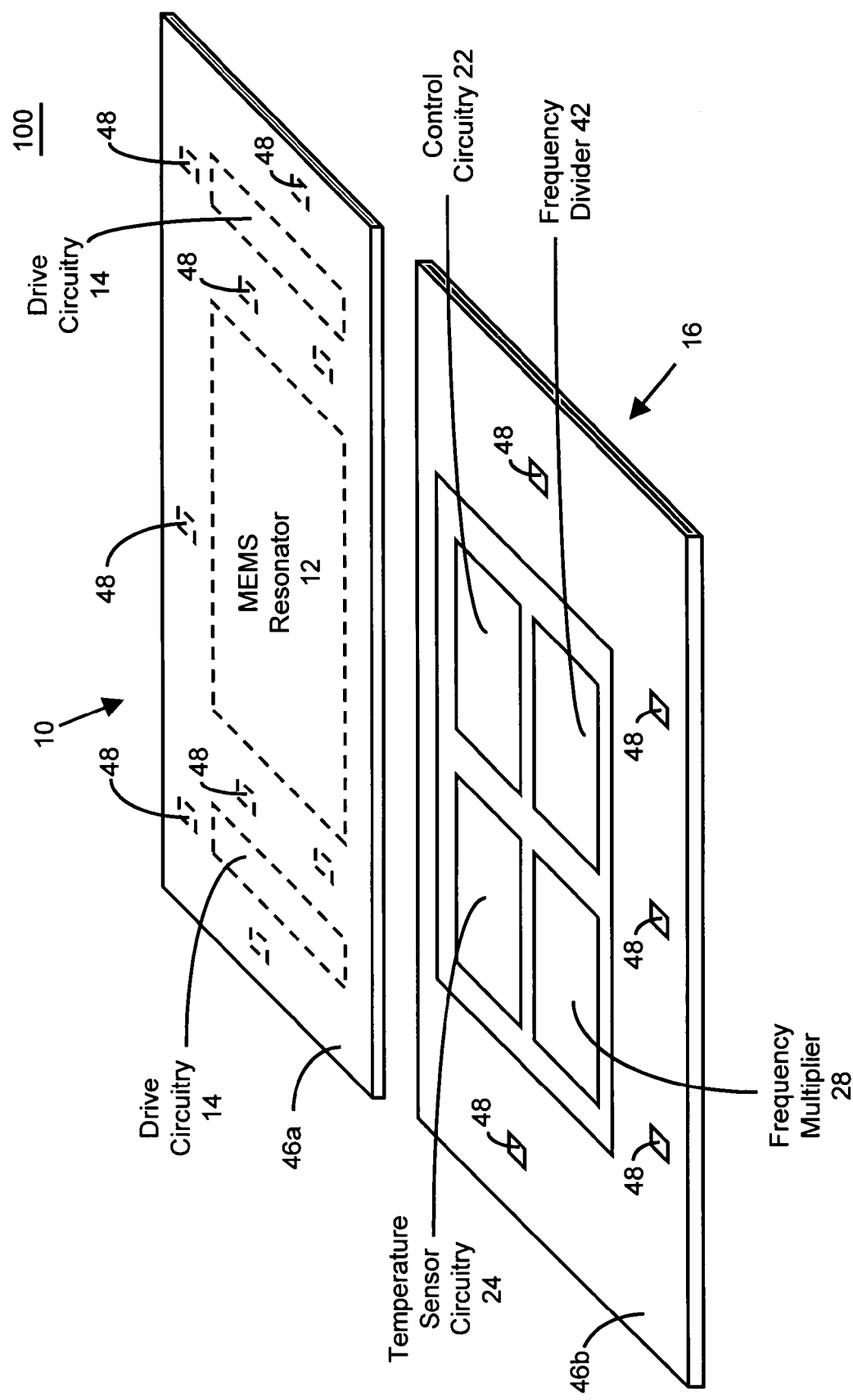
FIGS. 16A-16C illustrate plan view block diagram representations of compensated MEMS oscillators, wherein MEMS portion and the compensation and control circuitry are disposed on or in separate substrates, according to certain aspects of the present invention.
Figure 16B:
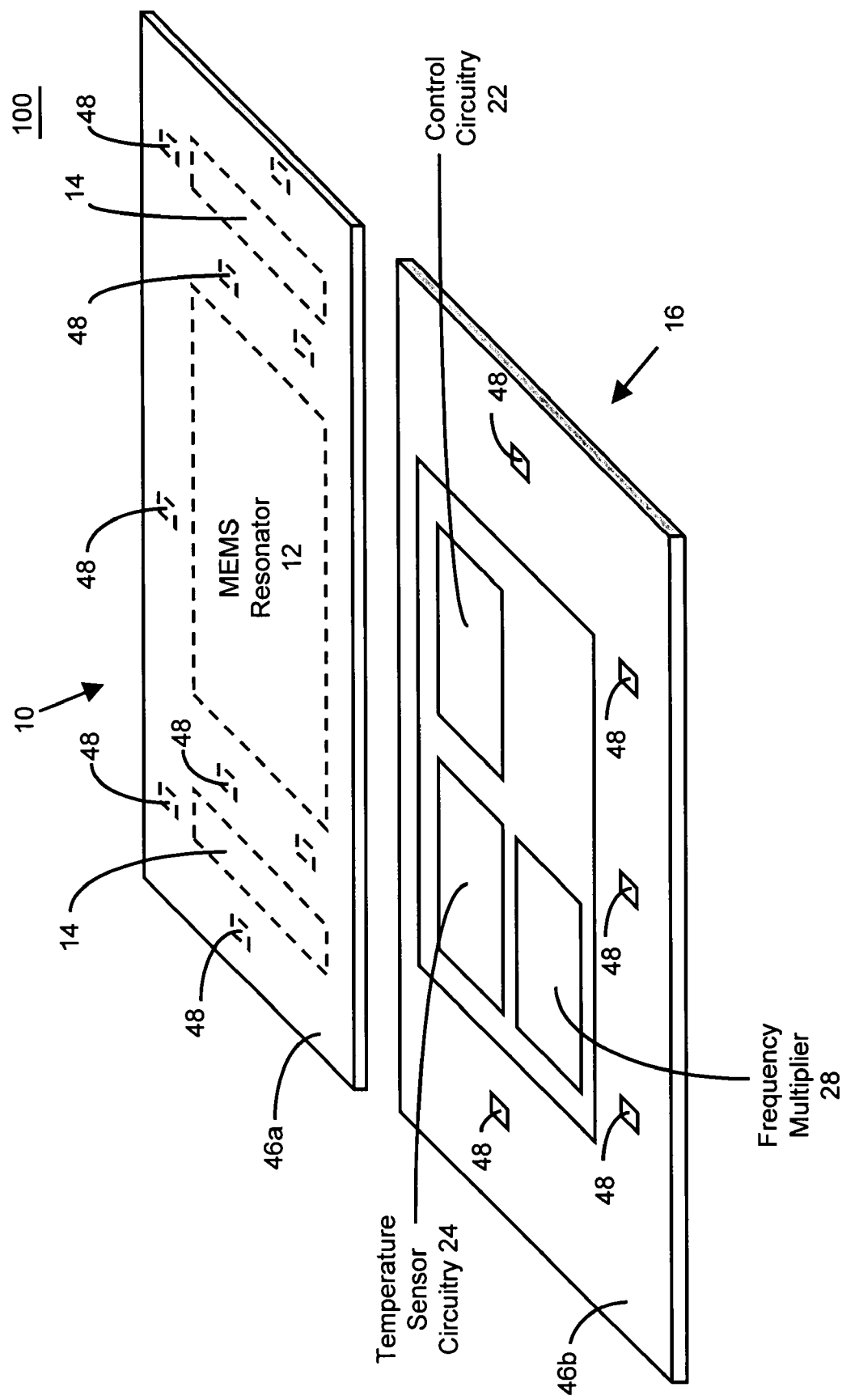
Figure 16C:
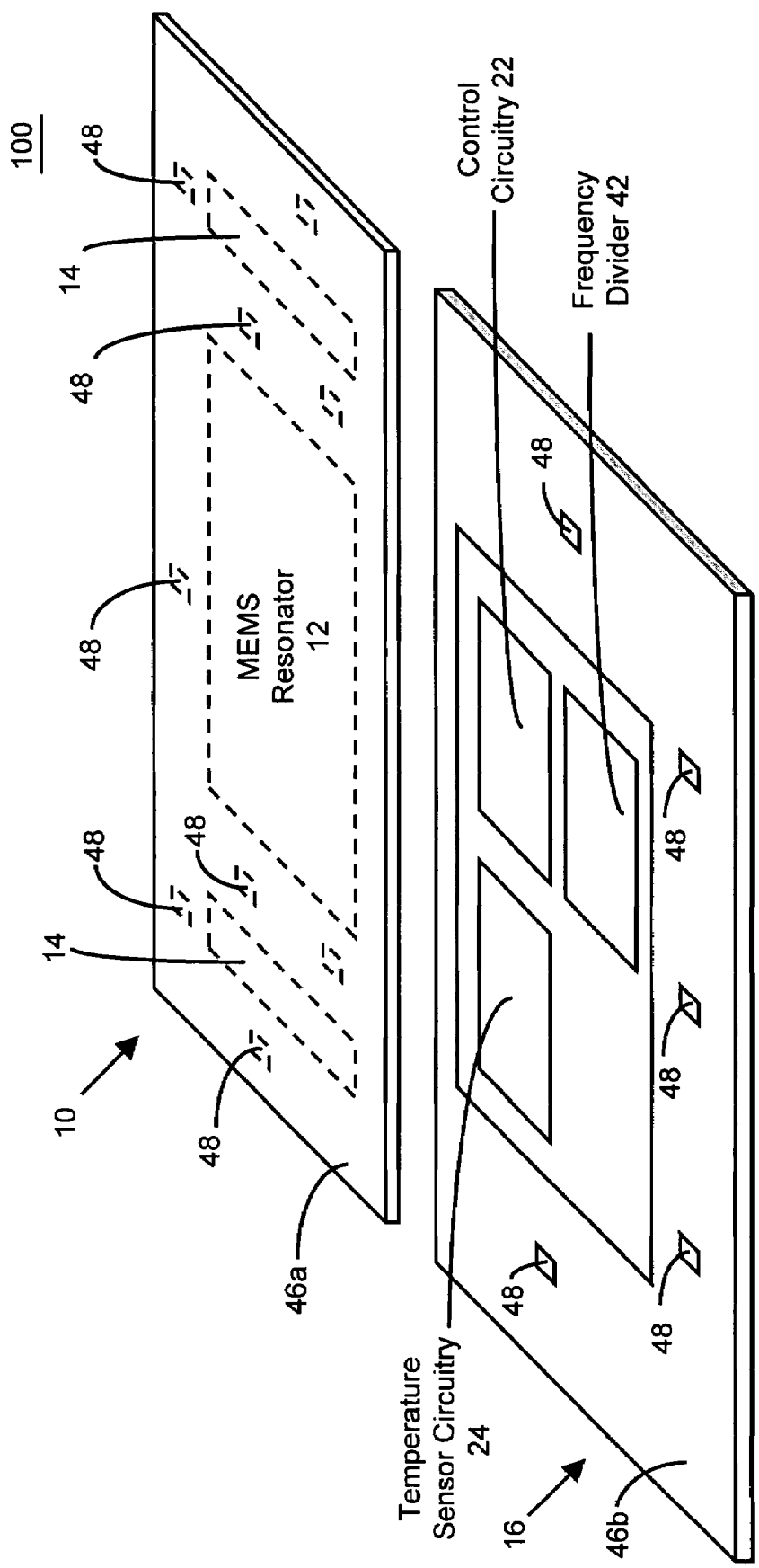

With reference to FIGS. 15B and 15F, temperature sensors 48 (which were generally identified as 26, for example, in the block diagram of FIGS. 2E, 10A, 14A and 14B) may be disposed and/or located at selected, significant and/or "critical" locations on the substrate of MEMS oscillator 10 and/or compensation and control circuitry 16 to provide control circuitry 22 and/or temperature sensor circuitry 24 with temperature information that may be significant to determine or calculate parameters, references, values and/or coefficients for compensation circuitry 18. The temperature sensors 48 may be, for example, diodes, transistors, resistors or varistors, and/or one or more MEMS structures which are disposed and/or located on or in the substrate of MEMS oscillator 10 and/or compensation and control circuitry 16. The temperature sensors may be integrated into MEMS oscillator 10 to sense, sample and/or detect the temperature of various, significant and/or critical portions of MEMS resonator 12 and/or compensation circuitry 18. Alternatively, or in addition to, temperature sensors may be discrete devices positioned and/or located above and/or below MEMS resonator 12 and/or compensation circuitry 18.

With continued reference to FIGS. 15B and 15F, temperature sensors 48 may be metal resistors (for example, platinum) disposed on the surface of substrate 46. In addition, or in lieu of, temperature sensors 48 may be implanted within substrate 46.

Notably, the data provided by temperature sensors 48 may be in a voltage or current that is in analog or digital form. That data may be, as described above, provided to temperature sensor circuitry 24, or more directly to control circuitry 22 for processing and analysis. Indeed, the data may be provided directly to compensation circuitry 18 for immediate processing, adjustment and/or control of the operation of compensation circuitry 18.

With reference to FIGS. 17A and 17B, in those instances where MEMS oscillator 10 and compensation and control circuitry 16 are fabricated on separate substrates, the various signals may be provided using wire interconnects 50 electrically interconnecting bond pads located on substrates 46a and 46b. Alternatively, a flip-chip configuration may be implemented. See, for example, FIG. 17C). As mentioned above, all packaging and interconnection technique, whether now known or later developed, are intended to fall within the scope of the present invention.

As mentioned above, MEMS oscillator 10 may be temperature compensated or uncompensated. The characteristics of the output signal of MEMS oscillator 10 (for example, frequency, amplitude and/or sensitivities) may be determined, measured, tested and/or analyzed before and/or after packaging. In this way, a reference of the output signal of MEMS oscillator 10 is determined and employed to calculate the parameters, references, values and/or coefficients for compensation and control circuitry 16 (for example, parameters and/or coefficients for the fractional-N PLL). Using the reference characteristics of the output signal of MEMS oscillator 10 facilitates adjustment, correction and/or control of the frequency and/or phase of output signal 30 of compensation circuitry 18. For example, where a fractional-N PLL is employed, control circuitry 22 may provide the data of the integer value for the main and auxiliary divider circuitry 42 and/or the values for the fractional-N divider circuitry to frequency multiplier circuitry 28 via data/control signal lines 32. Accordingly, the output signal(s) on signal line 30, after proper adjustment, correction and control, possess suitable, desired, predetermined attributes and/or characteristics (for example, frequency, phase, jitter, duty cycle, response time, and/or noise immunity).

The calibration of MEMS oscillator 10 may be completed before and/or after packaging. The calibration may be at one operating condition (for example, one temperature) or at multiple operating conditions. Indeed, the calibration may consist of fixing the frequency and temperature compensation (if any). Notably, however, in certain embodiments, no calibration is performed and any adjustment to the characteristics of the output signal of compensated MEMS 100 (due to the absence of calibration) may be addressed by compensation and control circuitry 16. In this embodiment, it may be advantageous to provide a range of programmability to account or compensate for eliminating and/or omitting typical calibration processes/techniques. For example, it may be advantageous to employ topologies or embodiments of compensation and control circuitry 16 that provide significant programmability in the event that the frequency of the output of MEMS 10 (for example, the initial frequency) varies significantly.

There are many inventions described and illustrated herein. While certain embodiments, features, materials, configurations, attributes and advantages of the inventions have been described and illustrated, it should be understood that many other, as well as different and/or similar embodiments, features, materials, configurations, attributes, structures and advantages of the present inventions that are apparent from the description, illustration and claims. As such, the embodiments, features, materials, configurations, attributes, structures and advantages of the inventions described and illustrated herein are not exhaustive and it should be understood that such other, similar, as well as different, embodiments, features, materials, configurations, attributes, structures and advantages of the present inventions are within the scope of the present invention.

For example, while many of the exemplary embodiments mention implementing PLLs, DLLs, digital/frequency synthesizers and/or FLLs, other suitable clock alignment circuitry may be employed. In this regard, compensation circuitry 18 may employ an RC, RCL, ring-oscillator, and/or frequency modulation synthesizer. Indeed, any clock or signal alignment circuitry, whether now known or later developed, may be employed to generate an output signal having precise and stable characteristics (for example, frequency and/or phase).

Figure 23A:
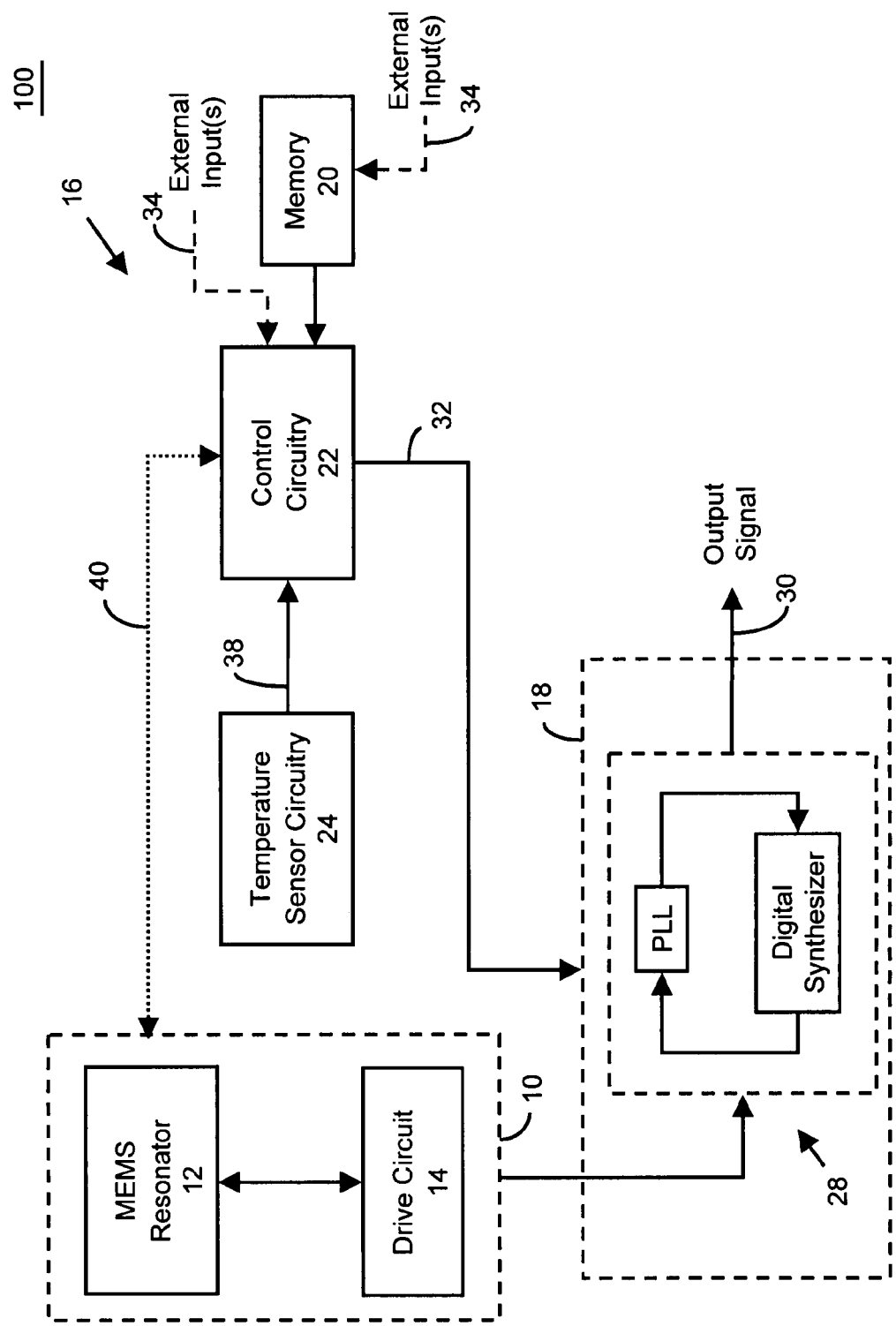
FIGS. 23A-23C and 24A-24I illustrate exemplary permutation and/or combination of the specific clock or signal alignment circuitry that may be employed for the various topologies of the compensation circuitry.
Figure 23B:
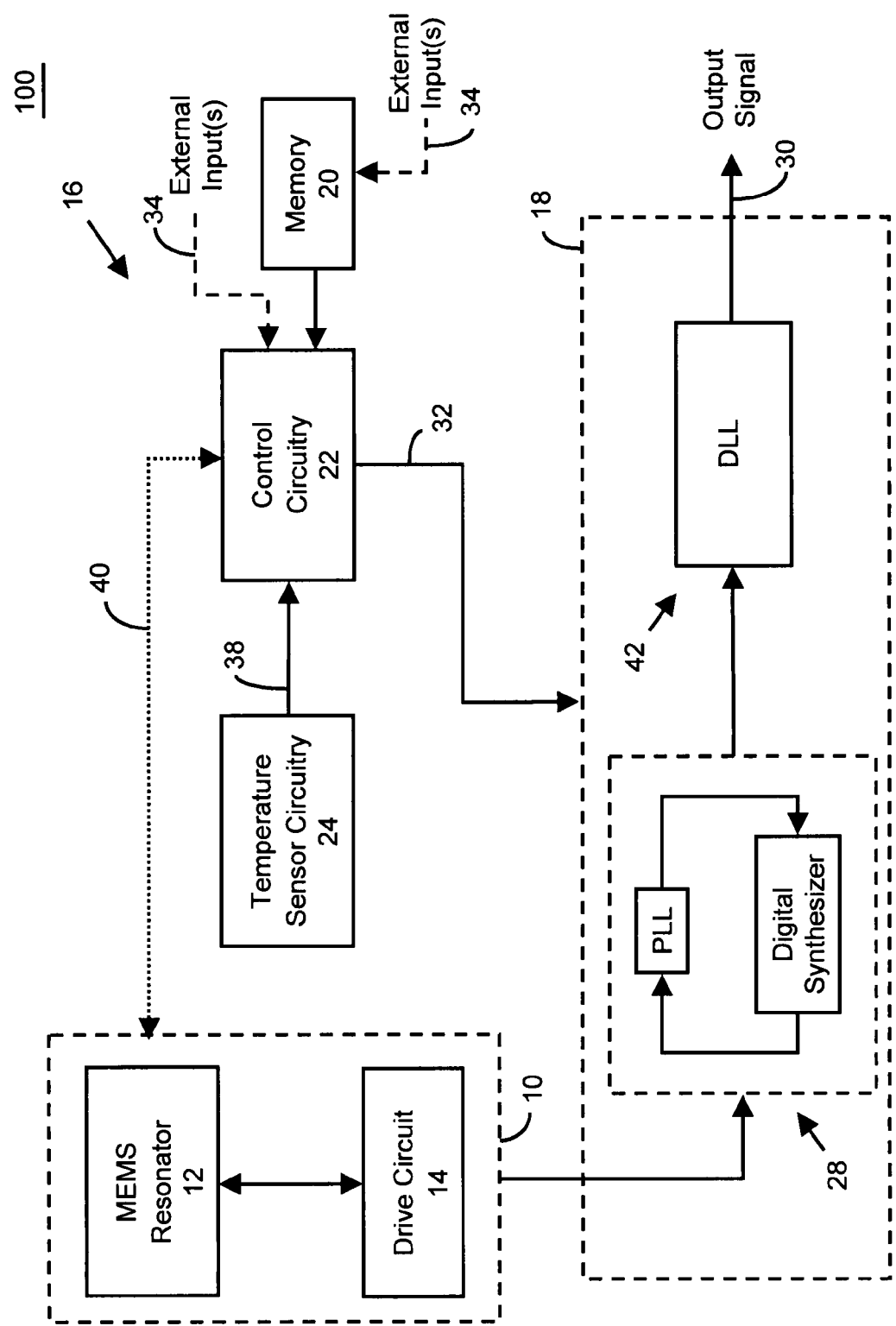
Figure 23C:
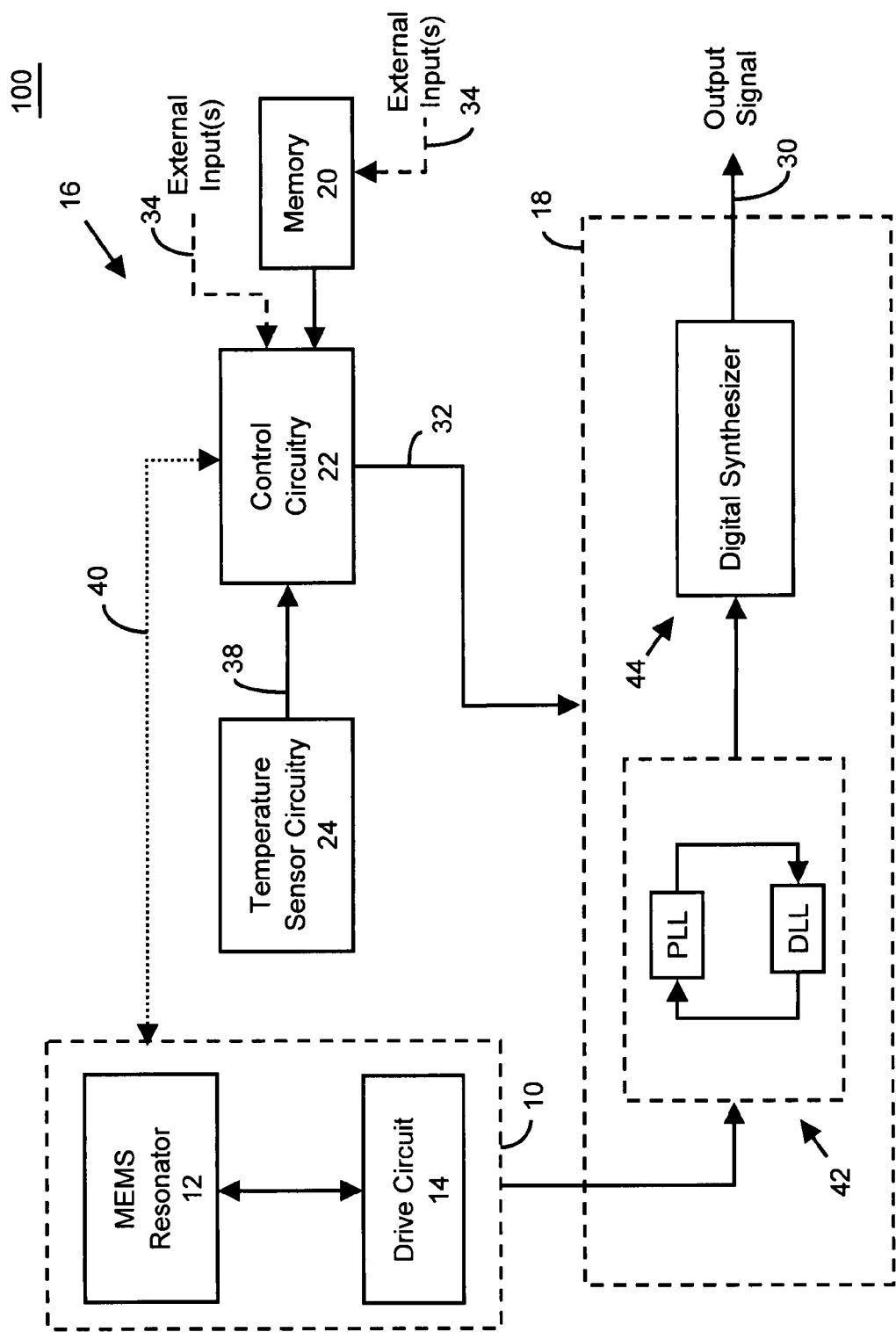
Figure 24A:
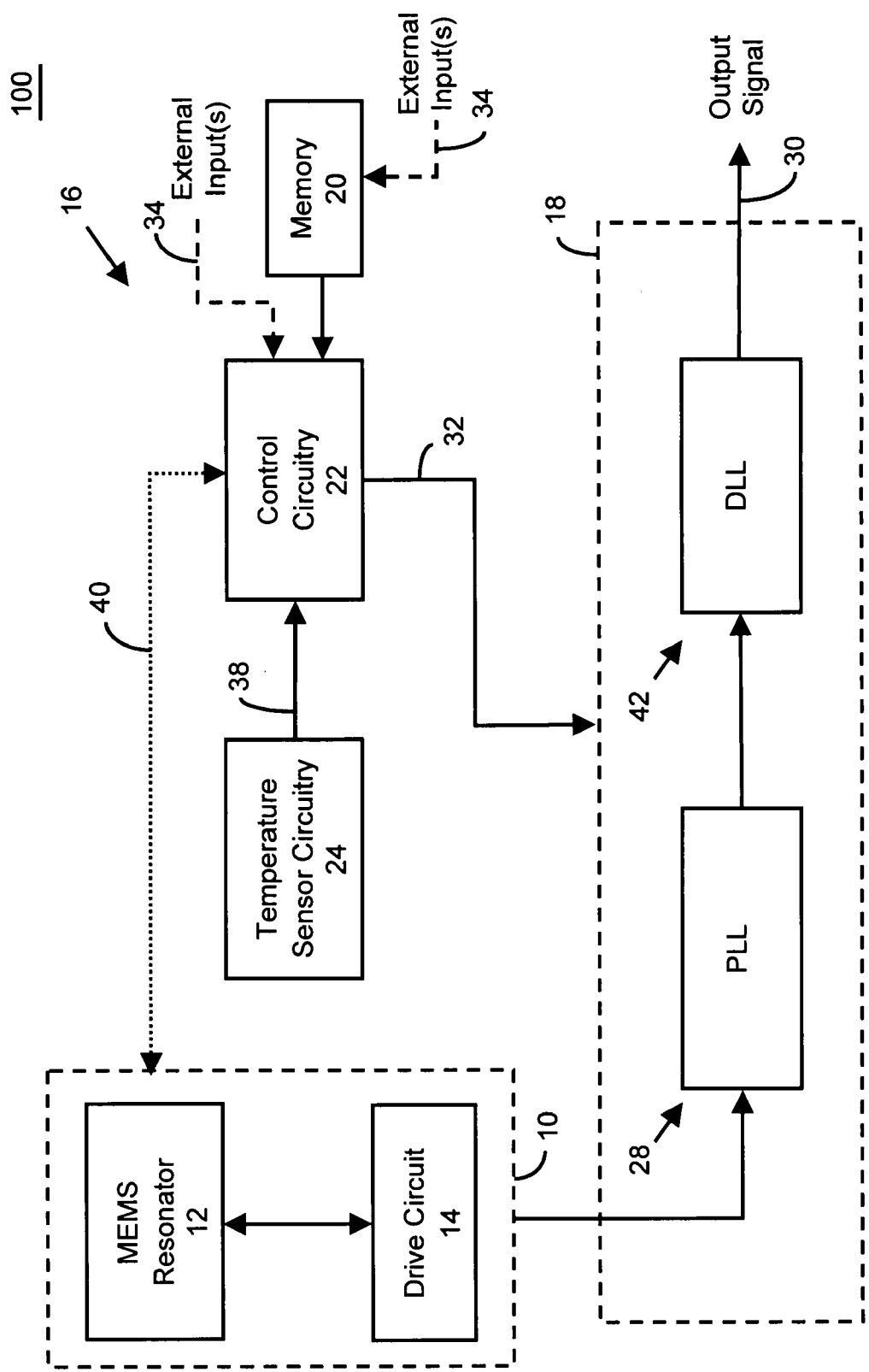
Figure 24B:
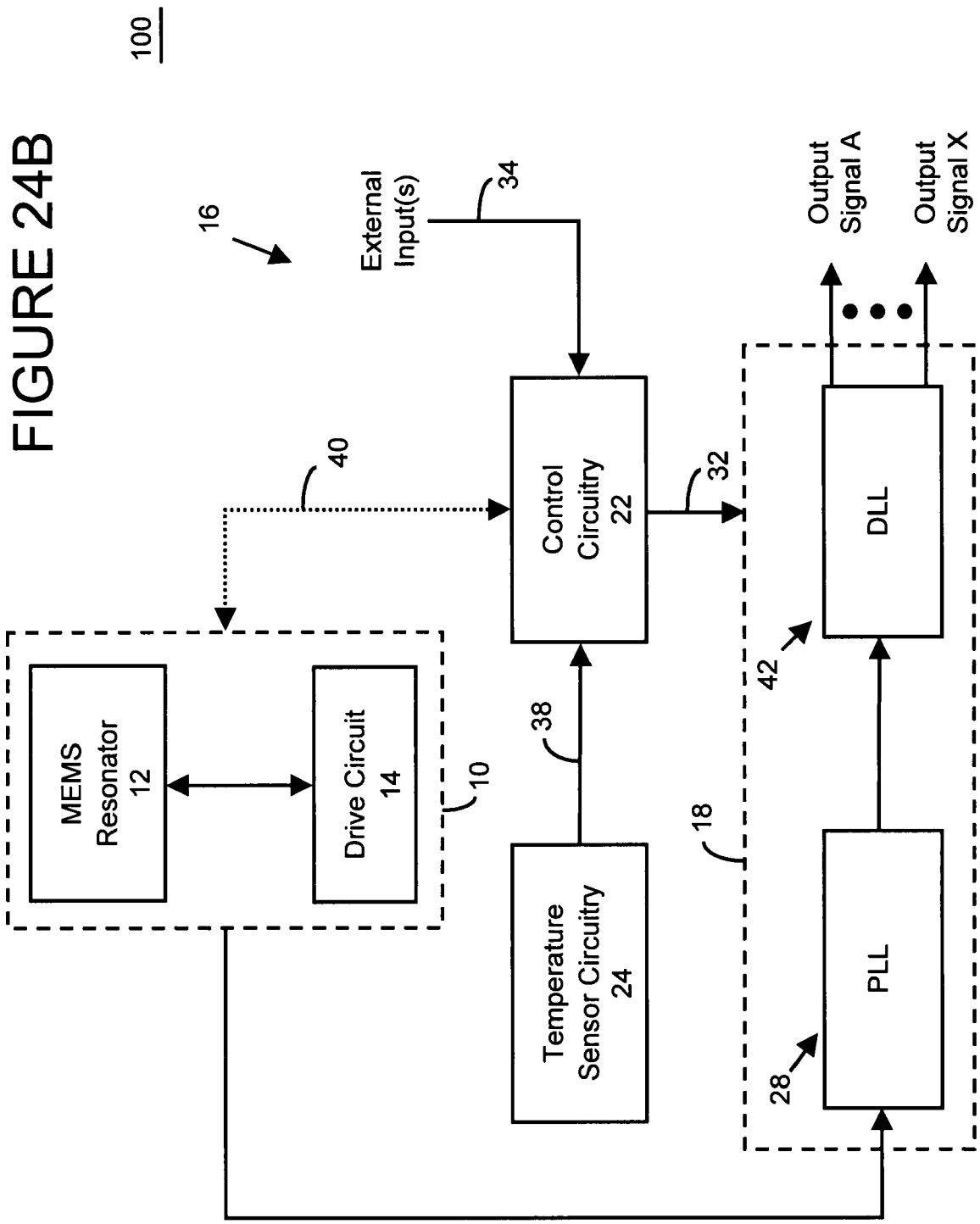
Figure 24C:
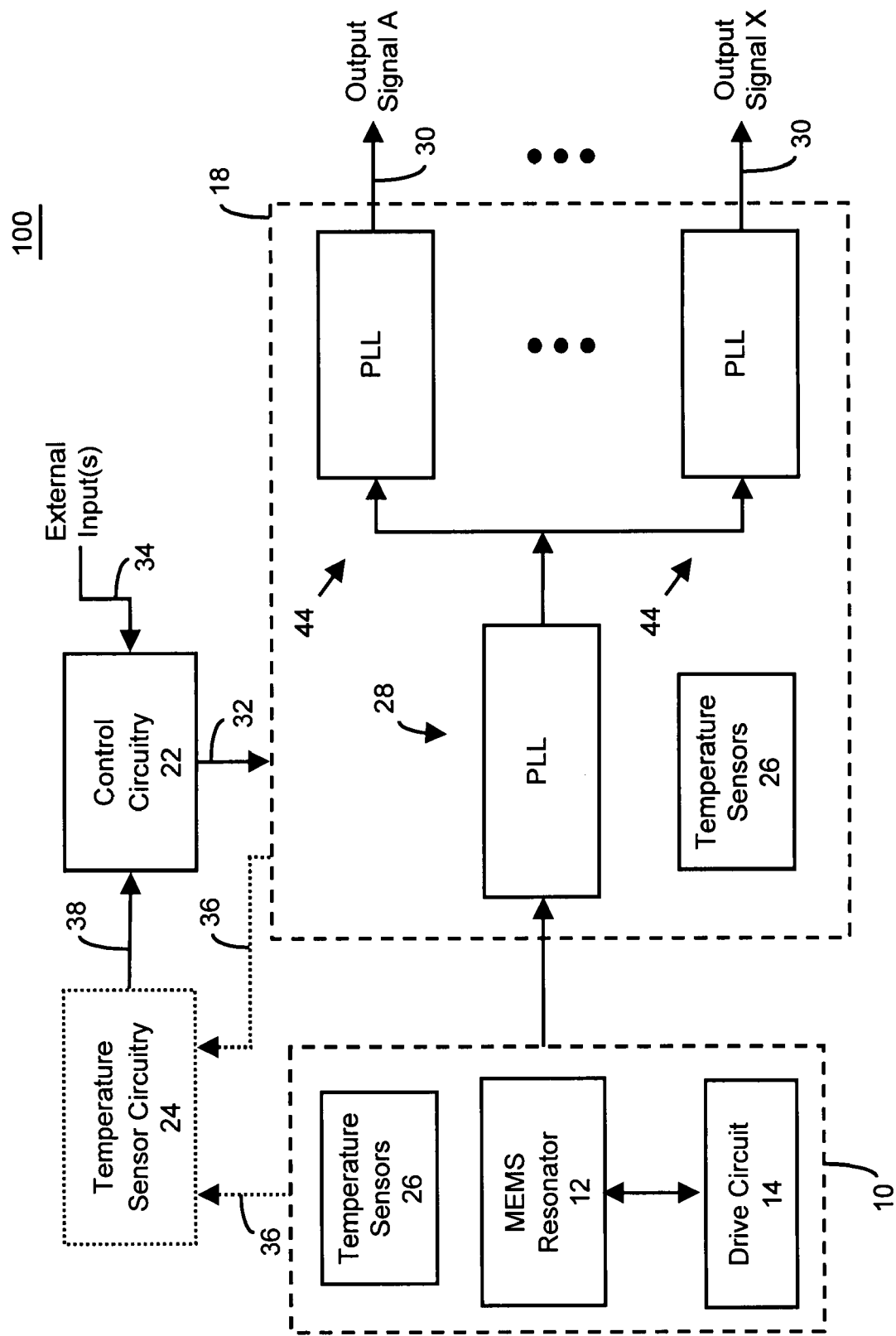
Figure 24D:
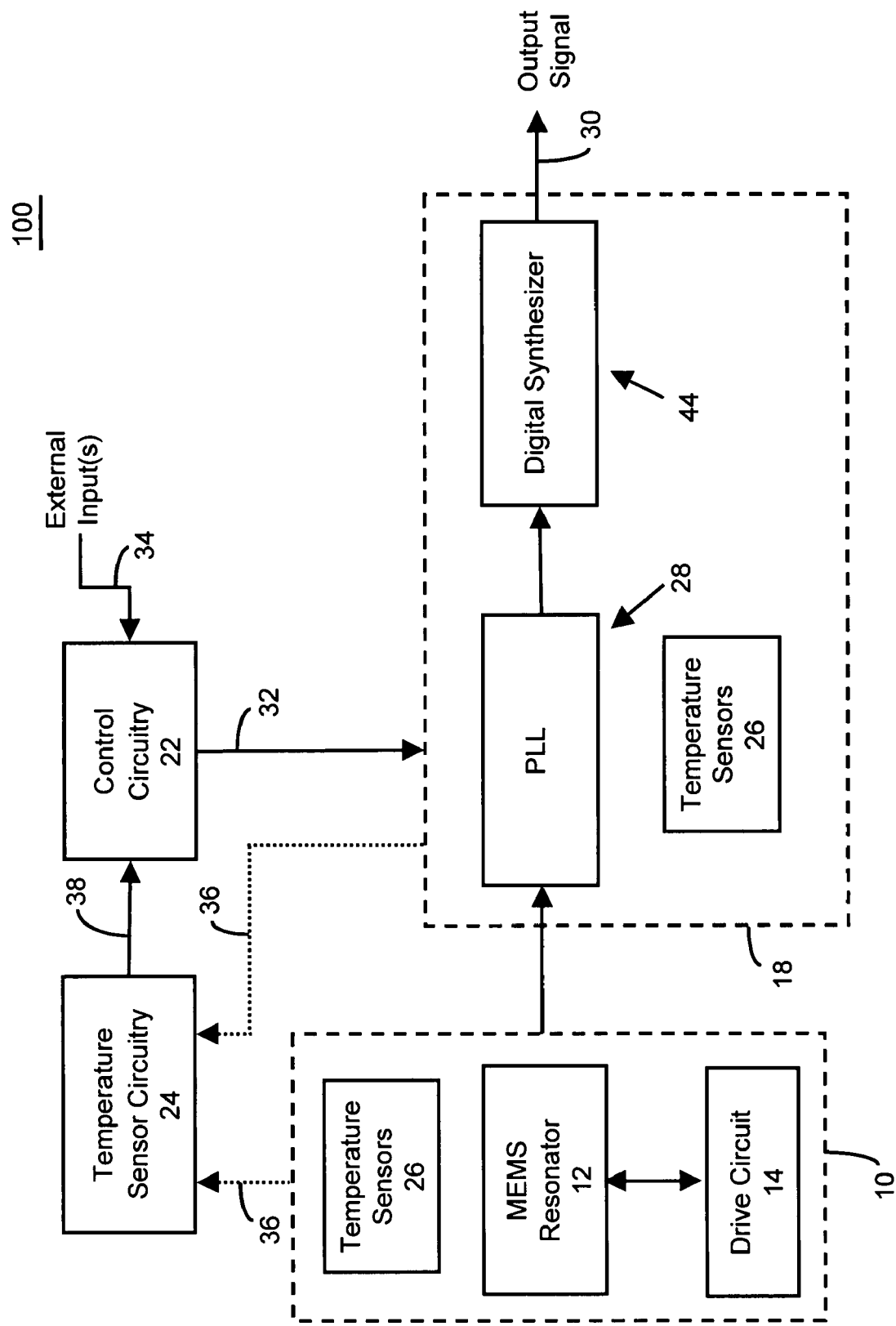
Figure 24E:
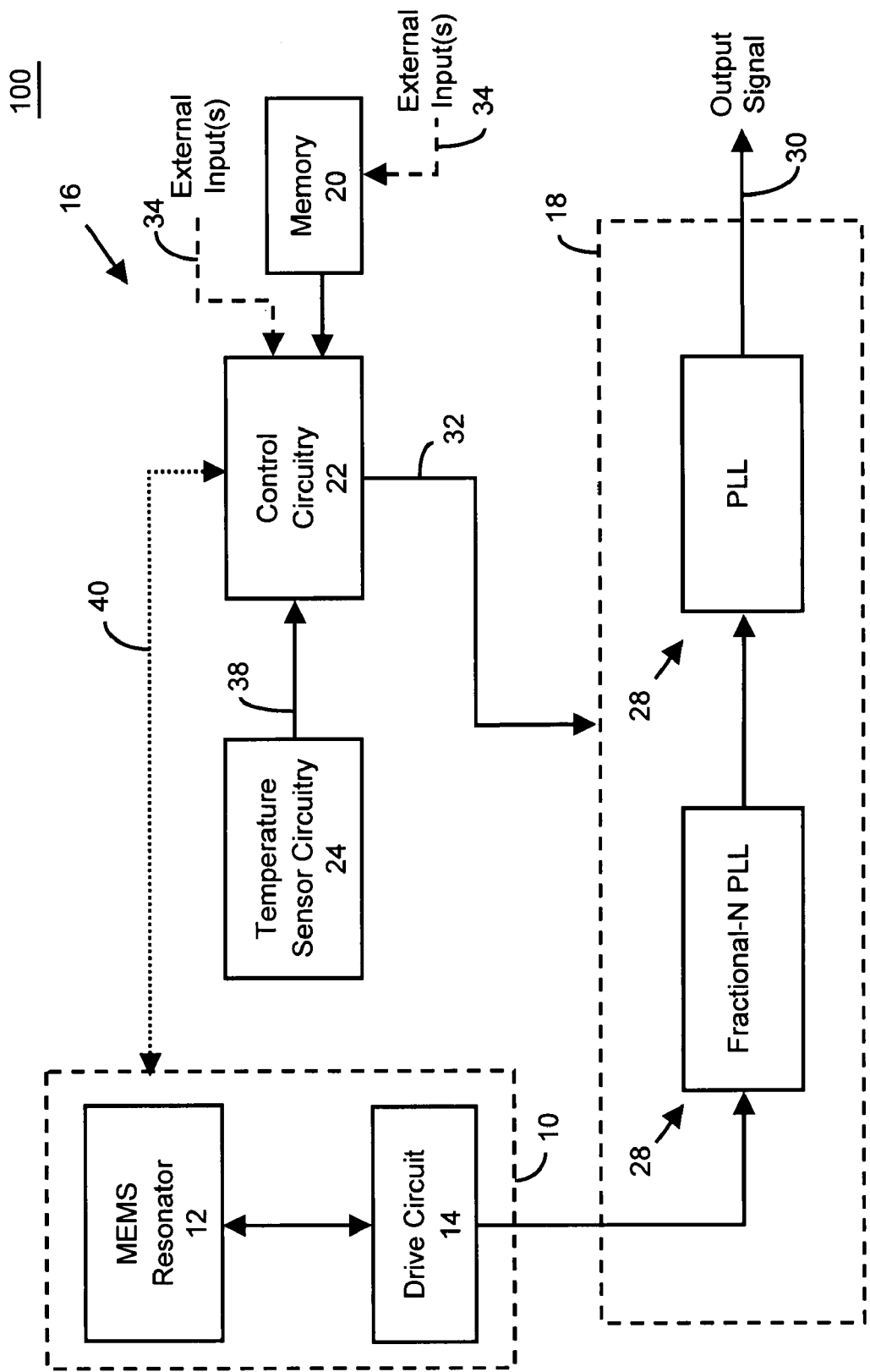
Figure 24F:
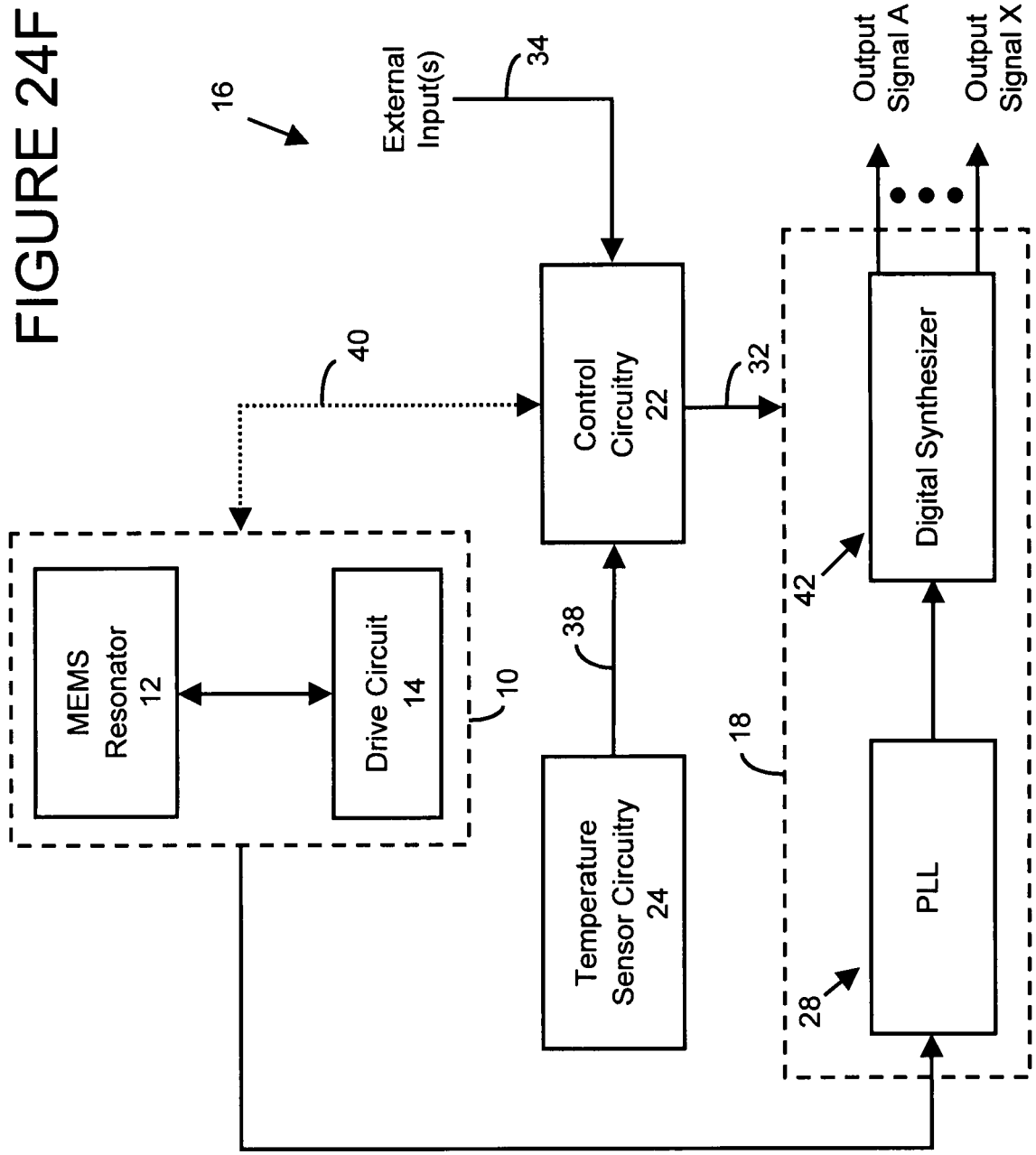
Figure 24G:
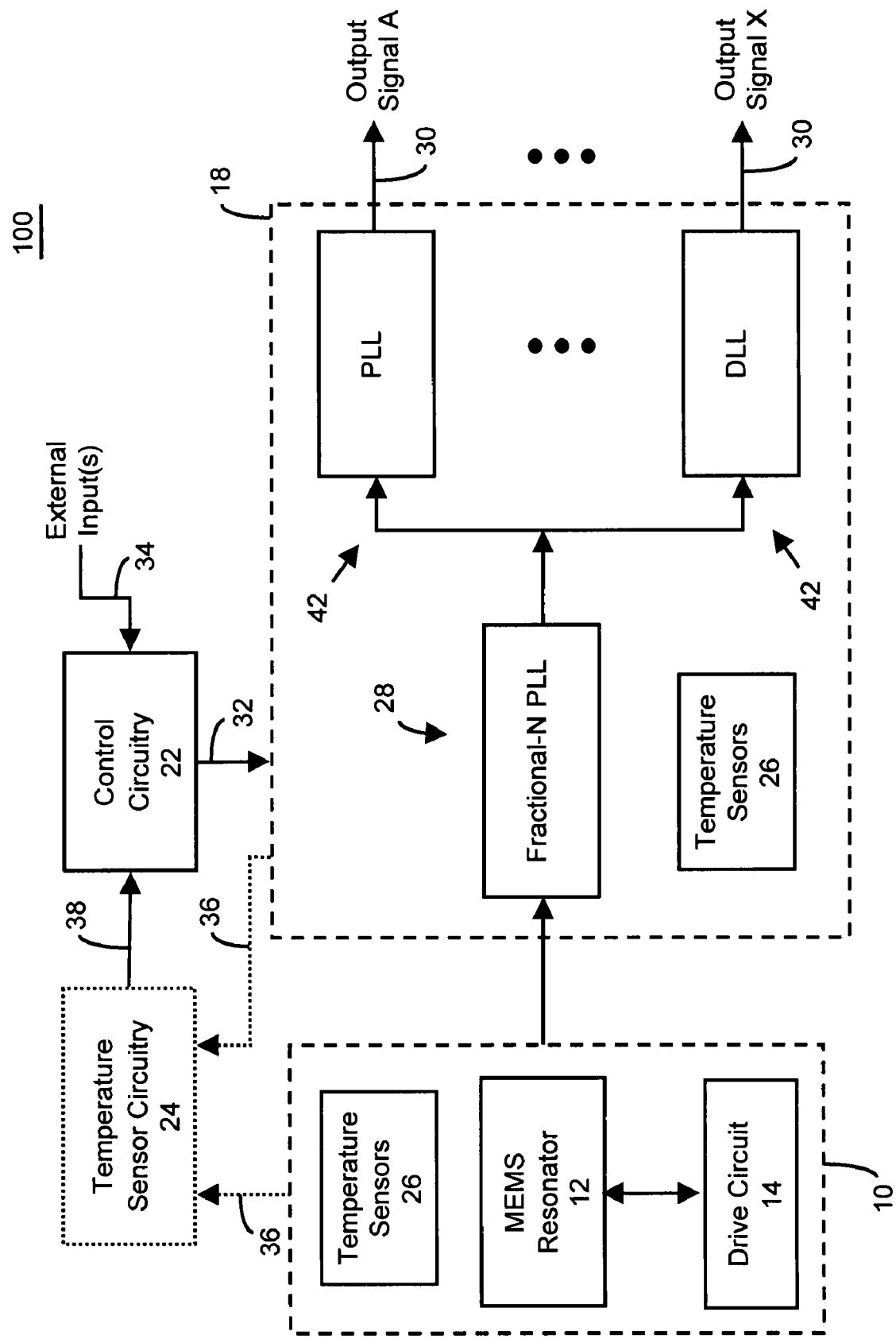
Figure 24H:
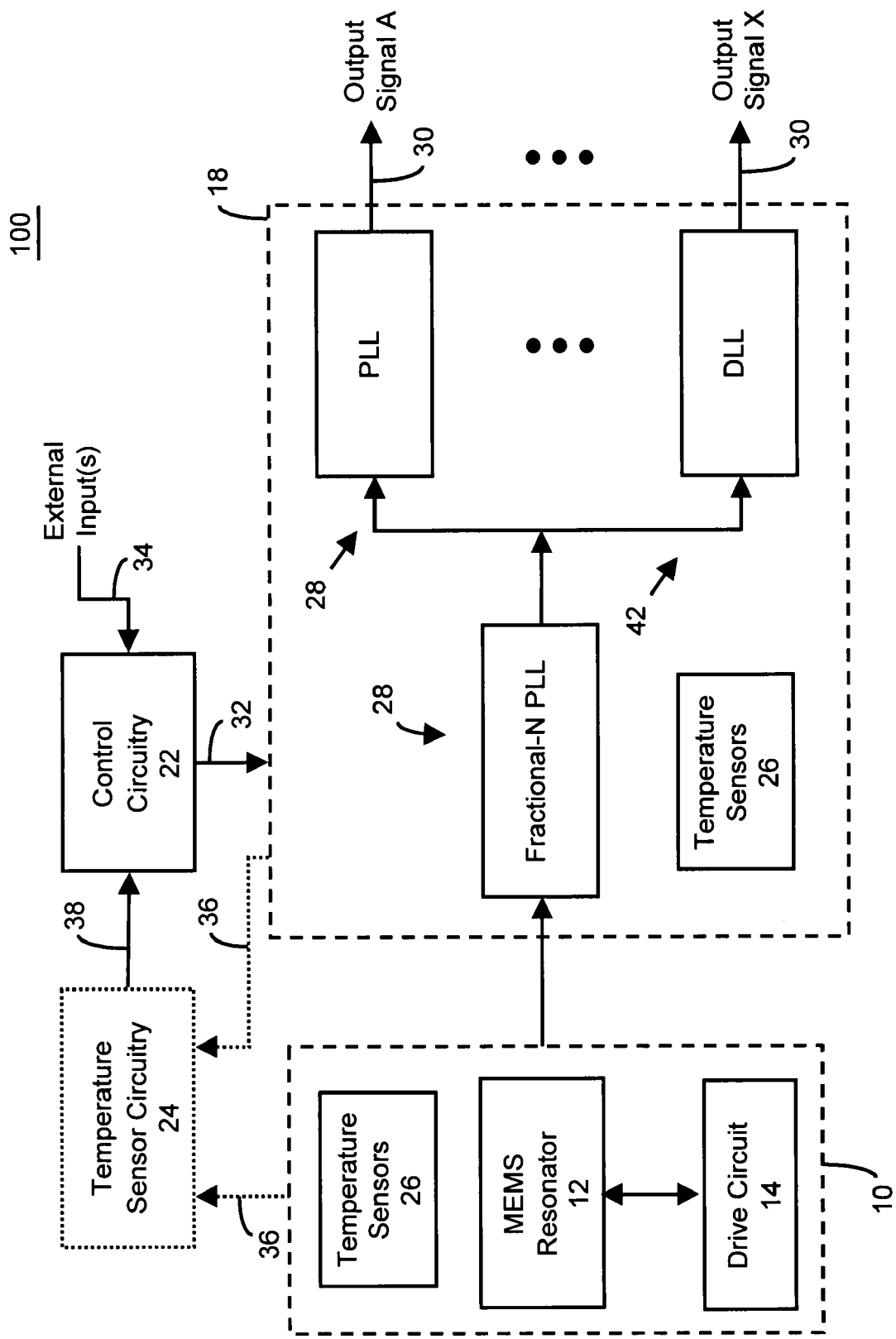
Figure 24I:
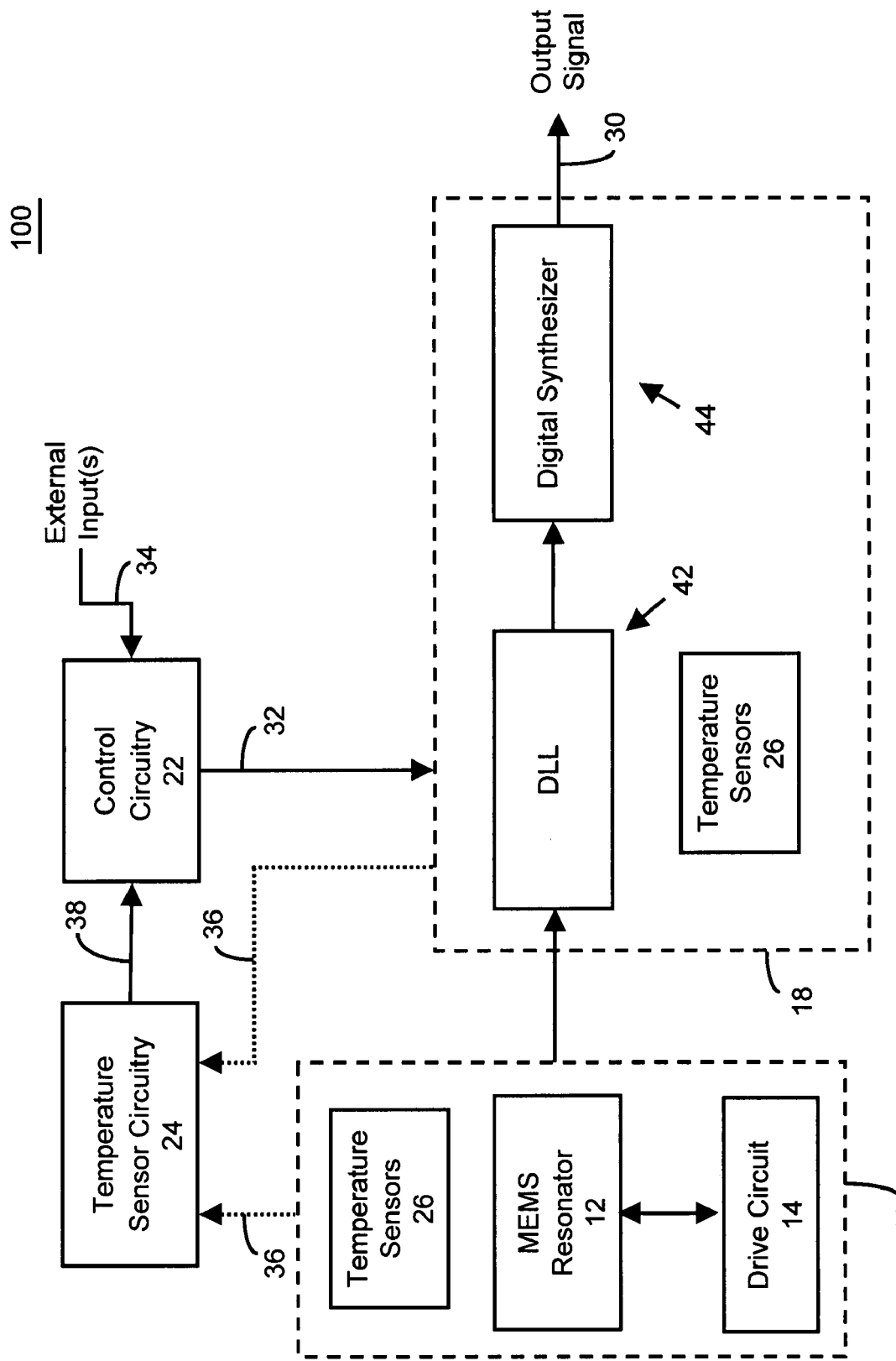

Similarly, frequency multiplier circuitry 28, frequency divider circuitry 42 and secondary frequency multiplier/divider circuitry 44 may be implemented using any clock or signal alignment circuitry described herein, for example, PLLs, DLLs, digital/frequency synthesizers (for example, DDS) and/or FLLs, as well as any combinations and permutations thereof (see, for example, FIGS. 23A-23C). Indeed, any permutation and/or combination of such clock or signal alignment circuitry may be employed for the topologies of compensation circuitry 18 (see, for example, FIGS. 23B, 23C and 24A-24I). Moreover, frequency multiplier circuitry 28, frequency divider circuitry 42, and secondary frequency multiplier/divider circuitry 44 may be comprised of and/or implemented using digital and/or analog circuitry.

The permutations and/or combinations of the clock or signal alignment circuitry may include circuitry for providing pre-compensation, intermediate or post-compensation of the signal before providing an output signal having desired and/or predetermined characteristics. Such pre-compensation, intermediate or post-compensation may be employed to optimize and/or enhance the characteristics of the signal relative to other circuitry in, for example, frequency multiplier circuitry 28, frequency divider circuitry 42, and secondary frequency multiplier/divider circuitry 44 and/or to enhance and/or optimize the overall system signal quality or characteristics (for example, phase noise). For example, frequency multiplier circuitry 28 may be comprised of pre-compensation circuitry that receives the output of MEMS oscillator 10, reduces the frequency and provides an output to other circuitry that multiplies the frequency of that output to another frequency that is higher than the frequency of the output of MEMS oscillator 10. (See, for example, FIG. 23A). Similarly, frequency divider circuitry 42 may be comprised of pre-compensation circuitry that receives the output of MEMS oscillator 10 and increases the frequency of the output signal of MEMS oscillator 10 before dividing the frequency to another frequency that is lower than the frequency of the output of MEMS oscillator 10. (See, for example, FIG. 23C).

In addition, it should be noted that while clock or signal alignment circuitry may on average adjust, compensate, control, program, and/or define in a particular manner, for example, increase/multiply or reduce/divide the frequency of an input signal, such circuitry may, at certain moments or periods, increase/multiply the frequency and at other moments or periods reduce/divide the frequency (for example, as the operating temperature of the system 100 varies). Accordingly, while on average frequency divider circuitry 42 reduces/divides the frequency of an input signal, at certain moments or periods, frequency divider circuitry 42 may actually increase/multiply the frequency in order to provide appropriate output signal characteristics.

Moreover, as mentioned above, compensated MEMS oscillator 100 may be fully integrated or partially integrated. (See, for example, FIGS. 15A-17C). Indeed, each of the elements and/or circuitry of MEMS 10 and compensation and control circuitry 16 may be discrete components, for example, discrete drive circuits, MEMS resonators, loop filter capacitors and/or resistors.

For example, although drive circuitry 14 has been illustrated as integrated with MEMS resonator 12 on substrate 46a, drive circuitry 14 may be disposed or integrated on substrate 46b. With reference to FIGS. 19A-19D, drive circuitry 14 is integrated on substrate 46b with compensation and control circuitry 16. In this way, the fabrication of compensated MEMS oscillator 100 may be more efficient and less costly than those embodiments where drive circuitry 14 is disposed on the same substrate as MEMS resonator 12.

Figure 20:
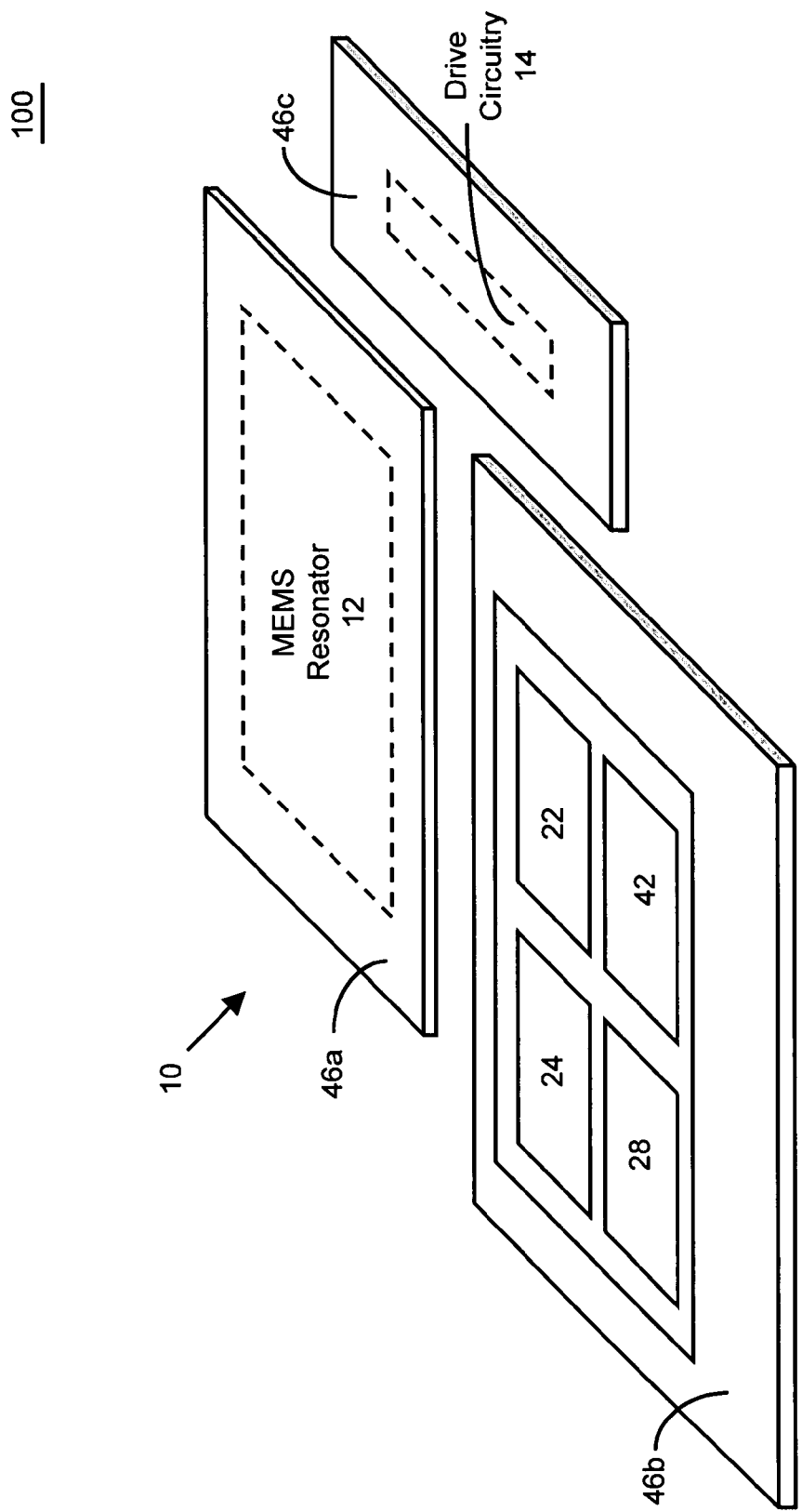
FIG. 20 illustrates a plan view block diagram representation of a compensated MEMS oscillators, wherein drive circuitry portion of the compensated MEMS oscillator is disposed on or in a substrate that is different from the substrates containing the MEMS resonator and compensation and control circuitry, according to certain aspects of the present invention.

Indeed, with reference to FIG. 20, drive circuitry 14 may be fabricated on a substrate that is different than MEMS resonator 12 and compensation and control circuitry 16. Notably, temperature sensors 48 may be incorporated and/or employed in these embodiments using any manner or configuration as described herein (See, for example, the alternative configurations, layouts and/or topologies of FIGS. 19A-19D).

Figure 21A:
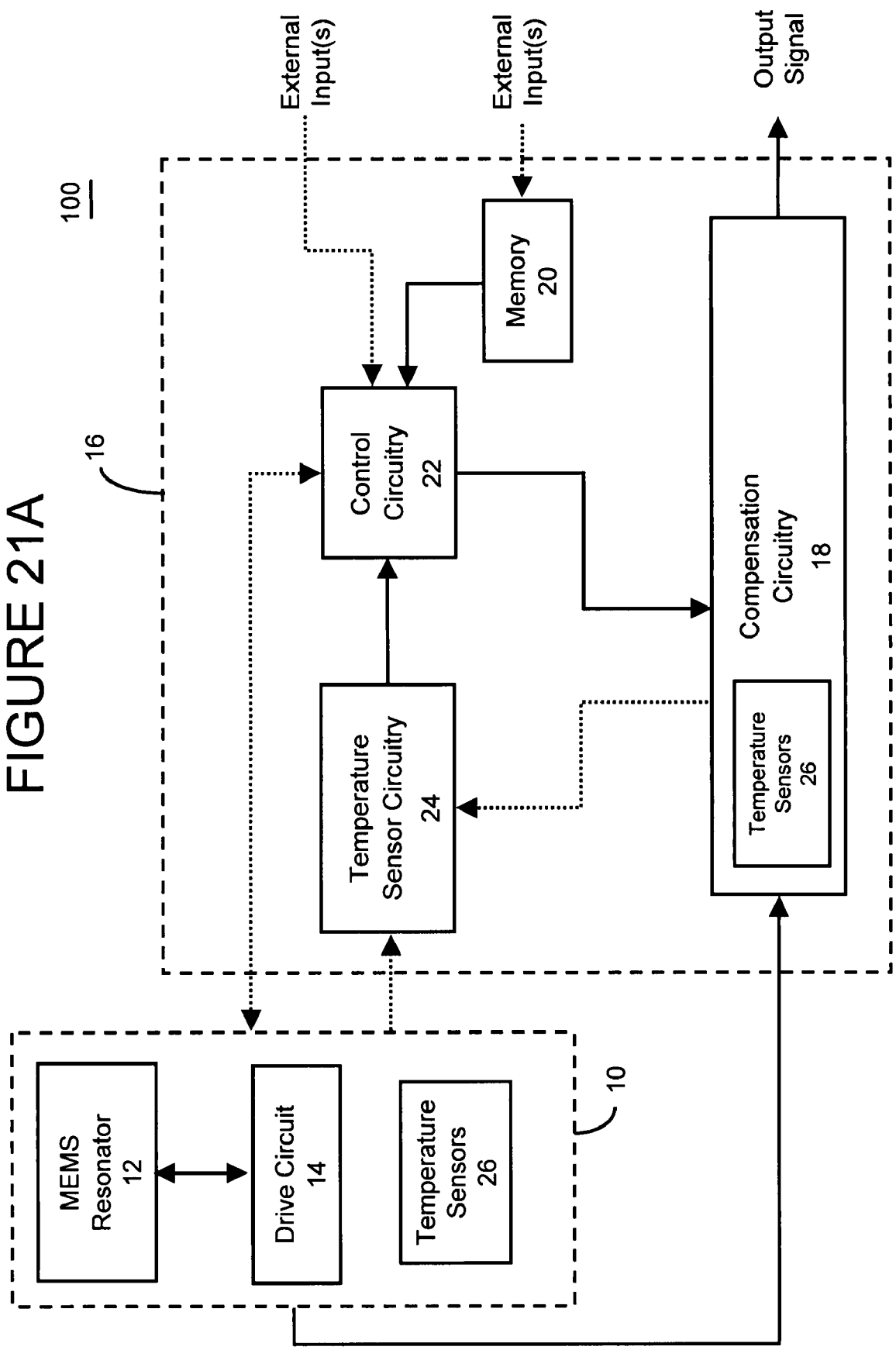
FIGS. 21A and 21B are block diagram representations of a frequency and/or phase compensated MEMS oscillator in accordance with certain aspects of the present inventions.
Figure 21B:
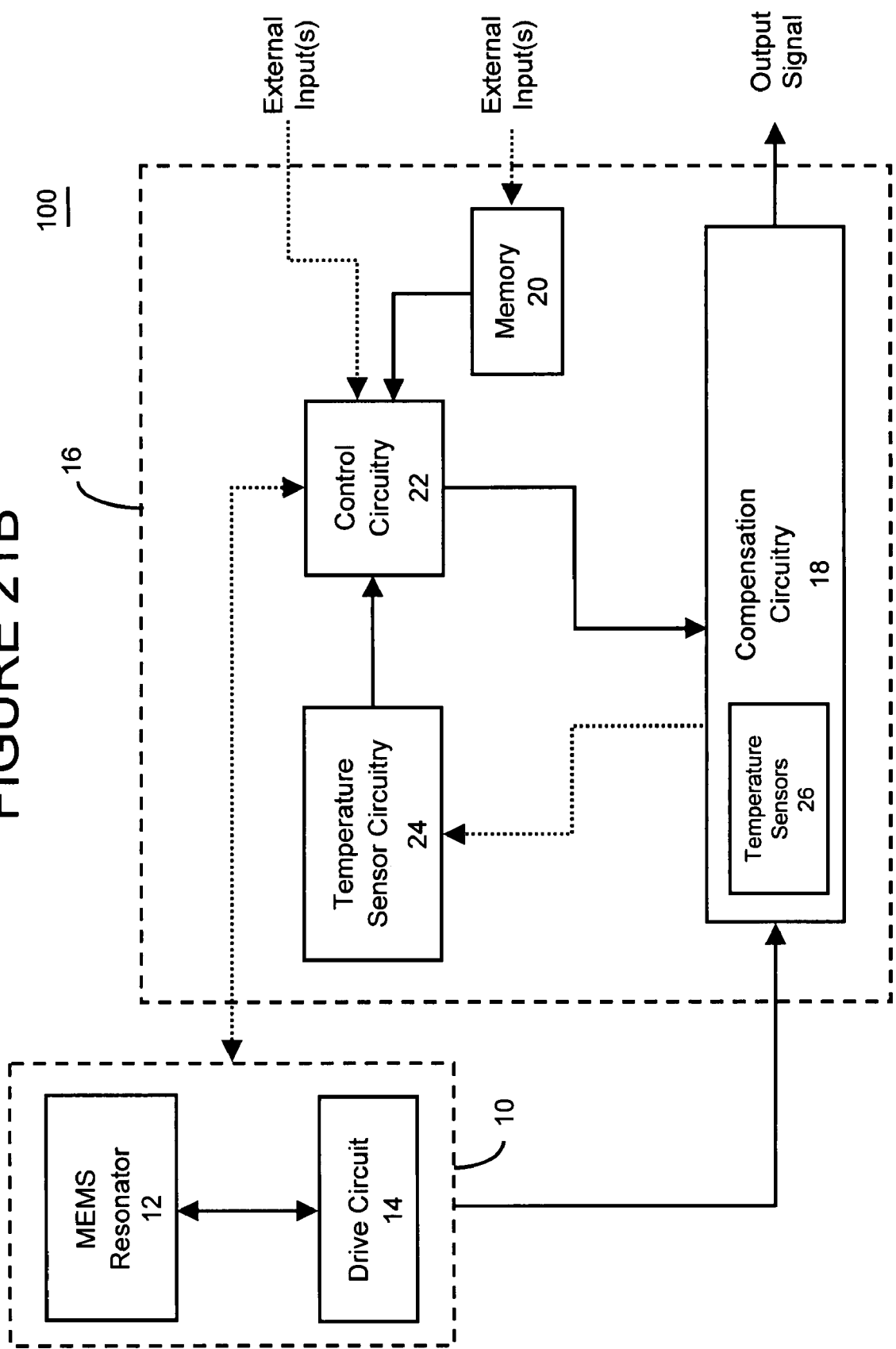

Further, while the exemplary embodiments and/or techniques of the inventions have been described with a certain configuration. For example, in certain illustrations, temperature sensor circuitry 24 receives data (which is representative of the ambient temperature of or in a given location) from MEMS oscillator 10. The temperature sensor circuitry 24 may also receive data from compensation and control circuitry 16 in lieu of, or in addition to the temperature "data" received from MEMS oscillator 10. (See, FIGS. 21A and 21B). In this regard, the output signal of MEMS oscillator 100 may be compensated for the affects, modifications, changes and/or variations in the operating performance and/or characteristics of compensation and control circuitry 16 due to temperature changes.

Notably, it may be advantageous to design MEMS oscillator 10 to have an inverse temperature coefficient relationship to that of compensation circuitry 18. In this way, any impact on the characteristics of the output signal of MEMS 10 and the adjustment, correction, and/or control introduced by compensation circuitry 18 that is caused or due to changes in the operating temperature(s) may be minimized, reduced, canceled and/or offset.

In addition, although control circuitry 22 has been described and illustrated as being resident on or in the substrate containing compensation and control circuitry 16, control circuitry 22 may be remote, discrete and/or separate therefrom. In this regard, temperature compensation calculations may be performed by a remote and/or discrete general-purpose processor (which may have different or several primary or main functions and/or purposes) and provided to frequency/phase compensated MEMS 100. In this way, the general-purpose processor may perform its primary tasks, functions and/or purposes and, for example, periodically (for example, every 1/10 of a second) or intermittently re-calculate new, suitable, optimum and/or enhanced parameters, references, values and/or coefficients employed by compensation circuitry 18 in order to generate and/or provide an adjusted, corrected and/or controlled output having, for example, a desired, selected and/or predetermined frequency and/or phase. As such, compensated MEMS oscillator 100 may include less circuitry on the substrate (and more likely consumes lower power) but still compensates for temperature changes (which are often slow).

Notably, control circuitry 22 may be comprised of and/or implemented using digital and/or analog circuitry.

Further, temperature sensor circuitry 24 may also be discrete, remote and/or separate from frequency/phase compensated MEMS 100. The temperature circuitry 24 may be comprised of and/or implemented using digital and/or analog circuitry. In one embodiment, temperature sensors 48 may be integrated into or a part of temperature sensor circuitry 24. In this regard, the temperature sensors 48 are integrated into the circuits and/or circuitry of temperature circuitry 24.

As mentioned above, MEMS oscillator 10 may be partially temperature compensated (see, for example, FIG. 5A) or fully temperature compensated, or includes little to no temperature compensation (see, for example, FIGS. 4A and 6A).

In addition, MEMS resonator 12 and/or drive circuit 14 may employ any type of MEMS design and/or control, whether now known or later developed, including those discussed above in the Background of the Invention. For example, the MEMS resonator and/or drive circuit may include any of the designs and/or control techniques that are described and illustrated in the following non-provisional patent applications:

(1) "Temperature Compensation for Silicon MEMS", which was filed on Apr. 16, 2003 and assigned Ser. No. 10/414,793; and (2) "Frequency Compensated Oscillator Design for Process Tolerances", which was filed on Oct. 3, 2003 and assigned Ser. No. 10/679,115.

The inventions described and illustrated in the aforementioned patent applications may be employed to design, control and/or fabricate MEMS resonator 12 and/or drive circuit 14 of the present inventions. For the sake of brevity, those discussions will not be repeated. It is expressly noted, however, that the entire contents of the aforementioned patent applications, including, for example, the features, attributes, alternatives, materials, techniques and advantages of all of the inventions, are incorporated by reference herein.

Further, each substrate or chip may include one or more MEMS resonators and/or MEMS oscillator. In this way, the compensated MEMS oscillator may include a plurality of oscillators 100 on the substrate/chip wherein a first compensated MEMS oscillator 100a may provide a first output signal having a first set of characteristics and a second compensated MEMS oscillator 100b may provide a second output signal having a second set of characteristics. The first output signal may be a low frequency output signal generated by low power consumption circuitry and the second output signal may be a high frequency output signal generated by high power consumption circuitry. Thus, in one embodiment, the low frequency signal may run continuously and the high frequency signal may be intermittently used and turned on as needed. As such, in one aspect, this embodiment provides a technique for managing power consumption of a compensated MEMS oscillator according to the present invention.

In another technique to manage power consumption, frequency divider circuitry 42 may be programmable that provides an output signal of the compensated MEMS 100 frequency having, for example, a low frequency, for example, 1-100 Hz to maintain accurate time keeping (see, for example, FIGS. 10A and 10B). The frequency divider circuitry 42 may include low power circuitry having, for example, a fractional-N divider stage. In this way, the power consumption of compensated MEMS 100 (and, in particular, frequency divider circuitry 42) is consistent with and/or tailored to a given application (for example, time keeping applications which often require low power because power is provided by batteries). Other circuitry-power consumption topologies and/or configurations are contemplated, and, as such, all circuitry-power consumption topologies and/or configurations, whether now known or later developed, are intended to be within the scope of the present invention.

Notably, as mentioned above, the output signal of compensated MEMS oscillator 100 may be single ended or double ended (i.e., differential signaling). The "shape" of the output signal (for example, square, pulse, sinusoidal or clipped sinusoidal) may be predetermined and/or programmable. In this regard, information which is representative of the "shape" of the output signal may be stored or programmed in memory 20 during fabrication, test, calibration and/or operation. In this way, control circuitry 22 and/or compensation circuitry 18 may access memory 20 to such information during start-up/power-up, initialization, re-initialization and/or during normal operation of compensation circuitry 18.

In addition, or in lieu thereof, a user/operator or external circuitry/devices/systems (as mentioned above) may provide information which is representative of the "shape" of the output signal, via data signal lines 34, to set, change, enhance and/or optimize the characteristics of the output signal(s) on signal line 30. Such information may be provided directly to control circuitry 22, memory 20 and/or compensation circuitry 18.

Indeed, control circuitry 22 may introduce slight frequency variations as a function of an external command or analog signal. For example, such a configuration may simulate a voltage-controlled oscillator. Notably, any introduction of frequency variations as a function of an external command or analog signal may be incorporated into the compensation circuitry 18 (for example, frequency multiplier circuitry 28 or impressed onto the MEMS resonator 12).

The present invention may be implemented in, for example, computers, telephones, radios, GPS systems, and the like. The compensation and control functions of the present invention, among others, include: (1) compensation of "initial" frequency and/or phase errors, (2) compensation for temperature changes, (3) compensation of aging and other debilitating effects with data from external sources (for example, from cell phone base station data), (4) variation for external requirements like Doppler shift, and/or (5) modulation or spreading of the output signal. Indeed, the present invention may be used in essentially any application where a crystal oscillator is employed.

Figure 22B:
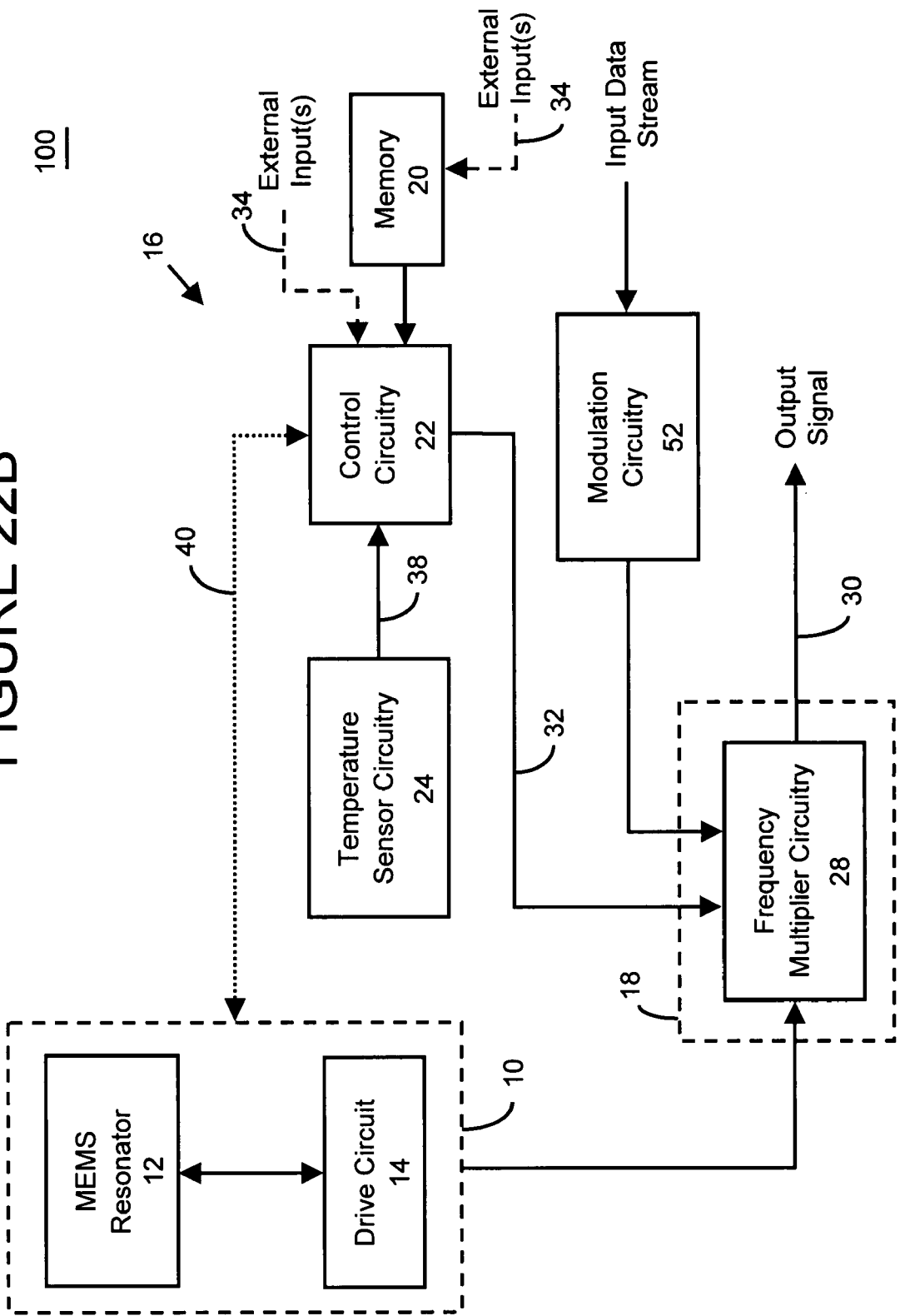

For example, in one embodiment, the present invention(s) may be employed in conjunction with modulation circuitry 52. In this regard, in those embodiments where the frequency and/or phase of the output signal may be changed, modified and/or altered dynamically during operation, that change, modification and/or alteration may represent information/data. With reference to FIGS. 22A and 22B, a data stream (i.e., input data stream) may be transmitted and/or encoded, using modulation circuitry 52, by altering the frequency and/or or phase of the output signal of compensation and control circuitry 16.

It should be noted that the present invention(s) may be employed in the context of PSK, FSK, QAM and QPSK signaling techniques, as well as modulation formats that encode fewer or more bits per transmitted symbol. Moreover, other communications mechanisms that use encoding tables or use other modulation mechanisms may also be used, for example, PAM-n (where n=2 to 16, for example), CAP, and wavelet modulation. In this regard, the techniques described herein are applicable to all modulation schemes, whether now known or later developed, including but not limited to, PSK, FSK, QAM and QPSK encoding; and, as such, are intended to be within the scope of the present invention.

It should be further noted that the term "circuit" may mean, among other things, a single component or a multiplicity of components (whether in integrated circuit form or otherwise), which are active and/or passive, and which are coupled together to provide or perform a desired function. The term "circuitry" may mean, among other things, a circuit (whether integrated or otherwise), a group of such circuits, a processor(s), a state machine, a group of state machines, software, a processor(s) implementing software, or a combination of a circuit (whether integrated or otherwise), a group of such circuits, a state machine, group of state machines, software, a processor(s) and/or a processor(s) implementing software, processor(s) and circuit(s), and/or processor(s) and circuit(s) implementing software.

The term "data" may mean, among other things, a current or voltage signal(s) whether in an analog or a digital form. The term "measure" means, among other things, sample, sense, inspect, detect, monitor and/or capture. The phrase "to measure" or similar, means, for example, to sample, to sense, to inspect, to detect, to monitor and/or to capture. The term "program" may mean, among other things, instructions, parameters, variables, software, firmware, microcode and/or configurable hardware conformation (for example, code stored in memory 20).

In the claims, the term "set of values", "values" or the like (for example, subset of values), means, among other things, parameters, references (for example, frequency and/or phase), values and/or coefficients, or the like.

What is claimed is:

1. A compensated microelectromechanical oscillator, comprising:
a microelectromechanical oscillator to generate an output signal wherein the output signal includes a first frequency, the microelectromechanical oscillator comprises:
a microelectromechanical resonator; and
drive circuitry, coupled to microelectromechanical resonator, to output a drive signal to the microelectromechanical resonator;
control circuitry, coupled to the drive circuitry, to output a control signal which adjusts the drive signal from the drive circuitry; and
frequency adjustment circuitry, coupled to the microelectromechanical oscillator to generate an output signal having a second frequency using the output signal of the microelectromechanical oscillator and a set of values, wherein the second frequency is greater than the first frequency.

2. The compensated microelectromechanical oscillator of claim 1 further including temperature sensor circuitry, coupled to the control circuitry, to provide data which is representative of operating temperature to the control circuitry.

3. The compensated microelectromechanical oscillator of claim 2 wherein the control circuitry determines the control signal using the data which is representative of operating temperature.

4. The compensated microelectromechanical oscillator of claim 3 wherein the control circuitry determines the control signal by calculating the control signal using the data which is representative of operating temperature.

5. The compensated microelectromechanical oscillator of claim 2 wherein the control circuitry determines the control signal using (i) the data which is representative of operating temperature and (ii) empirical data or a mathematical relationship.

6. The compensated microelectromechanical oscillator of claim 1 wherein the set of values is determined, at least in part, using information which is representative of the first frequency.

7. The compensated microelectromechanical oscillator of claim 6 wherein the first frequency depends, at least in part, on an operating temperature of the microelectromechanical resonator.

8. The compensated microelectromechanical oscillator of claim 1 wherein the set of values are determined using empirical data or mathematical modeling.

9. The compensated microelectromechanical oscillator of claim 1 wherein the set of values are determined during (i) testing of the microelectromechanical resonator and/or microelectromechanical oscillator, (ii) calibration of the microelectromechanical oscillator, and/or (iii) operation of the microelectromechanical oscillator.

10. A compensated microelectromechanical oscillator, comprising:
a microelectromechanical oscillator to generate an output signal wherein the output signal includes a first frequency, the microelectromechanical oscillator comprises:
a microelectromechanical resonator; and
drive circuitry, coupled to microelectromechanical resonator, to output a drive signal to the microelectromechanical resonator;
control circuitry, coupled to the drive circuitry, to: (i) determine a control signal using the data which is representative of temperature and (ii) output a control signal which adjusts the drive signal from the drive circuitry;
frequency adjustment circuitry, coupled to the microelectromechanical oscillator to generate an output signal having a second frequency using the output signal of the microelectromechanical oscillator and a set of values, wherein the second frequency is greater than the first frequency; and
memory, coupled to the frequency adjustment circuitry, to store the set of values.

11. The compensated microelectromechanical oscillator of claim 10 further including temperature sensor circuitry, coupled to the control circuitry, to provide data which is representative of an operating temperature to the control circuitry.

12. The compensated microelectromechanical oscillator of claim 11 wherein the memory further stores a look-up table relating the drive signal to an operating temperature.

13. The compensated microelectromechanical oscillator of claim 12 wherein the control circuitry determines the control signal using the data in the look-up table.

14. The compensated microelectromechanical oscillator of claim 11 wherein the control circuitry determines the control signal by calculating the control signal using the data which is representative of temperature.

15. The compensated microelectromechanical oscillator of claim 11 wherein the set of values is determined, at least in part, using information which is representative of the first frequency.

16. The compensated microelectromechanical oscillator of claim 15 wherein the set of values are determined using empirical data or mathematical modeling.

17. The compensated microelectromechanical oscillator of claim 11 wherein the set of values is determined, at least in part, using the operating temperature.

18. The compensated microelectromechanical oscillator of claim 17 wherein the set of values are determined during (i) testing of the microelectromechanical resonator and/or microelectromechanical oscillator, (ii) calibration of the microelectromechanical oscillator, and/or (iii) operation of the microelectromechanical oscillator.

19. A compensated microelectromechanical oscillator, comprising:
a microelectromechanical oscillator to generate an output signal wherein the output signal includes a first frequency, the microelectromechanical oscillator comprises:
a microelectromechanical resonator; and
drive circuitry, coupled to microelectromechanical resonator, to output a drive signal to the microelectromechanical resonator;
control circuitry, coupled to the drive circuitry, to output a control signal to the drive circuitry wherein the control signal adjusts the drive signal from the drive circuitry; and
frequency adjustment circuitry, coupled to the microelectromechanical oscillator to generate a plurality of output signals using (i) one or more sets of values and (ii) the output signal of the microelectromechanical oscillator wherein at least one of the output signals includes a frequency that is greater than the first frequency.

20. The microelectromechanical oscillator of claim 19 wherein the frequency adjustment circuitry includes first and second frequency multiplier circuitry which are one or more PLLs and/or one or more digital/frequency synthesizers.

21. The microelectromechanical oscillator of claim 20 wherein the PLLs are one or more fractional-N PLLs and/or one or more integer-N PLLs.

22. The microelectromechanical oscillator of claim 19 wherein the frequency adjustment circuitry includes first and second frequency multiplier circuitry and wherein:
the first frequency multiplier circuitry is a fractional-N PLL, an integer-N PLL, or a digital/frequency synthesizer; and
the second frequency multiplier circuitry is a fractional-N, PLL, an integer-N PLL or a digital/frequency synthesizer.

23. The microelectromechanical oscillator of claim 19 wherein the first frequency depends, at least in part, on an operating temperature of the microelectromechanical resonator and wherein the microelectromechanical oscillator further includes temperature sensor circuitry to determine information which is representative of the operating temperature of the microelectromechanical resonator, an operating temperature of the microelectromechanical oscillator or an operating temperature of the frequency adjustment circuitry.

24. The microelectromechanical oscillator of claim 23 wherein the values are determined during (i) calibration of the microelectromechanical oscillator or (ii) operation of the microelectromechanical oscillator.

25. The microelectromechanical oscillator of claim 23 further including temperature sensors to provide data which is representative of temperature to the temperature sensor circuitry.

26. The microelectromechanical oscillator of claim 19 wherein the first frequency depends, at least in part, on an operating temperature of the microelectromechanical resonator and wherein the microelectromechanical oscillator further includes temperature sensor circuitry, integrated in or on the common substrate, to determine information which is representative of (i) an operating temperature of the microelectromechanical resonator, (ii) an operating temperature of the microelectromechanical oscillator or (iii) an operating temperature of the frequency adjustment circuitry.

27. The microelectromechanical oscillator of claim 26 wherein the values are determined during (i) calibration of the microelectromechanical oscillator or (ii) operation of the microelectromechanical oscillator.

28. The microelectromechanical oscillator of claim 26 wherein more than one of the output signals include frequencies that are greater than the first frequency.

29. The microelectromechanical oscillator of claim 26 further including temperature sensors, integrated in or on the common substrate, to provide data which is representative of temperature to the temperature sensor circuitry.

30. A compensated microelectromechanical oscillator, comprising:
  a microelectromechanical oscillator to generate an output signal wherein the output signal includes a first frequency, the microelectromechanical oscillator comprises:
    a microelectromechanical resonator; and
    drive circuitry, coupled to microelectromechanical resonator, to output a drive signal to the microelectromechanical resonator;
  temperature sensor circuitry, coupled to the control circuitry, to provide data which is representative of an operating temperature to the control circuitry;
  control circuitry, coupled to the drive circuitry and temperature sensor circuitry, to: (i) determine a control signal using the data which is representative of an operating temperature and (ii) output a control signal which adjusts the drive signal from the drive circuitry; and
  frequency adjustment circuitry, coupled to the microelectromechanical oscillator to generate a plurality of output signals using (i) one or more sets of values and (ii) the output signal of the microelectromechanical oscillator wherein at least one of the output signals includes a frequency that is greater than the first frequency.

31. The compensated microelectromechanical oscillator of claim 30 further including a memory, coupled to the frequency adjustment circuitry, to store the values.

32. The compensated microelectromechanical oscillator of claim 30 further including a memory, coupled to the control circuitry, to store a look-up table relating the drive signal to an operating temperature.

33. The compensated microelectromechanical oscillator of claim 32 wherein the control circuitry determines the control signal using the data in the look-up table.

34. The compensated microelectromechanical oscillator of claim 30 wherein the control circuitry determines the control signal by calculating the control signal using the data which is representative of temperature.

35. The compensated microelectromechanical oscillator of claim 30 wherein the set of values is determined, at least in part, using information which is representative of the first frequency.

36. The compensated microelectromechanical oscillator of claim 35 wherein the set of values are determined using empirical data or mathematical modeling.

37. The compensated microelectromechanical oscillator of claim 30 wherein the set of values is determined, at least in part, using the operating temperature.

38. The compensated microelectromechanical oscillator of claim 37 wherein the set of values are determined during (i) testing of the microelectromechanical resonator and/or microelectromechanical oscillator, (ii) calibration of the microelectromechanical oscillator, and/or (iii) operation of the microelectromechanical oscillator.

39. The microelectromechanical oscillator of claim 30 wherein the frequency adjustment circuitry includes first and second frequency multiplier circuitry which are one or more PLLs and/or one or more digital/frequency synthesizers.

40. The microelectromechanical oscillator of claim 39 wherein the PLLs are one or more fractional-N PLLs and/or one or more integer-N PLLs.

41. The microelectromechanical oscillator of claim 30 wherein the frequency adjustment circuitry includes first and second frequency multiplier circuitry and wherein:
  the first frequency multiplier circuitry is a fractional-N PLL, an integer-N PLL, or a digital/frequency synthesizer; and
  the second frequency multiplier circuitry is a fractional-N, PLL, an integer-N PLL or a digital/frequency synthesizer.

42. The microelectromechanical oscillator of claim 30 wherein more than one of the output signals include frequencies that are greater than the first frequency.

* * * * *